(12) United States Patent
Yanagisawa et al.

(10) Patent No.: US 12,713,799 B2
(45) Date of Patent: Aug. 18, 2026

(54) DISPLAY DEVICE AND METHOD FOR MANUFACTURING DISPLAY DEVICE

(71) Applicant: SEMICONDUCTOR ENERGY LABORATORY CO., LTD., Atsugi (JP)

(72) Inventors: Yuichi Yanagisawa, Atsugi (JP); Ryota Hodo, Atsugi (JP); Shiro Nishizaki, Kai (JP); Hiromi Sawai, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 535 days.

(21) Appl. No.: 18/259,135

(22) PCT Filed: Dec. 9, 2021

(86) PCT No.: PCT/IB2021/061478

§ 371 (c)(1),
(2) Date: Jun. 23, 2023

(87) PCT Pub. No.: WO2022/136995

PCT Pub. Date: Jun. 30, 2022

(65) Prior Publication Data

US 2024/0057451 A1 Feb. 15, 2024

(30) Foreign Application Priority Data

Dec. 25, 2020 (JP) ................................ 2020-216532

(51) Int. Cl.
*H10K 59/35* (2023.01)
*H10K 59/12* (2023.01)
(Continued)

(52) U.S. Cl.
CPC ......... *H10K 59/35* (2023.02); *H10K 59/1201* (2023.02); *H10K 59/124* (2023.02);
(Continued)

(58) Field of Classification Search
CPC .. H10K 59/35; H10K 59/1201; H10K 59/124; H10K 59/80521; H10K 59/8051;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001681360 A 10/2005
CN 001725911 A 1/2006
(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.
(Continued)

*Primary Examiner* — Kevin Quarterman
(74) *Attorney, Agent, or Firm* — Fish & Richardson P.C.

(57) ABSTRACT

A high-resolution display device and a manufacturing method thereof are provided. The display device includes a first insulating layer, a first light-emitting element and a second light-emitting element over the first insulating layer, a third insulating layer located to be over and cover the first light-emitting element, and a fifth insulating layer located to be over and cover the second light-emitting element. The first light-emitting element and the second light-emitting element emit light of different colors. A first groove and a second groove are provided in a region that is in the first insulating layer and between the first light-emitting element and the second light-emitting element. Part of the third insulating layer is embedded in the first groove, and part of the fifth insulating layer is embedded in the second groove.

16 Claims, 22 Drawing Sheets

(51) Int. Cl.
*H10K 59/124* (2023.01)
*H10K 59/80* (2023.01)

(52) U.S. Cl.
CPC ... *H10K 59/80521* (2023.02); *H10K 59/8051* (2023.02); *H10K 59/873* (2023.02)

(58) Field of Classification Search
CPC ........... H10K 59/873; H10K 2102/351; H10K 71/166; H10K 71/60; H10K 59/87; H10K 59/8052; H05B 33/02; H05B 33/10; H05B 33/14; H05B 33/22; H05B 33/26; G09F 9/30
See application file for complete search history.

(56) References Cited

U.S. PATENT DOCUMENTS

| | | | |
|---|---|---|---|
| 7,002,186 | B2 | 2/2006 | Kang et al. |
| 7,399,991 | B2 | 7/2008 | Seo et al. |
| 7,554,264 | B2 | 6/2009 | Choi et al. |
| 7,663,149 | B2 | 2/2010 | Seo et al. |
| 7,867,054 | B2 | 1/2011 | Choi et al. |
| 8,981,352 | B2 | 3/2015 | Yamada et al. |
| 10,529,948 | B2 | 1/2020 | Sonoda et al. |
| 10,636,851 | B2 | 4/2020 | Ukigaya |
| 10,809,837 | B2 * | 10/2020 | Tada ...................... H05B 33/02 |
| 11,387,299 | B2 | 7/2022 | Ukigaya |
| 11,716,868 | B2 * | 8/2023 | Kim ..................... H10K 59/878 257/40 |
| 2002/0072139 | A1 | 6/2002 | Kashiwabara |
| 2005/0264189 | A1 | 12/2005 | Choi et al. |
| 2005/0285134 | A1 | 12/2005 | Kang et al. |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0043345 | A1 | 2/2016 | Goden et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2019/0006618 | A1 | 1/2019 | Sonoda et al. |
| 2020/0203662 | A1 | 6/2020 | Mollard et al. |

FOREIGN PATENT DOCUMENTS

| | | | |
|---|---|---|---|
| CN | 109644531 | A | 4/2019 |
| JP | 2000-036385 | A | 2/2000 |
| JP | 2002-324673 | A | 11/2002 |
| JP | 2003-059663 | A | 2/2003 |
| JP | 2005-302703 | A | 10/2005 |
| JP | 2006-012771 | A | 1/2006 |
| JP | 2008-098106 | A | 4/2008 |
| JP | 2008-147072 | A | 6/2008 |
| JP | 2008-251270 | A | 10/2008 |
| JP | 2012-216338 | A | 11/2012 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-040766 | A | 3/2016 |
| JP | 2016-197494 | A | 11/2016 |
| JP | 2019-067525 | A | 4/2019 |
| JP | 2019-179696 | A | 10/2019 |
| JP | 2020-160305 | A | 10/2020 |
| KR | 2005-0099023 | A | 10/2005 |
| KR | 2006-0000846 | A | 1/2006 |
| WO | WO-2018/061056 | | 4/2018 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke. T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke. T et al., "Island and Hole Fabrication on OLED Stack for High-Resolution Sensor in Display Application", IDW'20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

International Search Report (Application No. PCT/IB2021/061478), dated Mar. 29, 2022.

Written Opinion (Application No. PCT/IB2021/061478), dated Mar. 29, 2022.

* cited by examiner

FIG. 20A
400
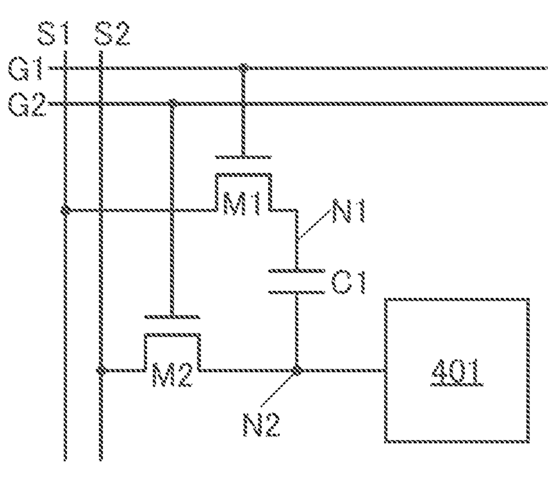
FIG. 20B
T1
T2
G1
G2
S1
$V_{ref}$
$V_{data}$
S2
$V_w$
N1
$V_{ref}$
$V_{data}$
N2
$V_w$
dV
FIG. 20C
400EL
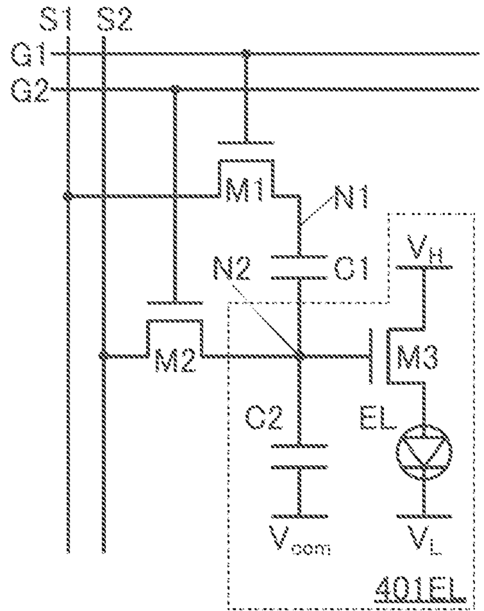

700
704
702
701
703
706
706
704
702
701
705

DISPLAY DEVICE AND METHOD FOR MANUFACTURING DISPLAY DEVICE

CROSS REFERENCE TO RELATED APPLICATIONS

This application is a U.S. National Phase Application under 35 U.S.C. § 371 of International Application PCT/IB2021/061478, filed on Dec. 9, 2021, which is incorporated by reference and claims the benefit of a foreign priority application filed in Japan on Dec. 25, 2020, as Application No. 2020-216532.

TECHNICAL FIELD

One embodiment of the present invention relates to a display device. One embodiment of the present invention relates to a method for manufacturing a display device.

Note that one embodiment of the present invention is not limited to the above technical field. Examples of a technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. Note that in this specification and the like, a semiconductor device generally means a device that can function by utilizing semiconductor characteristics.

BACKGROUND ART

In recent years, higher-resolution display panels have been required. As a device that requires a high-resolution display panel, for example, devices for virtual reality (VR), augmented reality (AR), substitutional reality (SR), or mixed reality (MR) are given and have been actively developed in recent years.

Examples of a display device that can be used for a display panel include, typically, a liquid crystal display device, a light-emitting device including a light-emitting element such as an organic EL (Electro Luminescence) element or a light-emitting diode (LED), and electronic paper performing display by an electrophoretic method or the like.

For example, the basic structure of an organic EL element is a structure in which a layer containing a light-emitting organic compound is provided between a pair of electrodes. By voltage application to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

For example, in the above-described device for VR, AR, SR, or MR that is wearable, a lens for focus adjustment needs to be provided between eyes and the display panel. Since part of the screen is enlarged by the lens, low resolution of the display panel might cause a problem of weak sense of reality and immersion.

The display panel is also required to have high color reproducibility. In particular, when using the display panel with high color reproducibility, the above-described device for VR, AR, SR, or MR can perform display with colors that are close to the actual object color, leading to higher sense of reality and immersion.

An object of one embodiment of the present invention is to provide a display device with extremely high resolution. An object of one embodiment of the present invention is to provide a display device in which high color reproducibility is achieved. An object of one embodiment of the present invention is to provide a high-luminance display device. An object of one embodiment of the present invention is to provide a highly reliable display device. Furthermore, an object of one embodiment of the present invention is to provide a method for manufacturing the above-described display device.

Note that the description of these objects does not preclude the existence of other objects. One embodiment of the present invention does not have to achieve all the objects. Note that objects other than these can be derived from the descriptions of the specification, the drawings, the claims, and the like.

Means for Solving the Problems

One embodiment of the present invention is a display device including a first insulating layer; a first light-emitting element and a second light-emitting element over the first insulating layer; a third insulating layer located to be over and cover the first light-emitting element; and a fifth insulating layer located to be over and cover the second light-emitting element. The first light-emitting element and the second light-emitting element emit light of different colors. A first groove and a second groove are provided in a region that is in the first insulating layer and between the first light-emitting element and the second light-emitting element. A part of the third insulating layer is embedded in the first groove. A part of the fifth insulating layer is embedded in the second groove.

Another embodiment of the present invention is a display device including a first insulating layer; a first light-emitting element and a second light-emitting element over the first insulating layer; a third insulating layer located to be over and cover the first light-emitting element; and a fifth insulating layer located to be over and cover the second light-emitting element. The first light-emitting element and the second light-emitting element emit light of different colors. A first groove and a second groove are provided in a region that is in the first insulating layer and between the first light-emitting element and the second light-emitting element. A part of the third insulating layer is embedded in the first groove. A part of the fifth insulating layer is embedded in the second groove. The first light-emitting element includes a first conductive layer, a first EL layer over the first conductive layer, and a second conductive layer over the first EL layer. The second light-emitting element includes a third conductive layer, a second EL layer over the third conductive layer, and a fourth conductive layer over the second EL layer. The first EL layer is located to cover a side surface and a top surface of the first conductive layer. The first EL layer has a region in contact with the first insulating layer. The second EL layer is located to cover a side surface and a top surface of the third conductive layer. The second EL layer includes a region in contact with the first insulating layer. A width of the first groove in a direction from the first light-emitting element toward the second light-emitting element is more than two times as large as a thickness of the first EL layer. A width of the second groove in a direction from the first light-emitting element toward the second light-emitting element is more than two times as large as a thickness of the second EL layer.

In the above display device, the first groove preferably extends to a region outside an end portion of the first EL layer in a direction where the first groove extends.

In the above display device, a sixth insulating layer is preferably provided between the first conductive layer and the first EL layer to be in contact with the side surface of the first conductive layer, and a seventh insulating layer is preferably provided between the third conductive layer and the second EL layer to be in contact with the side surface of the third conductive layer.

Another embodiment of the present invention is a display device including a first insulating layer; a first light-emitting element and a second light-emitting element over the first insulating layer; a third insulating layer located to over and cover the first light-emitting element; and a fifth insulating layer located to over and cover the second light-emitting element. The first light-emitting element and the second light-emitting element emit light of different colors. A groove is provided in a region that is in the first insulating layer and between the first light-emitting element and the second light-emitting element. The groove has a downward-convex semicircular shape in a cross-sectional view. The groove includes a first region and a second region not overlapping with the first region. The first region is located closer to the first light-emitting element side than the second region is. The second region is located close to the second light-emitting element side than the first region is. The third insulating layer has a region overlapping with the first region of the groove. The fifth insulating layer has a region overlapping with the second region of the groove.

In the above display device, the first light-emitting element preferably includes a first conductive layer, a first EL layer over the first conductive layer, and a second conductive layer over the first EL layer, and the second light-emitting element preferably includes a third conductive layer, a second EL layer over the third conductive layer, and a fourth conductive layer over the second EL layer. In addition, a sixth insulating layer is preferably provided to cover an end portion of the first conductive layer and an end portion of the third conductive layer.

In the above display device, the groove preferably extends to a region outside an end portion of the first EL layer in a direction where the groove extends.

In the above display device, each of the third insulating layer and the fifth insulating layer preferably contains aluminum and oxygen.

Another embodiment of the present invention is a method for manufacturing a display device which includes a first light-emitting element including a first conductive layer, a first EL layer, and a second conductive layer and a second light-emitting element including a third conductive layer, a second EL layer, and a fourth conductive layer, where the first light-emitting element and the second light-emitting element emit light of different colors. The method includes the following steps: a step of forming the first conductive layer and the third conductive layer over a first insulating layer; a step of forming a first groove and a second groove in a region that is in the first insulating layer and between the first conductive layer and the third conductive layer; a step of forming a first resist mask over the first insulating layer and the third conductive layer in a portion overlapping with the second groove and the third conductive layer; a step of depositing a first film containing a light-emitting compound and a first conductive film sequentially over the first insulating layer, the first conductive layer, and the first resist mask, whereby the first EL layer and the second conductive layer are formed over the first conductive layer, and a first layer and a fifth conductive layer are formed over the first insulating layer and the first resist mask; a step of depositing a second insulating layer over the second conductive layer and the fifth conductive layer; a step of forming a second resist mask over the second insulating layer in a portion overlapping with the first conductive layer and the first groove; a step of removing the second insulating layer that is not covered with the second resist mask, whereby a third insulating layer is formed from the second insulating layer; a step of removing the first resist mask, the second resist mask, the fifth conductive layer that is not covered with the second resist mask, and the first layer that is not covered with the second resist mask; a step of forming a third resist mask over the third insulating layer and the first insulating layer in a portion overlapping with the first groove and the first conductive layer; a step of depositing a second film containing a light-emitting compound and a second conductive film sequentially over the first insulating layer, the third conductive layer, and the third resist mask, whereby the second EL layer and the fourth conductive layer are formed over the third conductive layer, and a second layer and a sixth conductive layer are formed over the first insulating layer and the third resist mask; a step of depositing a fourth insulating layer over the fourth conductive layer and the sixth conductive layer; a step of forming a fourth resist mask over the fourth insulating layer in a portion overlapping with the third conductive layer and the second groove; a step of removing the fourth insulating layer that is not covered with the fourth resist mask, whereby a fifth insulating layer is formed from the fourth insulating layer; and a step of removing the third resist mask, the fourth resist mask, the sixth conductive layer that is not covered with the fourth resist mask, and the second layer that is not covered with the fourth resist mask.

In the above method for manufacturing a display device, a width of the first groove in a direction from the first light-emitting element toward the second light-emitting element is preferably more than two times as large as a thickness of the first EL layer, and a width of the second groove in a direction from the first light-emitting element toward the second light-emitting element is preferably more than two times as large as a thickness of the second EL layer.

In the above method for manufacturing a display device, the first groove preferably extends to a region outside an end portion of the first EL layer in a direction where the first groove extends.

Another embodiment of the present invention is a method for manufacturing a display device which includes a first light-emitting element including a first conductive layer, a first EL layer, and a second conductive layer and a second light-emitting element including a third conductive layer, a second EL layer, and a fourth conductive layer, where the first light-emitting element and the second light-emitting element emit light of different colors. The method includes the following steps: a step of forming the first conductive layer and the third conductive layer over a first insulating layer; a step of performing isotropic etching to form a groove in a region that is in the first insulating layer and between the first conductive layer and the third conductive layer; a step of forming a sixth insulating layer covering an end portion of the first conductive layer and an end portion of the third conductive layer; a step of forming a first resist mask over the third conductive layer and the sixth insulating layer in a portion overlapping with a first region of the groove and the third conductive layer; a step of depositing a first film containing a light-emitting compound and a first conductive film sequentially over the sixth insulating layer, the first conductive layer, and the first resist mask, whereby the first EL layer and the second conductive layer are formed over the first conductive layer, and a first layer and a fifth conductive layer are formed over the sixth insulating layer and the first resist mask; a step of depositing a second insulating layer over the second conductive layer and the fifth conductive layer; a step of forming a second resist mask over the second insulating layer in a portion overlapping with the first conductive layer and a second region of the groove; a step of removing the second insulating layer that is not covered with the second resist mask, whereby a third insulating layer is formed from the second insulating layer; a step of removing the first resist mask, the second resist mask, the fifth conductive layer that is not covered with the second resist mask and the first layer that is not covered with the second resist mask; a step of forming a third resist mask over the third insulating layer and the sixth insulating layer in a portion overlapping with the third insulating layer; a step of depositing a second film containing a light-emitting compound and a second conductive film sequentially over the sixth insulating layer, the third conductive layer, and the third resist mask, whereby the second EL layer and the fourth conductive layer are formed over the third conductive layer, and a second layer and a sixth conductive layer are formed over the sixth insulating layer and the third resist mask; a step of depositing a fourth insulating layer over the fourth conductive layer and the sixth conductive layer; a step of forming a fourth resist mask over the fourth insulating layer in a portion overlapping with the third conductive layer and the second region of the groove; a step of removing the fourth insulating layer that is not covered with the fourth resist mask, whereby a fifth insulating layer is formed from the fourth insulating layer; and a step of removing the third resist mask, the fourth resist mask, the sixth conductive layer that is not covered with the fourth resist mask, and the second layer that is not covered with the fourth resist mask.

In the above method for manufacturing a display device, the groove preferably extends to a region outside an end portion of the first EL layer in a direction where the groove extends.

In the above method for manufacturing a display device, the second insulating layer and the fourth insulating layer are preferably deposited by an ALD method.

Effect of the Invention

According to one embodiment of the present invention, a display device with extremely high resolution can be provided. A display device in which high color reproducibility is achieved can be provided. A high-luminance display device can be provided. Alternatively, a highly reliable display device can be provided. A method for manufacturing the above-described display device can be provided.

Note that the description of these effects does not preclude the existence of other effects. One embodiment of the present invention does not need to have all of these effects. Note that effects other than these can be derived from the descriptions of the specification, the drawings, the claims, and the like.

BRIEF DESCRIPTION OF THE DRAWINGS

FIG. 20A and FIG. 20C are circuit diagrams illustrating an example of a display device. FIG. 20B is a timing chart showing an operation example of the display device.

MODE FOR CARRYING OUT THE INVENTION

Figure 1A:
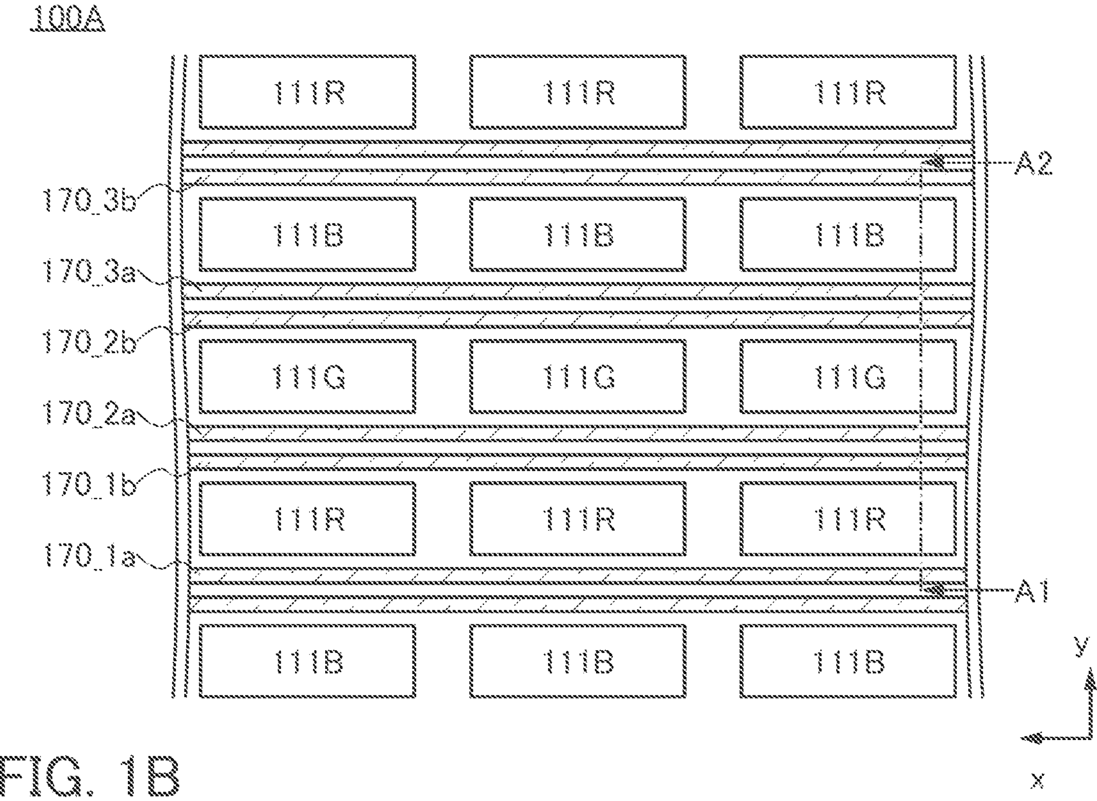
FIG. 1A and FIG. 1B are diagrams illustrating a structure example of a display device.

Hereinafter, embodiments will be described with reference to the drawings. Note that the embodiments can be implemented in many different modes, and it will be readily understood by those skilled in the art that modes and details thereof can be changed in various ways without departing from the spirit and scope thereof. Thus, the present invention should not be interpreted as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as “first,” “second,” and the like are used in order to avoid confusion among components and do not limit the number.

In this specification, in the case where the maximum value and the minimum value are specified, a structure in which the maximum value and the minimum value are freely combined is disclosed.

Embodiment 1

In this embodiment, a display device of one embodiment of the present invention and a method for manufacturing the display device will be described.

The display device of one embodiment of the present invention includes light-emitting elements (also referred to as light-emitting devices) emitting light of different colors. The light-emitting element includes a lower electrode, an upper electrode, and a layer containing a light-emitting compound (also referred to as a light-emitting layer or an EL layer) therebetween. As the light-emitting element, an electroluminescent element such as an organic EL element or an inorganic EL element is preferably used. Alternatively, a light-emitting diode (LED) may be used.

As the EL element, an OLED (Organic Light Emitting Diode), a QLED (Quantum-dot Light Emitting Diode), or the like can be used. As examples of a light-emitting substance contained in the EL element, a substance that emits fluorescent light (a fluorescent material), a substance that emits phosphorescent light (a phosphorescent material), an inorganic compound (e.g., a quantum dot material), a substance that exhibits thermally activated delayed fluorescence (a thermally activated delayed fluorescent (TADF) material), and the like can be given.

As the light-emitting substance, a substance that exhibits an emission color of blue, purple, bluish purple, green, yellowish green, yellow, orange, red, or the like is appropriately used. A substance that emits near-infrared light may also be used.

The light-emitting layer may contain one or more kinds of compounds (e.g., a host material and an assist material) in addition to the light-emitting substance (a guest material). As the host material and the assist material, one or more kinds of substances whose energy gap is larger than the energy gap of the light-emitting substance (the guest material) can be selected and used. As the host material and the assist material, compounds which form an exciplex are preferably used in combination. In order to form an exciplex efficiently, it is particularly preferable to combine a compound that easily accepts holes (a hole-transport material) and a compound that easily accepts electrons (an electron-transport material).

Either a low molecular compound or a high molecular compound can be used for the light-emitting element, and an inorganic compound (e.g., a quantum dot material) may also be contained.

In the display device of one embodiment of the present invention, the light-emitting elements of different colors can be separately formed with extremely high accuracy. Thus, a display device with higher resolution than a conventional display device can be achieved. For example, the display device preferably has extremely high resolution in which pixels including one or more light-emitting elements are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

More specific structure examples of a display device and manufacturing method examples thereof will be described below with reference to drawings.

Structure Example 1

Structure Example 1-1

Figure 1B:
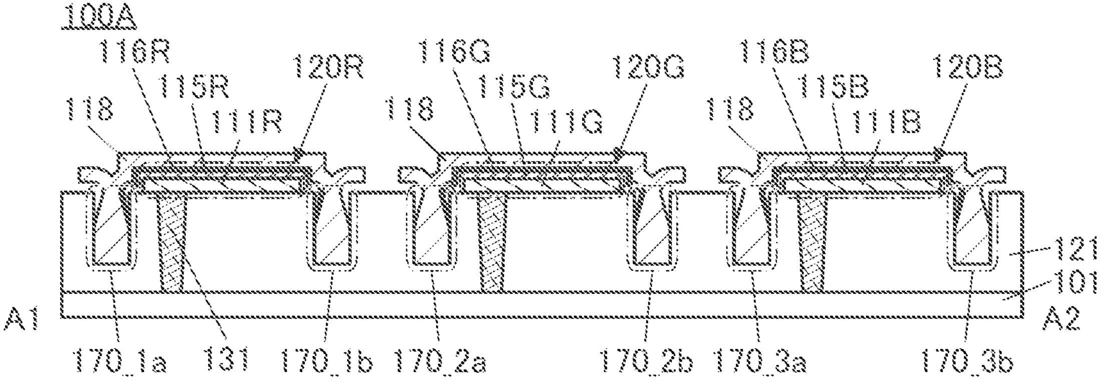

FIG. 1A and FIG. 1B are diagrams illustrating a display device of one embodiment of the present invention. FIG. 1A is a schematic top view of a display device 100A, and FIG. 1B is a schematic cross-sectional view of the display device 100A. Here, FIG. 1B is a cross-sectional view of a portion indicated by the dashed-dotted line A1-A2 in FIG. 1A. Note that for clarity of the drawing, some components are omitted in the top view of FIG. 1A.

The display device 100A includes an insulating layer 121, a light-emitting element 120R, a light-emitting element 120G, and a light-emitting element 120B. The light-emitting element 120R is a light-emitting element emitting red light, the light-emitting element 120G is a light-emitting element emitting green light, and the light-emitting element 120B is a light-emitting element emitting blue light. In other words, the light-emitting element 120R and the light-emitting element 120G emit light of different colors. The light-emitting element 120G and the light-emitting element 120B emit light of different colors. The light-emitting element 120B and the light-emitting element 120R emit light of different colors. Such a structure in which emission colors (here, red (R), green (G), and blue (B)) are separately patterned for each of the light-emitting elements is referred to as an SBS (Side By Side) structure in some cases.

In this specification and the like, a structure in which light-emitting layers in light-emitting devices of different colors (here, blue (B), green (G), and red (R)) are separately formed or separately patterned may be referred to as an SBS structure. In this specification and the like, a light-emitting device capable of emitting white light may be referred to as a white-light-emitting device. Note that a combination of white-light-emitting devices with coloring layers (e.g., color filters) enables a full-color display device.

Note that in the following description common to the light-emitting element 120R, the light-emitting element 120G, and the light-emitting element 120B, the alphabets applied to the reference numerals are omitted and the term “light-emitting element 120” is used in some cases. Similarly, a conductive layer 111R, a conductive layer 111G, and a conductive layer 111B, which are described later, are described using the term “conductive layer 111” in some cases. In a similar manner, an EL layer 115R, an EL layer 115G, and an EL layer 115B, which are described later, are described using the term “EL layer 115” in some cases. Similarly, a conductive layer 116R, a conductive layer 116G, and a conductive layer 116B, which are described later, are described using the term “conductive layer 116” in some cases. The conductive layer 111R, the EL layer 115R, and the conductive layer 116R are included in the light-emitting element 120R. Similarly, the conductive layer 111G, the EL layer 115G, and the conductive layer 116G are included in the light-emitting element 120G, and the conductive layer 111B, the EL layer 115B, and the conductive layer 116B are included in the light-emitting element 120B.

The combination of colors emitted by the light-emitting element 120 is not limited to the above, and colors such as cyan, magenta, and yellow may be used. Although the color example shown above is three colors of red (R), green (G), and blue (B), the number of colors of light emitted by the light-emitting element 120 in the display device 100A may be two or four or more.

The light-emitting element 120 includes the conductive layer 111 functioning as a lower electrode, the EL layer 115, and the conductive layer 116 functioning as an upper electrode. The conductive layer 116 has a transmissive property and a reflective property with respect to visible light. The EL layer 115 includes a light-emitting compound.

As the light-emitting element 120, it is possible to use an electroluminescent element having a function of emitting light in accordance with current flowing into the EL layer 115 when a potential difference is supplied between the conductive layer 111 and the conductive layer 116. In particular, an organic EL element using a light-emitting organic compound is preferably used for the EL layer 115. In addition, the light-emitting element 120 is preferably an element emitting monochromatic light, which has one peak in the visible light region of the emission spectrum. Alternatively, for example, the light-emitting element 120 is an element emitting white light, which has two or more peaks in the visible light region of the emission spectrum.

A potential for controlling the amount of light emitted from the light-emitting element 120 is independently supplied to the conductive layer 111 provided in the light-emitting element 120. The conductive layer 111 functions as a pixel electrode, for example.

The EL layer 115 includes at least a layer containing a light-emitting compound. A structure may be employed in which one or more layers selected from an electron-injection layer, an electron-transport layer, a charge-generation layer, a hole-transport layer, and a hole-injection layer are stacked in addition to the above. The EL layer 115 can be formed by, for example, a liquid phase method such as an evaporation method or an inkjet method.

The conductive layer 116 is formed to have a transmissive property and a reflective property with respect to visible light. For example, a metal film or an alloy film that is thin enough to transmit visible light can be used. Alternatively, a light-transmitting conductive film (e.g., a metal oxide film) may be stacked over such a film.

Two grooves are provided in the insulating layer 121 in a region located between two conductive layers 111 adjacent to each other in the A1-A2 direction illustrated in FIG. 1A. As illustrated in FIG. 1A and FIG. 1B, of two grooves provided between the light-emitting element 120R and the light-emitting element 120G, one on the light-emitting element 120R side is referred to as a groove 170_1*b*, and the other on the light-emitting element 120G side is referred to as a groove 170_2*a*. Furthermore, of two grooves provided between the light-emitting element 120G and the light-emitting element 120B, one on the light-emitting element 120G side is referred to as a groove 170_2*b*, and the other on the light-emitting element 120B side is referred to as a groove 170_3*a*. Furthermore, of two grooves provided between the light-emitting element 120B and the light-emitting element 120R, one on the light-emitting element 120B side is referred to as a groove 170_3*b*, and the other on the light-emitting element 120R side is referred to as a groove 170_1*a*.

Note that in the following description common to the groove 170_1*a*, the groove 170_1*b*, the groove 170_2*a*, the groove 170_2*b*, the groove 170_3*a*, and the groove 170_3*b*, the alphabets applied to the reference numerals are omitted and the term "groove 170" is used in some cases. In addition, in the following description common to the groove 170_1*a*, the groove 170_2*a*, and the groove 170_3*a*, the alphabets applied to the reference numerals are omitted and the term "groove 170_*a*" is used in some cases. In addition, in the following description common to the groove 170_1*b*, the groove 170_2*b*, and the groove 170_3*b*, the alphabets applied to the reference numerals are omitted and the term "groove 170_*b*" is used in some cases.

As illustrated in FIG. 1A, in a top view of the display device 100A, the direction where the groove 170 provided in the insulating layer 121 extends is referred to as the x direction, and the direction perpendicular to the x direction is referred to as the y direction. In the case where the stripe arrangement illustrated in FIG. 1A is employed for the light-emitting elements 120 (the conductive layers 111), the adjacent light-emitting elements emitting the same color are arranged in the x direction, and the adjacent light-emitting elements emitting different colors are arranged in the y direction. The y direction can be referred to as the A1-A2 direction illustrated in FIG. 1A.

In the display device 100A, each of the EL layer 115 and the conductive layer 116 is divided by the groove 170 between adjacent light-emitting elements emitting different colors. Accordingly, current (leakage current) flowing between the adjacent light-emitting elements emitting different colors through the EL layer 115 can be prevented. Thus, light emission caused by the leakage current can be inhibited, so that display with high contrast can be obtained. Furthermore, even in the case where the resolution is increased, the range of choices for materials can be widened since the EL layer 115 can be formed using a material with high conductivity, which facilitates an improvement in efficiency, a reduction in power consumption, and an improvement in reliability.

The EL layer 115 and the conductive layer 116 may be patterned into an island shape by deposition with use of a shadow mask such as a metal mask; however, it is particularly preferable to employ a processing method using no metal mask. Accordingly, an extremely minute pattern can be formed; thus, resolution and the aperture ratio can be improved as compared to the formation method using a metal mask. A typical example of such a processing method is a photolithography method. Alternatively, a formation method such as a nanoimprinting method, a sandblasting method, or the like can be used.

In this specification and the like, a device formed using a metal mask or an FMM (fine metal mask) may be referred to as a device having an MM (metal mask) structure. In this specification and the like, a device formed without using a metal mask or an FMM may be referred to as a device having an MML (metal maskless) structure.

Figure 2A:
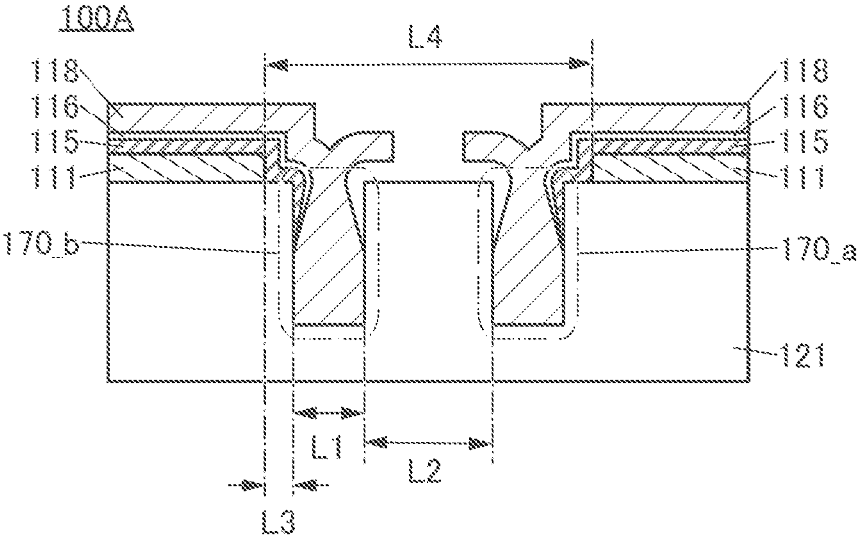
FIG. 2A and FIG. 2B are diagrams illustrating a structure example of a display device.

FIG. 2A is a schematic cross-sectional view of the groove 170 and its vicinity in the display device 100A. Note that for clarity of the drawing, some components are omitted in the cross-sectional view of FIG. 2A. The width of the groove 170 in the A1-A2 direction (a width L1 in FIG. 2A) is preferably more than two times as large as the thickness of the EL layer 115. For example, when the thickness of the EL layer 115 is 100 nm, the width L1 is greater than 200 nm and less than or equal to 500 nm, preferably greater than 200 nm and less than or equal to 400 nm, further preferably greater than 200 nm and less than or equal to 300 nm, specifically 250 nm. Accordingly, disconnection of the EL layer 115 is caused by the groove 170, and the EL layer 115 can be formed over each conductive layer 111. In this case, the EL layer 115 is located to cover the side surface and the top surface of the conductive layer 111 as illustrated in FIG. 1B. The EL layer 115 has a region in contact with the insulating layer 121.

Each of the interval between adjacent grooves (the shortest distance between end portions of the adjacent grooves: an interval L2 in FIG. 2A) and the distance from one conductive layer to a groove adjacent to the conductive layer (the shortest distance between the end portion of the conductive layer and the end portion of the groove adjacent to the conductive layer: a distance L3 in FIG. 2A) may be adjusted as appropriate in accordance with the processing accuracy in the case of using a photolithography method, the thickness of the EL layer 115, the thickness of the conductive layer 116, the thickness of an insulating layer 118 described later, or the like. For example, the interval L2 is greater than or equal to 200 nm and less than or equal to 800 nm, preferably greater than or equal to 250 nm and less than or equal to 700 nm, further preferably greater than or equal to 350 nm and less than or equal to 600 nm. For example, the distance L3 is greater than or equal to 50 nm and less than or equal to 400 nm, preferably greater than or equal to 50 nm and less than or equal to 200 nm, further preferably greater than or equal to 50 nm and less than or equal to 150 nm.

The shortest distance between the conductive layers 111 of the two adjacent light-emitting elements emitting different colors (a distance L4 in FIG. 2A) depends on the width of the groove 170 in the A1-A2 direction (the width L1), the interval of adjacent grooves (the interval L2), and the distance from a conductive layer to a groove adjacent to the conductive layer (the distance L3). With the above structure, the distance L4 is greater than or equal to 700 nm and less than or equal to 2000 nm, preferably greater than or equal to 900 nm and less than or equal to 1600 nm, further preferably greater than or equal to 1000 nm and less than or equal to 1400 nm.

Accordingly, it is possible to achieve an extremely high-resolution display device in which pixels including one or more light-emitting elements are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi. Note that in the display device 100A, the EL layers 115 and the conductive layers 116 in the light-emitting elements emitting the same color are preferably processed so as not to be separated but to be continuous. For example, the EL layer 115 and the conductive layer 116 can be processed into a stripe shape. Thus, the conductive layers 116 of all the light-emitting elements can be supplied with a predetermined potential without being in a floating state.

In the cross-sectional views of the display device 100A illustrated in FIG. 1B and FIG. 2A, the end portion of the EL layer 115 is positioned more outward than the end portion of the conductive layer 111. The end portion of the EL layer 115 is covered with the end portion of the conductive layer 111. When the end portion of the EL layer 115 is positioned more outward than the end portion of the conductive layer 111, a short circuit between the conductive layer 111 and the conductive layer 116 can be inhibited. In the cross-sectional view of the display device 100A, the end portion of the conductive layer 116 is positioned more outward than the end portion of the conductive layer 111.

The display device 100A includes the insulating layer 118. The insulating layer 118 is located over the light-emitting element 120 to cover the light-emitting element 120. Note that in this specification and the like, the state where "the insulating layer covers the light-emitting element" indicates a state where the insulating layer covers part of an end surface of the light-emitting element or a state where the insulating layer completely covers the light-emitting element so as to surround an end surface of the light-emitting element. The insulating layer 118 is provided to fill the two grooves close to the light-emitting element 120 covered by the insulating layer 118. As illustrated in FIG. 1B, the insulating layer 118 over the light-emitting element 120R is provided to fill the groove 170_1*a* and the groove 170_1*b*, the insulating layer 118 over the light-emitting element 120G is provided to fill the groove 170_2*a* and the groove 170_2*b*, and the insulating layer 118 over the light-emitting element 120B is provided to fill the groove 170_3*a* and the groove 170_3*b*.

The insulating layer 118 has a region in contact with the insulating layer 121 outside the light-emitting element 120 in the cross-sectional view in the A1-A2 direction. In this specification and the like, the state where "the insulating layer 118 has a region in contact with the insulating layer 121 outside the light-emitting element 120" is referred to as "the light-emitting element 120 is sealed with the insulating layer 118 and the insulating layer 121" in some cases. In other words, in the display device 100A, each of the light-emitting element 120B, the light-emitting element 120G, and the light-emitting element 120R is sealed with the insulating layer 121 and the insulating layer 118. The insulating layer 118 functions as a protective layer that prevents diffusion of impurities such as water into the light-emitting element. As the insulating layer 118, it is preferable to use an inorganic insulating film with low moisture permeability, such as a silicon oxide film, a silicon nitride film, or an aluminum oxide film. When aluminum oxide is used for the insulating layer 118, the insulating layer 118 contains aluminum and oxygen.

Depending on the shape of the groove, the position of the region where the insulating layer 118 is in contact with the insulating layer 121 is not limited to the outside of the light-emitting element 120. For example, the region where the insulating layer 118 is in contact with the insulating layer 121 is located below the light-emitting element 120. This case is also referred to as "the light-emitting element 120 is sealed with the insulating layer 118 and the insulating layer 121" sometimes. In this specification and the like, "to seal" can be referred to as "to surround".

Figure 2B:
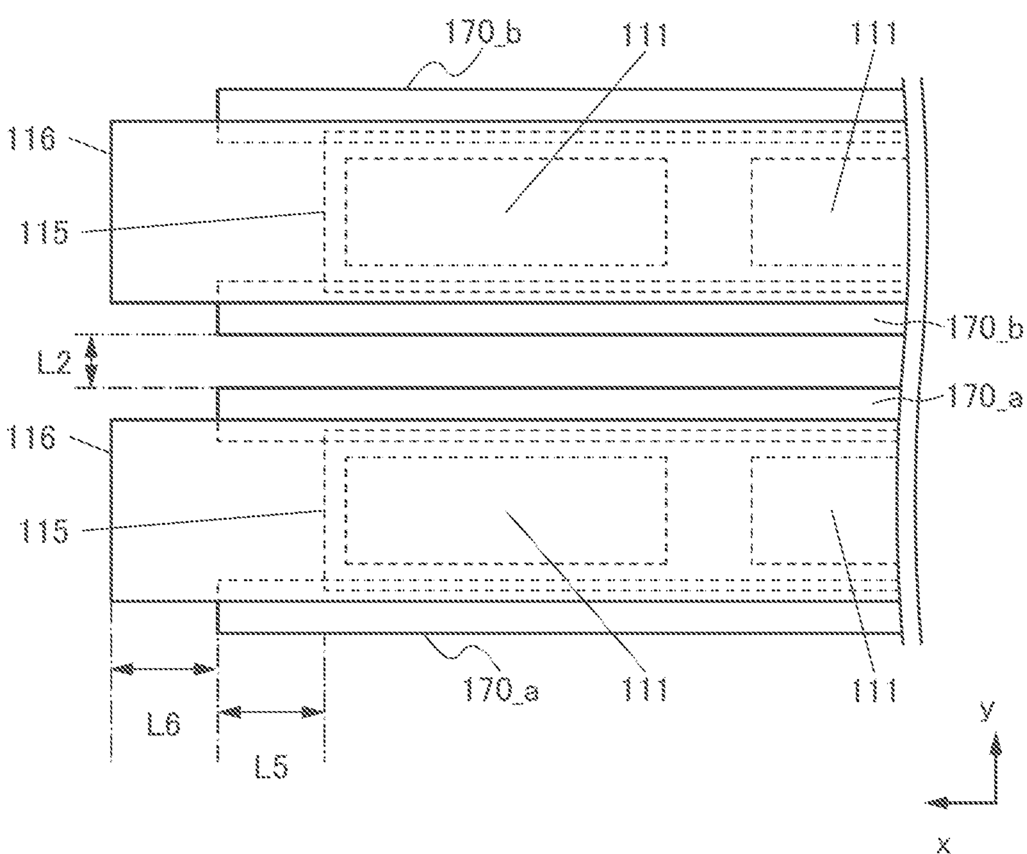

FIG. 2B is a schematic top view illustrating the end portion of the groove 170 and its vicinity. Note that for clarity of the drawing, some components are omitted in the top view of FIG. 2B. It is preferable that each of the groove 170_*a* and the groove 170_*b* extend to a region outside the end portion of the EL layer 115. In FIG. 2B, the distance from the end portion of each of the groove 170_*a* and the groove 170_*b* to the end portion of the EL layer 115 is denoted by a distance L5. With this structure, the EL layers adjacent in they direction can be separated.

It is preferable that the conductive layer 116 extend to a region outside the end portion of the groove 170_*a* and the end portion of the groove 170_*b* in the x direction. In other words, it is preferable that the groove 170_*a* and the groove 170_*b* be shortened to a region on an inner side of the end portion of the conductive layer 116 in the x direction. In FIG. 2B, the distance from the end portion of each of the groove 170_*a* and the groove 170_*b* to the end portion of the conductive layer 116 is denoted by a distance L6.

The insulating layer 121 is provided to have a single layer or a stacked structure with two or more layers. For example, in the case where the insulating layer 121 has a stacked structure with two or more layers, for a layer on a substrate 101 side, it is preferable to select an insulator functioning as an etching stopper film at the time of forming the groove 170 by etching the insulating layer 121. For example, when silicon oxide or silicon oxynitride is used for a layer on the conductive layer 111 side, it is preferable to use silicon nitride, aluminum oxide, hafnium oxide, or the like for the layer on the substrate 101 side.

Although two grooves are preferably provided in the insulating layer 121 in a region between two conductive layers 111 adjacent in they direction, the number of grooves provided in the region may be one or three or more. Note that in a modification example described later, a display device will be described, in which one groove is provided in the insulating layer 121 in a region between two conductive layers 111 adjacent in they direction.

With such a structure, the EL layers can be separately provided in the light-emitting elements 120 emitting different colors, whereby color display with high color reproducibility can be performed with low power consumption. In addition, a microcavity structure can be given when the thickness of the EL layer in the light-emitting element 120 is adjusted in accordance with a peak wavelength of an emission spectrum, so that a high luminance display device can be achieved. Moreover, the light-emitting elements 120 can be arranged extremely densely. For example, a display device having resolution exceeding 2000 ppi can be achieved.

In the display device 100A, the above-described insulating layer 121, the light-emitting element 120R, the light-emitting element 120G, and the light-emitting element 120B are provided over the substrate 101 provided with a semiconductor circuit. The display device 100A also includes a plug 131.

The substrate 101 can use a circuit substrate including a transistor, a wiring, and the like. Note that in the case of either a passive matrix method or a segment method can be employed, an insulating substrate such as a glass substrate can be used as the substrate 101. The substrate 101 is a substrate provided with a circuit for driving the light-emitting elements (also referred to as a pixel circuit) or a semiconductor circuit functioning as a driver circuit for driving the pixel circuit. More specific structure examples of the substrate 101 will be described later.

The substrate 101 and the conductive layer 111 of the light-emitting element 120 are electrically connected to each other through a plug 131. The plug 131 is formed to be embedded in an opening provided in the insulating layer 121. The conductive layer 111 is provided in contact with a top surface of the plug 131.

Figure 3A:
FIG. 3A and FIG. 3B are diagrams illustrating structure examples of display devices.
Figure 3A:
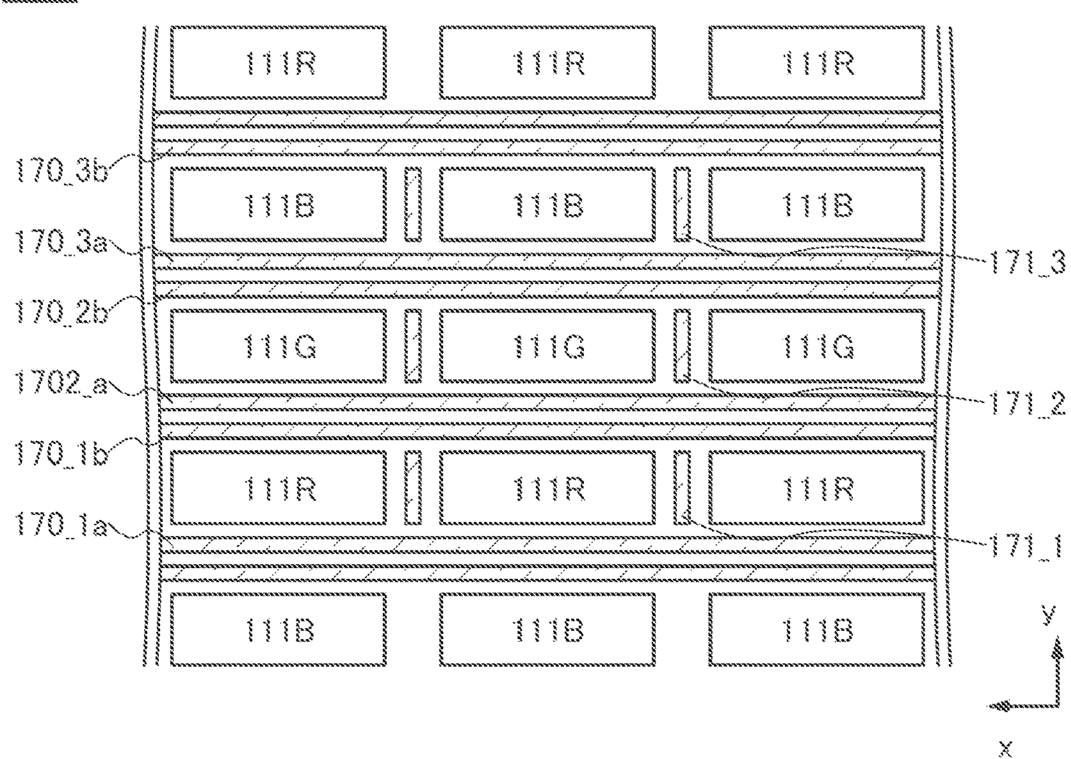

As illustrated in a display device 100B in FIG. 3A, a groove may be provided between the light-emitting elements emitting the same color. For example, as illustrated in FIG. 3A, a groove 171_1 may be provided between two light-emitting elements 120R adjacent in the x direction, a groove 171_2 may be provided between two light-emitting elements 120G adjacent in the x direction, and a groove 171_3 may be provided between two light-emitting elements 120B adjacent in the x direction. In this case, it is preferable that the groove 171_1 do not intersect (be not connected) with the groove 170_1*a* or the groove 170_1*b*. In addition, it is preferable that the groove 171_2 do not intersect (be not connected) with the groove 170_2*a* or the groove 170_2*b*. It is preferable that the groove 171_3 do not intersect (be not connected) with the groove 170_3*a* or the groove 170_3*b*. Thus, the conductive layers 116 of all the light-emitting elements can be supplied with a predetermined potential without being in a floating state.

Figure 3B:
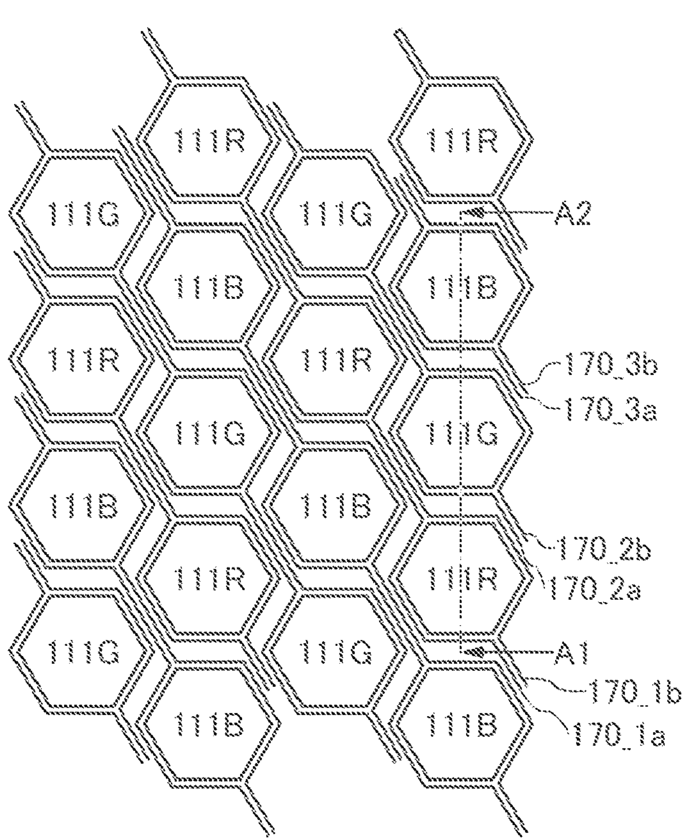

Although the preferred arrangement of the light-emitting elements 120 (the conductive layers 111) is stripe arrangement, arrangement other than the stripe arrangement may be employed. Examples of the applicable arrangement of the light-emitting elements 120 (the conductive layers 111) include delta arrangement and mosaic arrangement. A display device 100C in FIG. 3B includes the conductive layers 111 (the light-emitting elements 120) arranged in a delta manner. For example, when the groove 170 illustrated in FIG. 3B is provided, the light-emitting elements emitting different colors can be separated from each other.

Structure Example 1-2

Figure 4A:
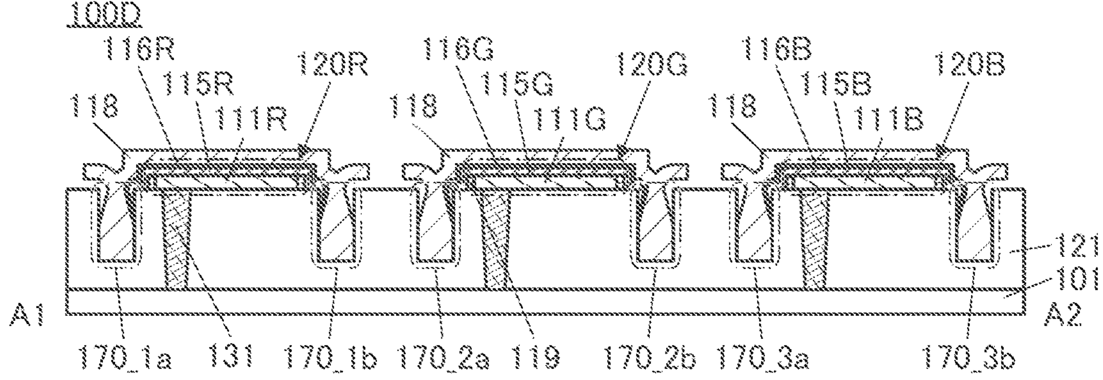
FIG. 4A to FIG. 4D are diagrams illustrating structure examples of display devices.

FIG. 4A is a schematic cross-sectional view of a display device 100D. The display device 100D is different from the display device 100A in including an insulating layer 119. FIG. 4C is an enlarged view illustrating the conductive layer 111, the insulating layer 119, and the vicinity thereof. Note that for simplification of the drawing, some components are not illustrated in the enlarged view of FIG. 4C.

The insulating layer 119 is provided between the conductive layer 111 and the EL layer so as to be in contact with the side surface of the conductive layer 111. With the insulating layer 119, the distance between the conductive layer 111 and the conductive layer 116, at a side end portion of the conductive layer 111, can be increased even when the thickness of the EL layer covering the end portion of the conductive layer 111 is reduced. Thus, a short circuit between the conductive layer 111 and the conductive layer 116 can be prevented, so that the yield of the display device can be improved. Furthermore, impurities such as water or hydrogen can be prevented from diffusing from the outside into the conductive layer 111.

Structure Example 1-3

Figure 4B:
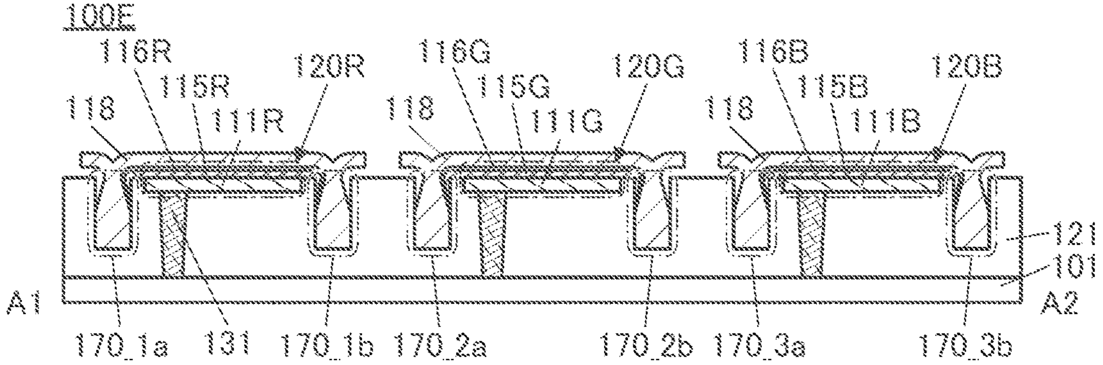
Figure 4C:
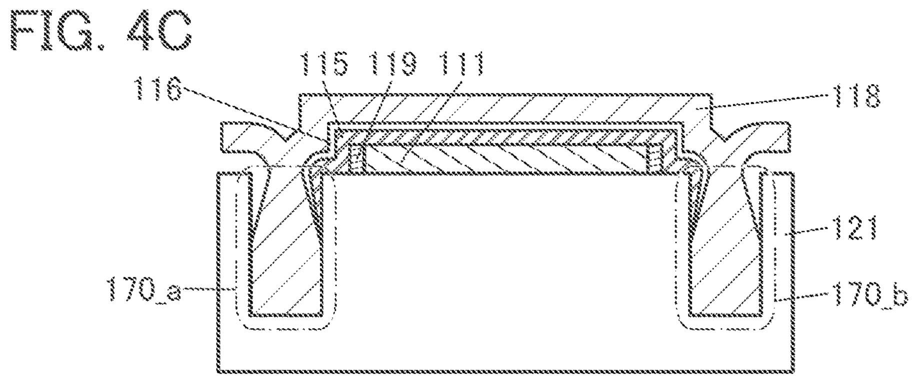
Figure 4D:
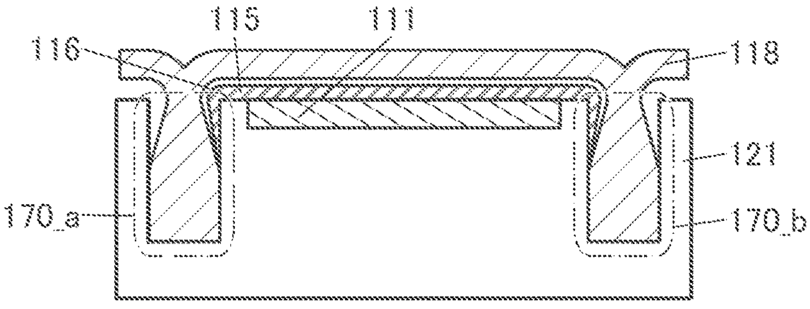

FIG. 4B is a schematic cross-sectional view of a display device 100E. The display device 100E is different from the display device 100A in the structure of the conductive layer 111. FIG. 4D is an enlarged view illustrating the conductive layer 111 and the vicinity thereof. Note that for simplification of the drawing, some components are not illustrated in the enlarged view of FIG. 4D.

In the display device 100E, the conductive layer 111 is formed to be embedded in an opening provided in the insulating layer 121. In other words, the top surface of the conductive layer 111 and the top surface of the insulating layer 121 are substantially aligned. With such a structure, the EL layer 115 can be formed on a flat surface.

In the display device 100E, the EL layer is formed on a flat surface; thus, the EL layer does not cover the end portion of the conductive layer. Thus, a reduction in the thickness of the EL layer can be prevented, which can inhibit the occurrence of a short circuit between the upper electrode and the lower electrode of the light-emitting element. Moreover, an insulator covering the end portion of the conductive layer 111 does not need to be provided, which prevents an increase in the distance between adjacent light-emitting elements, so that the display device can be miniaturized.

[Components]

[Light-Emitting Element]

As a light-emitting element that can be used as the light-emitting element 120, a self-luminous element can be used, and an element whose luminance is controlled by current or voltage is included in the category. For example, an LED, an organic EL element, an inorganic EL element, or the like can be used. In particular, an organic EL element is preferably used.

The light-emitting element has a top-emission structure, a bottom-emission structure, a dual-emission structure, or the like. A conductive film that transmits visible light is used as the electrode through which light is extracted. A conductive film that reflects visible light is preferably used as the electrode through which no light is extracted.

In one embodiment of the present invention, a top-emission light-emitting element in which light is emitted to the opposite side of the formation surface or a dual-emission light-emitting element can be particularly suitably used.

The EL layer 115 includes at least a light-emitting layer. In addition to the light-emitting layer, the EL layer 115 may further include layers containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used for the EL layer 115, and an inorganic compound may also be contained. The layers that constitute the EL layer 115 can each be formed by a method such as an evaporation method (including a vacuum evaporation method), a transfer method, a printing method, an inkjet method, or a coating method.

When a voltage higher than the threshold voltage of the light-emitting element 120 is applied between a cathode and an anode, holes are injected to the EL layer 115 from the anode side and electrons are injected to the EL layer 115 from the cathode side. The injected electrons and holes are recombined in the EL layer 115 and a light-emitting substance contained in the EL layer 115 emits light.

In the case where a light-emitting element emitting white light is used as the light-emitting element 120, the EL layer 115 preferably contains two or more kinds of light-emitting substances. A white emission can be obtained by selecting light-emitting substances so that two or more light-emitting substances emit light of complementary colors, for example. For example, it is preferable to contain two or more out of light-emitting substances emitting light of R (red), G (green), B (blue), Y (yellow), O (orange), and the like or light-emitting substances emitting light containing two or more of spectral components of R, G, and B. A light-emitting element whose emission spectrum has two or more peaks in the wavelength range of a visible light region (e.g., nm to 750 nm) is preferably employed. An emission spectrum of a material emitting light having a peak in a yellow wavelength range preferably includes spectral components also in green and red wavelength ranges.

The EL layer 115 preferably has a structure in which a light-emitting layer containing a light-emitting material emitting light of one color and a light-emitting layer containing a light-emitting material emitting light of another color are stacked. For example, the plurality of light-emitting layers in the EL layer 115 may be stacked in contact with each other or may be stacked with a region not including any light-emitting material therebetween. For example, between a fluorescent layer and a phosphorescent layer, a region that contains the same material as the fluorescent layer or phosphorescent layer (for example, a host material or an assist material) and no light-emitting material may be provided. This facilitates the manufacturing of the light-emitting element and reduces the drive voltage.

The light-emitting element 120 may be a single element including one EL layer or a tandem element in which a plurality of EL layers are stacked with a charge-generation layer therebetween.

A device having a single structure includes one light-emitting unit between a pair of electrodes, and the light-emitting unit preferably includes one or more light-emitting layers. To obtain white light emission, two or more light-emitting layers are selected such that emission colors of the light-emitting layers are complementary colors. For example, when emission colors of a first light-emitting layer and a second light-emitting layer are complementary colors, the light-emitting device can be configured to emit white light as a whole. The same applies to a light-emitting device including three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the light-emitting units can be combined to be white light. Note that a structure for obtaining white light emission is similar to a structure in the case of a single structure. In the device having a tandem structure, it is suitable that an intermediate layer such as a charge-generation layer is provided between a plurality of light-emitting units.

When the white-light-emitting device (having a single structure or a tandem structure) and a light-emitting device having an SBS structure are compared to each other, the light-emitting device having an SBS structure can have lower power consumption than the white-light-emitting device. To reduce power consumption, a light-emitting device having an SBS structure is preferably used. Meanwhile, the white-light-emitting device is preferable in terms of lower manufacturing cost or higher manufacturing yield because the manufacturing process of the white-light-emitting device is simpler than that of a light-emitting device having an SBS structure.

The conductive film that can be used for the conductive layer 111 or the like and transmits visible light can be formed using, for example, indium oxide, indium tin oxide, indium zinc oxide, zinc oxide, or zinc oxide to which gallium is added. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like formed thin enough to have a light-transmitting property can be used. A stacked-layer film of any of the above materials can be used for the conductive layer. For example, a stacked-layer film of indium tin oxide and an alloy of silver and magnesium is preferably used, in which case conductivity can be increased. Further alternatively, graphene or the like may be used.

For a portion of the conductive layer 111 positioned on the EL layer 115 side, a conductive film that reflects the visible light is preferably used. For the conductive film, for example, a metal material such as aluminum, gold, platinum, silver, nickel, tungsten, chromium, molybdenum, iron, cobalt, copper, or palladium or an alloy containing any of these metal materials can be used. Silver is preferable because of its high reflectance of visible light. In addition, aluminum is preferable because an aluminum electrode is easily etched and thus is easily processed and aluminum has high reflectance of visible light and near-infrared light. Lanthanum, neodymium, germanium, or the like may be added to the above metal material and/or alloy. Alternatively, an alloy (an aluminum alloy) containing aluminum and titanium, nickel, or neodymium may be used. Alternatively, an alloy containing silver and copper, palladium, or magnesium may be used. An alloy containing silver and copper is preferable because of its high heat resistance.

For the conductive layer 111, a structure may be employed in which a conductive metal oxide film is stacked over a conductive film that reflects visible light. Such a structure can inhibit oxidation or corrosion of the conductive film that reflects visible light, or the like. For example, when a metal film or a metal oxide film is stacked in contact with an aluminum film or an aluminum alloy film, oxidation can be inhibited. Examples of a material for the metal film or the metal oxide film include titanium and titanium oxide. Alternatively, the above conductive film that transmits visible light and a film containing a metal material may be stacked. For example, a stacked-layer film of silver and indium tin oxide or a stacked-layer film of an alloy of silver and magnesium and indium tin oxide can be used.

When aluminum is used for the conductive layer 111, the thickness of aluminum is preferably greater than or equal to 40 nm, further preferably greater than or equal to 70 nm, in which case the reflectance of visible light or the like can be sufficiently increased. When silver is used for the conductive layer 111, the thickness of silver is preferably greater than or equal to nm, further preferably greater than or equal to 100 nm, in which case the reflectance of visible light or the like can be sufficiently increased.

As the conductive film having a light-transmitting property and a reflective property that can be used for the conductive layer 116, the conductive film reflecting visible light formed to be thin enough to transmit visible light can be used. In addition, with the stacked-layer structure of the conductive film and the conductive film transmitting visible light, the conductivity, the mechanical strength, or the like can be increased.

The conductive film having a light-transmitting property and a reflective property preferably has a reflectance with respect to visible light (e.g., the reflectance with respect to light having a specific wavelength within the range of 400 nm to 700 nm) that is higher than or equal to 20% and lower than or equal to 80%, preferably higher than or equal to 40% and lower than or equal to 70%. The conductive film having a reflective property preferably has a reflectance with respect to visible light that is higher than or equal to 40% and lower than or equal to 100%, further preferably higher than or equal to 70% and lower than or equal to 100%. The conductive film having a light-transmitting property preferably has a reflectance with respect to visible light that is higher than or equal to 0% and lower than or equal to 40%, further preferably higher than or equal to 0% and lower than or equal to 30%.

For the conductive layer 111 functioning as a lower electrode, for example, a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used. This material can be suitably used as a conductive film of the plug 131.

The electrodes constituting the light-emitting elements may each be formed by an evaporation method, a sputtering method, or the like. Alternatively, a discharging method such as an inkjet method, a printing method such as a screen printing method, or a plating method may be used for the formation.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, when used for the light-emitting layer, the quantum dots can function as a light-emitting material.

Note that as the quantum dot material, a colloidal quantum dot material, an alloyed quantum dot material, a core-shell quantum dot material, a core quantum dot material, or the like can be used. A material containing elements belonging to Group 12 and Group 16, elements belonging to Group 13 and Group 15, or elements belonging to Group 14 and Group 16, may be used. Alternatively, a quantum dot material containing an element such as cadmium, selenium, zinc, sulfur, phosphorus, indium, tellurium, lead, gallium, arsenic, or aluminum may be used.

In each of the light-emitting elements, the optical distance between the surface of the reflective layer reflecting visible light and the conductive layer 116 having a light-transmitting property and a reflective property with respect to visible light is preferably adjusted to be $m \times \lambda/2$ (m is an integer greater than or equal to 1) or in the vicinity thereof, where $\lambda$ is the wavelength of light whose intensity is desired to be increased.

To be exact, the above-described optical distance depends on a product of the physical distance between the reflective surface of the reflective layer and the reflective surface of the conductive layer 116 having a light-transmitting property and a reflective property and the refractive index of a layer provided therebetween, and thus is difficult to adjust exactly. Thus, it is preferable to adjust the optical distance on the assumption that the surface of the reflective layer and the surface of the conductive layer 116 having a light-transmitting property and a reflective property are each the reflective surface.

Examples of a material that can be used for the plug 131 include metals such as aluminum, titanium, chromium, nickel, copper, yttrium, zirconium, molybdenum, gold, silver, platinum, magnesium, iron, cobalt, palladium, tantalum, and tungsten; an alloy containing any of these metal materials; and a nitride of any of these metal materials. As the plug 131, a single layer or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

Manufacturing Method Example

An example of a manufacturing method of the display device of one embodiment of the present invention will be described with reference to drawings.

Note that thin films that constitute the display device (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. An example of a thermal CVD method is a metal organic CVD (MOCVD) method.

Alternatively, thin films that constitute the display device (insulating films, semiconductor films, conductive films, or the like) can be formed by a method such as spin coating, dipping, spray coating, ink-jetting, dispensing, screen printing, offset printing, a doctor knife, a slit coater, a roll coater, a curtain coater, and a knife coater.

When the thin films that constitute the display device are processed, a photolithography method or the like can be used for the processing. Besides, a nanoimprinting method, a sandblasting method, a lift-off method, or the like may be used for the processing of the thin films. Alternatively, island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is deposited and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or combined light of any of them. Alternatively, ultraviolet light, KrF laser light, ArF laser light, or the like can be used. Exposure may be performed by liquid immersion exposure technique. As the light used for the light exposure, extreme ultraviolet (EUV) light or X-rays may be used. Furthermore, instead of the light used for the exposure, an electron beam can also be used. It is preferable to use extreme ultraviolet light, X-rays, or an electron beam because extremely minute processing can be performed. Note that a photomask is not needed when exposure is performed by scanning with a beam such as an electron beam.

For processing of the thin film, a dry etching method, a wet etching method, a sandblast method, or the like can be used. Note that the resist mask can be removed by dry etching treatment such as ashing, wet etching treatment, wet etching treatment after dry etching treatment, or dry etching treatment after wet etching treatment.

For the planarization treatment of the thin film, typically, a polishing method such as chemical mechanical polishing (CMP) method or the like can be suitably used. Alternatively, dry etching treatment or plasma treatment may be used. Note that polishing treatment, dry etching treatment, or plasma treatment may be performed a plurality of times, or these treatments may be performed in combination. In the case where the treatments are performed in combination, the order of steps is not particularly limited and may be set as appropriate depending on the roughness of the surface to be processed.

In order to accurately process the thin film to have a desired thickness, for example, the CMP method is employed. In that case, first, polishing is performed at a constant processing rate until part of the top surface of the thin film is exposed. After that, polishing is performed under a condition with a lower processing rate until the thin film has a desired thickness, so that highly accurate processing can be performed.

Examples of a method for detecting the end of the polishing include an optical method in which the surface of the formation surface is irradiated with light and a change in the reflected light is detected; a physical method in which a change in the polishing resistance received by the processing apparatus from the formation surface is detected; and a method in which a magnetic line is applied to the formation surface and a change in the magnetic line due to the generated eddy current is used.

After the top surface of the thin film is exposed, polishing treatment is performed under a condition with a low processing rate while the thickness of the thin film is monitored by an optical method using a laser interferometer or the like, whereby the thickness of the thin film can be controlled with high accuracy. Note that the polishing treatment may be performed a plurality of times until the thin film has a desired thickness, as necessary.

Manufacturing Method Example 1

An example of a manufacturing method of a display device of one embodiment of the present invention will be described below using the display device 100A exemplified in the above structure example.

[Preparation for Substrate 101]

As the substrate 101, a substrate having at least heat resistance high enough to withstand the following heat treatment can be used. In the case where an insulating substrate is used as the substrate 101, a glass substrate, a quartz substrate, a sapphire substrate, a ceramic substrate, or the like can be given. Alternatively, a single crystal semiconductor substrate using silicon or silicon carbide, a polycrystalline semiconductor substrate, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

In this embodiment, a substrate including at least a pixel circuit is used as the substrate 101.

[Formation of Insulating Layer 121, Plug 131, and Conductive Layer 111]

An insulating film to be the insulating layer 121 is formed over the substrate 101. Next, an opening reaching the substrate 101 is formed in the insulating layer 121 in a position where the plug 131 is to be formed. The opening is preferably an opening reaching an electrode or a wiring provided for the substrate 101. Then, a conductive film is formed to fill the opening and planarization treatment is performed to expose a top surface of the insulating layer 121. In this manner, the plug 131 embedded in the insulating layer 121 can be formed.

Figure 5A:
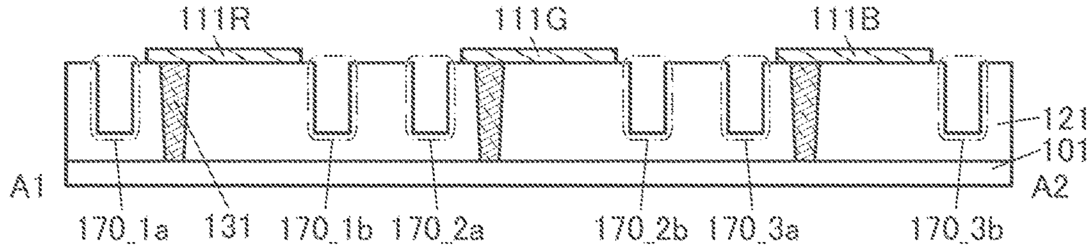
FIG. 5A to FIG. 5D are diagrams illustrating an example of a method for manufacturing a display device.

A conductive film is deposited over the insulating layer 121 and the plug 131, and an unnecessary portion of the conductive film is removed while a portion overlapping with the plug remains, so that the conductive layer 111 electrically connected to the plug 131 is formed (see FIG. 5A). For example, an etching method may be used for the removal of the unnecessary portion of the conductive film.

[Formation of Groove 170]

The groove 170 is formed in the insulating layer 121. In the insulating layer 121 illustrated in FIG. 5A, the groove **170_1*b* and the groove 170_2*a* are formed in a region between the conductive layer 111R and the conductive layer 111G, the groove 170_2*b* and the groove 170_3*a* are formed in a region between the conductive layer 111G and the conductive layer 111B, and the groove 170_3*b* and the groove 170_1*a* are formed in a region between the conductive layer 111B and the conductive layer 111R. In forming the groove 170**, wet etching may be employed; however, dry etching is preferable for microfabrication.

The width of the groove 170 in the A1-A2 direction is preferably more than two times as large as the thickness of the EL layer formed from a film containing a light-emitting compound. Accordingly, as described later, disconnection of the film containing a light-emitting compound is caused by the groove 170, so that the EL layer 115 can be formed over the conductive layer 111.

[Formation of Light-Emitting Element 120R]

A resist mask 151 is formed over the insulating layer 121, the conductive layer 111G, and the conductive layer 111B. At this time, the resist mask 151 is formed over a portion overlapping with the groove **170_2*a*, the conductive layer 111G, the groove 170_2*b*, the groove 170_3*a*, the conductive layer 111B, and the groove 170_3*b*. One of side surfaces of the resist mask 151 is located between the groove 170_1*b* and the groove 170_2*a*, and the other side surface of the resist mask 151 is located between the groove 170_3*b* and the groove 170_1*a* (see FIG. 5B). The end portion of the resist mask 151 may have an inverse tapered shape. Note that the inverse tapered shape refers to the case where the angle formed between a side surface and a bottom surface of a layer (corresponding to the resist mask 151**, here) is larger than 90° when the side surface of the layer is observed in the cross-sectional (plane perpendicular to the surface of the substrate) direction. Alternatively, the inverse tapered shape refers to a shape in which the side portion or the upper portion thereof is on the outer side of the bottom portion in the direction parallel to the substrate.

Next, a first film containing a light-emitting compound and a conductive film to be the conductive layer 116R are sequentially deposited over the insulating layer 121, the conductive layer 111R, and the resist mask 151. The first film containing a light-emitting compound is preferably deposited on the inner side of the end portion of the groove 170 in the direction where the groove 170 extends. In other words, the groove 170 preferably extends to a region beyond the end portion of the first film containing a light-emitting compound in the direction where the groove 170 extends. The conductive film is preferably deposited also on the outer side of the end portion of the groove 170 in the direction where the groove 170 extends.

Figure 5B:
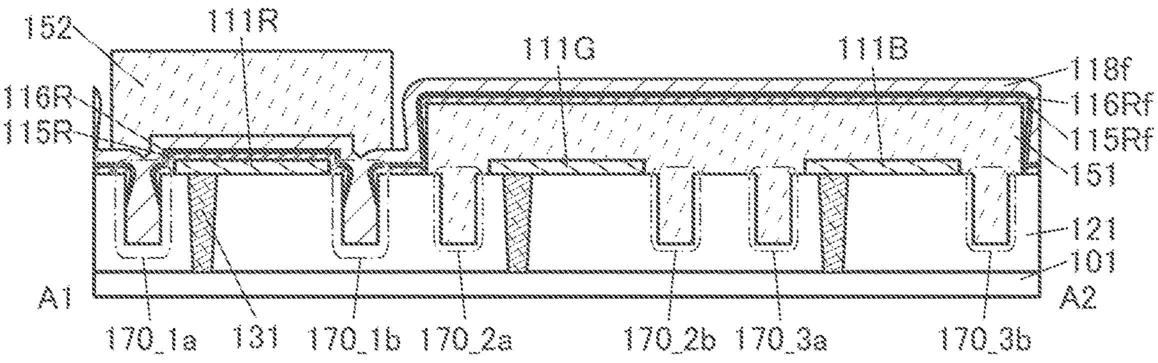

In this step, disconnection of the first film containing a light-emitting compound is caused by the groove in a region not overlapping with the resist mask 151. In FIG. 5B, the first film containing a light-emitting compound is disconnected by the groove **170_1*a* and the groove 170_1*b*. As a result, the EL layer 115R is formed over the conductive layer 111R, and an EL layer 115Rf is formed over the insulating layer 121 and the resist mask 151. As the first film containing a light-emitting compound, a conductive film to be the conductive layer 116R is disconnected by the groove in the region not overlapping with the resist mask 151, in some cases. In this case, the conductive layer 116R is formed over the EL layer 115R, and a conductive layer 116Rf is formed over the EL layer 115**Rf.

Next, an insulating layer **118*f* is deposited over the conductive layer 116R and the conductive layer 116Rf. The insulating layer 118*f* can be deposited by a sputtering method, a CVD method, an MBE method, a PLD method, an ALD method, or the like. In this embodiment, aluminum oxide is deposited as the insulating layer 118*f* using an ALD method. It is necessary that the insulating layer 118*f* be deposited to have good coverage on the bottom surface and the side surface of the groove 170 (the groove 170_1*a* and the groove 170_1*b*) provided in the insulating layer 121. By an ALD method, an atomic layer can be deposited one by one on the bottom surface and the side surface of the groove 170, whereby the insulating layer 118*f* can be deposited on the groove 170** with good coverage.

For example, in the case where aluminum oxide is deposited by an ALD method, two kinds of gases, $H_2O$ as an oxidizer and a source gas that is obtained by vaporizing liquid containing a solvent and an aluminum precursor compound (trimethylaluminum (TMA, $Al(CH_3)_3$) or the like) are used. Examples of another material include tris (dimethylamide)aluminum, triisobutylaluminum, and aluminum tris(2,2,6,6-tetramethyl-3,5-heptanedionate).

Then, a resist mask 152 is formed over the insulating layer **118*f*. At this time, the resist mask 152 is formed in a portion overlapping with the groove 170_1*a*, the conductive layer 111R, and the groove 170_1*b*. One of side surfaces of the resist mask 152 is located between the groove 170_3*b* and the groove 170_1*a*, and the other side surface of the resist mask 152 is located between the groove 170_1*b* and the groove 170_2*a* (see FIG. 5B). Note that the end portion of the resist mask 152** may have an inverse tapered shape.

Figure 5C:
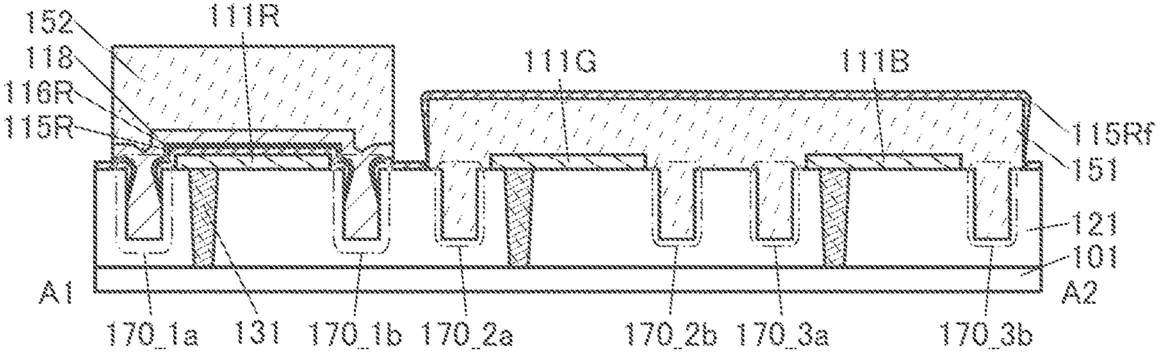

Then, the insulating layer **118*f* in a portion not covered with the resist mask 152 is removed, so that the insulating layer 118 can be formed (see FIG. 5C). A dry etching method or a wet etching method can be used for the removal of part of the insulating layer 118*f* Note that the conductive layer 116Rf in a portion not covered with the resist mask 152 may be removed. In this case, the insulating layer 118*f* and the conductive layer 116Rf that are not covered with the resist mask 152** may be removed with the same condition or different conditions.

Next, the resist mask 152 and the resist mask 151 are removed. At this time, the EL layer 115Rf not covered with the resist mask 152 is also removed. Note that the conductive layer 116Rf not covered with the resist mask 152 is removed together with the EL layer 115Rf not covered with the resist mask 152 in the case where the corresponding conductive layer 116Rf has not been removed in the above etching step.

Figure 5D:
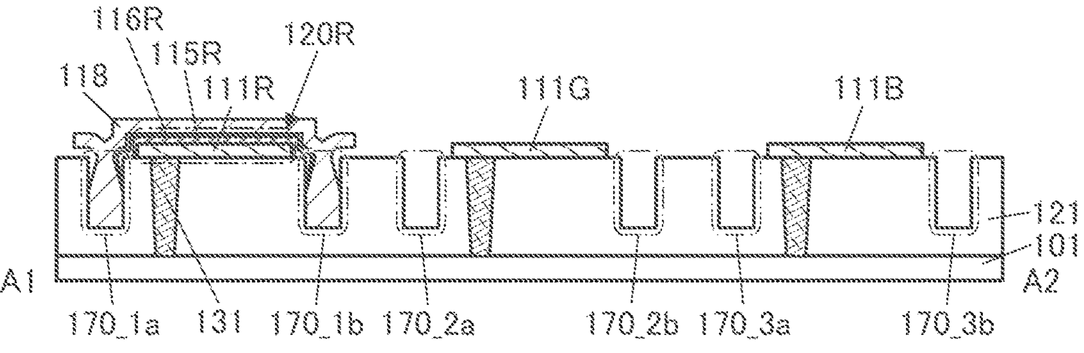

Through the above steps, the light-emitting element 120R sealed with the insulating layer and the insulating layer 118 can be formed (see FIG. 5D). Note that the conductive layer 116Rf and the EL layer 115Rf in a portion which overlaps with the resist mask 152 and does not overlap with the conductive layer 111R, are removed in some cases.

[Formation of Light-Emitting Element 120G]

The resist mask 151 is formed over the insulating layer 121, the conductive layer 111B, and the insulating layer 118. At this time, the resist mask 151 is formed in a portion overlapping with the insulating layer 118, the groove 170_3*a*, the conductive layer 111B, and the groove 170_3*b*. One of side surfaces of the resist mask 151 is located between the groove 170_2*b* and the groove 170_3*a*, and the other side surface of the resist mask 151 is located between the groove 170_1*b* and the groove 170_2*a* (see FIG. 6A). Note that the end portion of the resist mask 151 may have an inverse tapered shape.

Next, a second film containing a light-emitting compound and a conductive film to be the conductive layer 116G are sequentially deposited over the insulating layer 121, the conductive layer 111G, and the resist mask 151. The second film containing a light-emitting compound is preferably deposited on the inner side of the end portion of the groove 170 in the direction where the groove 170 extends. In other words, the groove 170 preferably extends to a region beyond the end portion of the second film containing a light-emitting compound in the direction where the groove 170 extends. The conductive film is preferably deposited also on the outer side of the end portion of the groove 170 in the direction where the groove 170 extends.

Figure 6A:
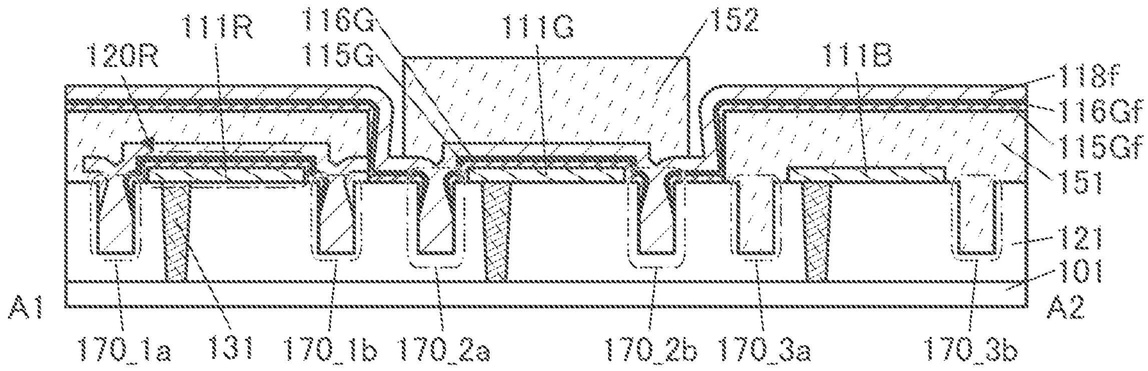
FIG. 6A to FIG. 6C are diagrams illustrating an example of a method for manufacturing a display device.

In this step, disconnection of the second film containing a light-emitting compound is caused by the groove in a region not overlapping with the resist mask 151. In FIG. 6A, the second film containing a light-emitting compound is disconnected by the groove 170_2*a* and the groove 170_2*b*. As a result, the EL layer 115G is formed over the conductive layer 111G, and an EL layer 115Gf is formed over the insulating layer 121 and the resist mask 151. Note that as the second film containing a light-emitting compound, the conductive film to be the conductive layer 116G is disconnected by the groove in the region not overlapping with the resist mask 151, in some cases. In this case, the conductive layer 116G is formed over the EL layer 115G, and the conductive layer 116Gf is formed over the EL layer 115Gf.

Next, the insulating layer 118*f* is deposited over the conductive layer 116G and the conductive layer 116Gf. The insulating layer 118*f* can be deposited by a sputtering method, a CVD method, an MBE method, a PLD method, an ALD method, or the like as appropriate. In this embodiment, aluminum oxide is deposited as the insulating layer 118*f* by an ALD method. Accordingly, as described above, the insulating layer 118*f* can be deposited to have good coverage on the groove 170 (corresponding to the groove 170_2*a* and the groove 170_2*b*, here).

Then, the resist mask 152 is formed over the insulating layer 118*f*. At this time, the resist mask 152 is formed in a portion overlapping with groove 170_2*a*, the conductive layer 111G, and the groove 170_2*b*. One of side surfaces of the resist mask 152 is located between the groove 170_1*b* and the groove 170_2*a*, and the other side surface of the resist mask 152 is located between the groove 170_2*b* and the groove 170_3*a* (see FIG. 6A). Note that the end portion of the resist mask 152 may have an inverse tapered shape.

Figure 6B:
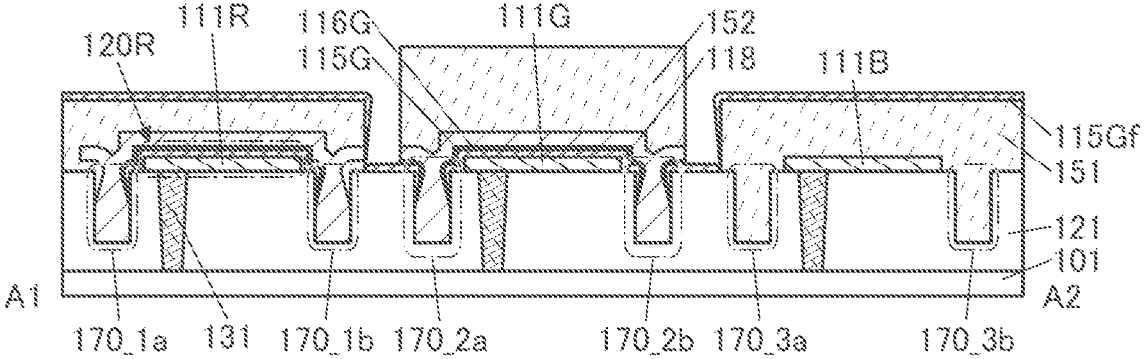

Then, the insulating layer 118*f* in a portion not covered with the resist mask 152 is removed, so that the insulating layer 118 can be formed (see FIG. 6B). A dry etching method or a wet etching method can be used for the removal of part of the insulating layer 118*f* Note that the conductive layer 116Gf in a portion not covered with the resist mask 152 may be removed. In this case, the insulating layer 118*f* and the conductive layer 116Gf that are not covered with the resist mask 152 may be removed with the same condition or different conditions.

Next, the resist mask 152 and the resist mask 151 are removed. At this time, the EL layer 115Gf not covered with the resist mask 152 is removed. Note that the conductive layer 116Gf not covered with the resist mask 152 is removed together with the EL layer 115Gf not covered with the resist mask 152 in the case where the corresponding conductive layer 116Gf has not been removed in the above etching step.

Figure 6C:
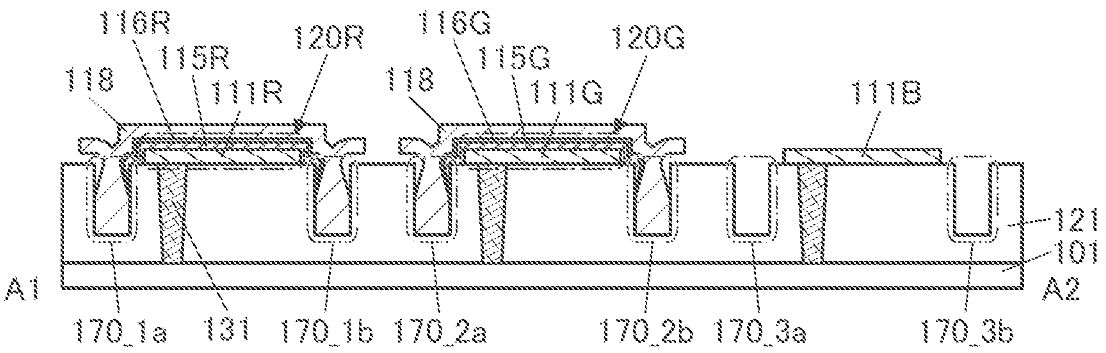

Through the above steps, the light-emitting element 120G sealed with the insulating layer and the insulating layer 118 can be formed (see FIG. 6C). Note that the conductive layer 116Gf and the EL layer 115Gf in a portion which overlaps with the resist mask 152 and does not overlap with the conductive layer 111G, are removed in some cases.

[Formation of Light-Emitting Element 120B]

The resist mask 151 is formed over the insulating layer 121 and the insulating layer 118. At this time, the resist mask 151 is formed in a portion overlapping with the insulating layer 118. One of side surfaces of the resist mask 151 is located between the groove 170_3*b* and the groove 170_1*a*, and the other side surface of the resist mask 151 is located between the groove 170_2*b* and the groove 170_3*a* (see FIG. 7A). Note that the end portion of the resist mask 151 may have an inverse tapered shape.

Next, a third film containing a light-emitting compound and a conductive film to be the conductive layer 116B are sequentially deposited over the insulating layer 121 and the resist mask 151. Note that the third film containing a light-emitting compound is preferably deposited on the inner side of the end portion of the groove 170 in the direction where the groove 170 extends. In other words, the groove 170 preferably extends to a region beyond the end portion of the third film containing a light-emitting compound in the direction where the groove 170 extends. The conductive film is preferably deposited also on the outer side of the end portion of the groove 170 in the direction where the groove 170 extends.

Figure 7A:
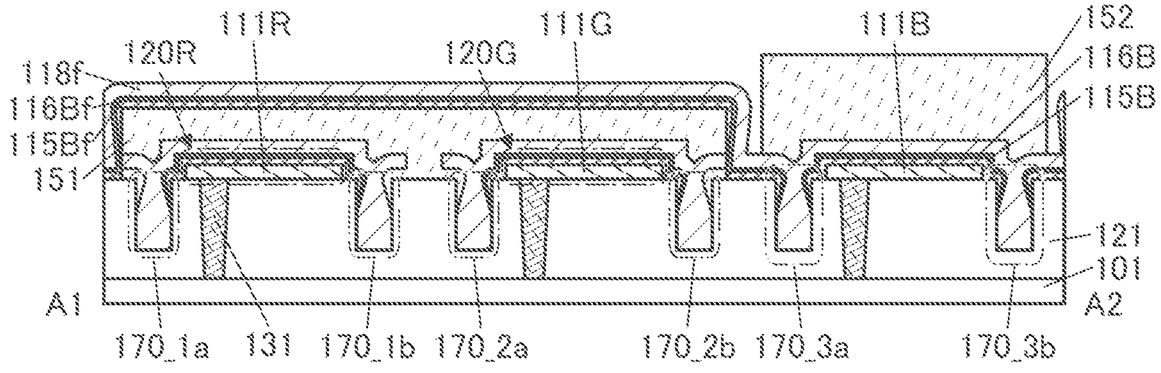
FIG. 7A to FIG. 7C are diagrams illustrating an example of a method for manufacturing a display device.

In this step, disconnection of the third film containing a light-emitting compound is caused by the groove in a region not overlapping with the resist mask 151. In FIG. 7A, the third film containing a light-emitting compound is disconnected by the groove 170_3*a* and the groove 170_3*b*. As a result, the EL layer 115B is formed over the conductive layer 111B, and an EL layer 115Bf is formed over the insulating layer 121 and the resist mask 151. As the third film containing a light-emitting compound, the conductive film to be the conductive layer 116B is disconnected by the groove in the region not overlapping with the resist mask 151, in some cases. At this time, the conductive layer 116B is formed over the EL layer 115B, and the conductive layer 116Bf is formed over the EL layer 115Bf.

Next, the insulating layer 118*f* is deposited over the conductive layer 116B and the conductive layer 116Bf. The insulating layer 118*f* can be deposited by a sputtering method, a CVD method, an MBE method, a PLD method, an ALD method, or the like as appropriate. In this embodiment, aluminum oxide is deposited as the insulating layer 118*f* by an ALD method. Accordingly, as described above, the insulating layer 118*f* can be deposited to have good coverage on the groove 170 (corresponding to the groove 170_3*a* and the groove 170_3*b*, here).

Then, the resist mask 152 is formed over the insulating layer 118*f*. At this time, the resist mask 152 is formed in a portion overlapping with the groove 170_3*a*, the conductive layer 111B, and the groove 170_3*b*. One of side surfaces of the resist mask 152 is located between the groove 170_2*b* and the groove 170_3*a*, and the other side surface of the resist mask 152 is located between the groove 170_3*b* and the groove 170_1*a* (see FIG. 7A). Note that the end portion of the resist mask 152 may have an inverse tapered shape.

Figure 7B:
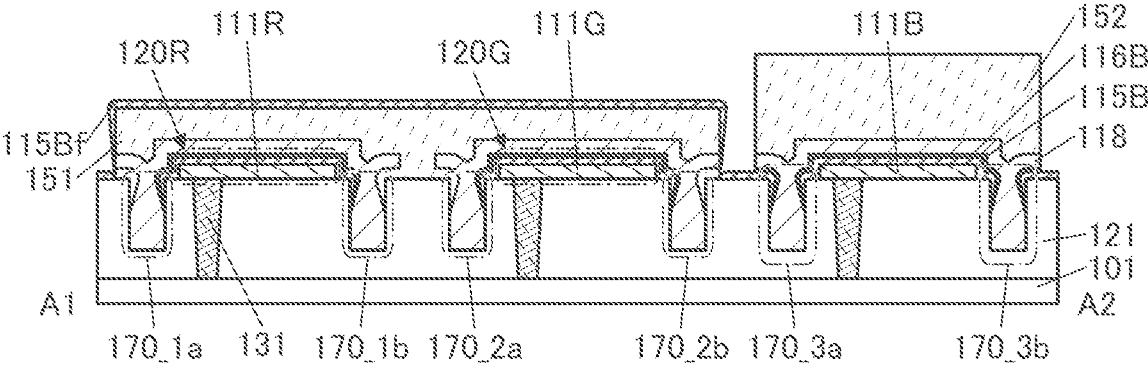

Then, the insulating layer 118*f* in a portion not covered with the resist mask 152 is removed, so that the insulating layer 118 can be formed (see FIG. 7B). A dry etching method or a wet etching method can be used for the removal of part of the insulating layer 118*f* Note that the conductive layer 116Bf in a portion not covered with the resist mask 152 may be removed. In this case, the insulating layer 118*f* and the conductive layer 116Bf that are not covered with the resist mask 152 may be removed with the same condition or different conditions.

Next, the resist mask 152 and the resist mask 151 are removed. At this time, the EL layer 115Bf not covered with the resist mask 152 is removed. Note that the conductive layer 116Bf not covered with the resist mask 152 is removed together with the EL layer 115Bf not covered with the resist mask 152 in the case where the corresponding conductive layer 116Bf has not been removed in the above etching step.

Figure 7C:
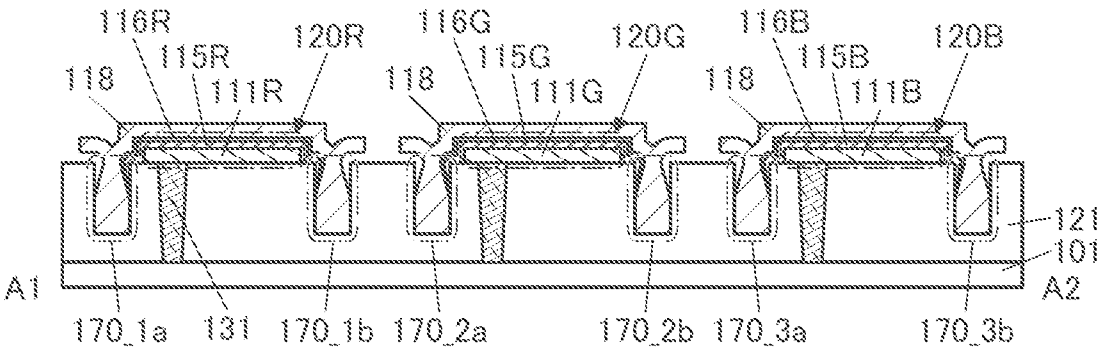

Through the above steps, the light-emitting element 120B sealed with the insulating layer and the insulating layer 118 can be formed (see FIG. 7C). Note that the conductive layer 116Bf and the EL layer 115Bf in a portion which overlaps with the resist mask 152 and does not overlap with the conductive layer 111B, are removed in some cases.

As described above, the light-emitting element 120R, the light-emitting element 120G, and the light-emitting element 120B can be formed. Note that the formation order of the light-emitting element 120R, the light-emitting element 120G, and the light-emitting element 120B is not limited to the above. For example, the light-emitting element 120R, the light-emitting element 120B, and the light-emitting element 120G may be formed in this order. Alternatively, the light-emitting element 120G may be formed first, or the light-emitting element 120B may be formed first.

The manufacturing method may be adjusted as appropriate depending on the number of colors of light emitted by the light-emitting elements 120 in the display device 100A. For example, in the case where two colors are emitted by the light-emitting elements 120 in the display device 100A, the resist mask 151 may be formed in a portion overlapping with one of two conductive layers 111 and grooves provided in the vicinity thereof, and the resist mask 152 may be formed in a portion overlapping with the other conductive layer 111 and grooves provided in the vicinity thereof. Alternatively, in the case where four colors are emitted by the light-emitting elements 120 in the display device 100A, the resist mask 151 may be formed in portions overlapping with three out of four conductive layers 111 and grooves provided in the vicinity thereof, and the resist mask 152 may be formed in a portion overlapping with the other conductive layer 111 and grooves provided in the vicinity thereof.

According to the above manufacturing method example, when being sealed with the insulating layer 121 and the insulating layer 118, the EL layer 115 is not exposed to a chemical solution or the like used in removing the resist mask. Thus, without using a metal mask for depositing the EL layer 115 and the conductive layer 116, the light-emitting element 120 can be formed.

According to the above manufacturing method example, the difference in the optical distance between the conductive layer 111 and the conductive layer 116 can be precisely controlled by the thicknesses of the EL layer 115; thus, chromaticity deviation in the light-emitting elements is unlikely to occur, so that a display device having excellent color reproducibility and extremely high display quality can be manufactured easily.

The light-emitting element 120 can be formed over an insulating layer 121 with a planarized top surface. Furthermore, the lower electrode (the conductive layer 111) of the light-emitting element 120 can be electrically connected to a pixel circuit or the like on the substrate through the plug 131, so that an extremely minute pixel can be formed and accordingly a display device with extremely high resolution can be achieved. In addition, since the light-emitting element 120 can be placed to overlap with the pixel circuit or the driver circuit, a display device with a high aperture ratio (effective light-emitting area ratio) can be achieved.

Manufacturing Method Example 2

Description is made below using the display device 100D exemplified in the above structure example.

Note that for the portions similar to those in Manufacturing method example 1, the above description is referred to and the repeated description is skipped below, in some cases.

[Preparation for Substrate 101]

As in the above, a substrate including at least a pixel circuit is used as the substrate 101.

[Formation of Insulating Layer 121, Plug 131, and Conductive Layer 111]

Figure 8A:
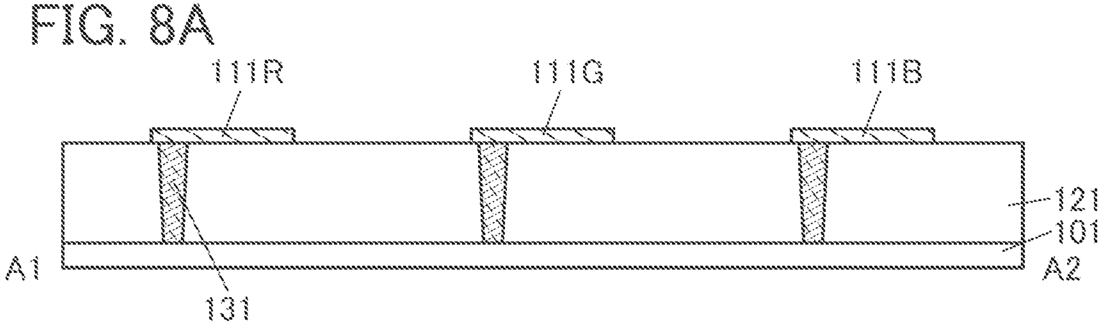
FIG. 8A to FIG. 8C are diagrams illustrating an example of a method for manufacturing a display device.

Next, the insulating layer 121, the plug 131, and the conductive layer 111 are formed (see FIG. 8A). The insulating layer 121, the plug 131, and the conductive layer 111 can be formed by a method similar to that described above.

[Formation of Insulating Layer 119]

Figure 8B:
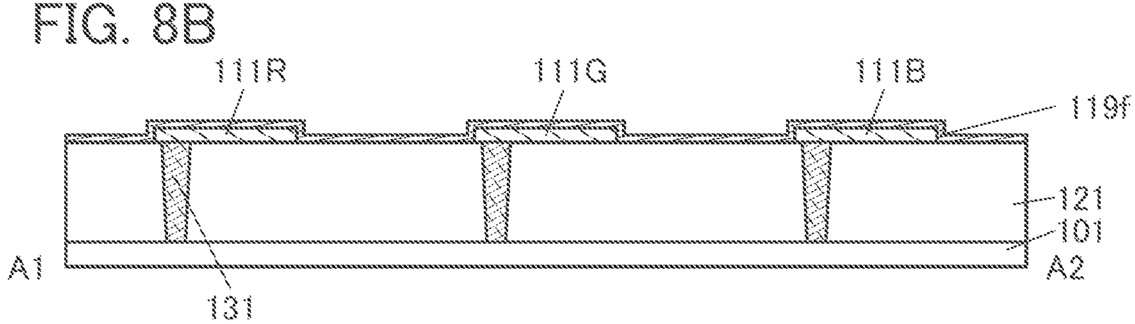

An insulating film 119*f* to be the insulating layer 119 is deposited over the insulating layer 121 and the conductive layer 111 (see FIG. 8B). The insulating film 119*f* can be deposited by a sputtering method, a CVD method, an MBE method, a PLD method, an ALD method, or the like as appropriate.

Figure 8C:
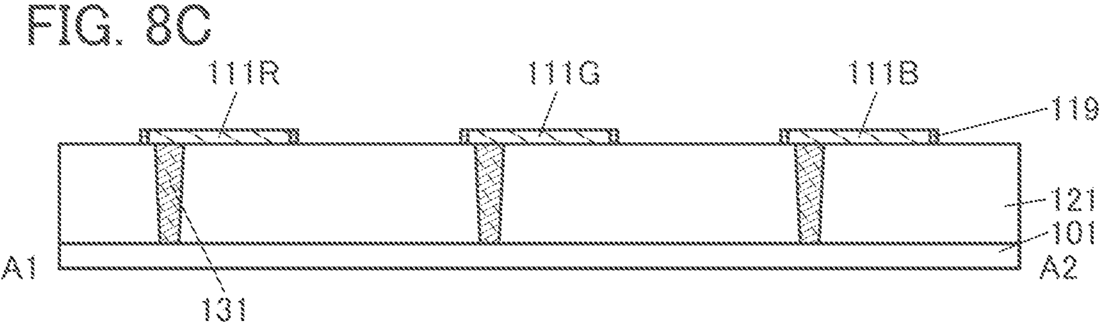

Then, anisotropic etching is performed on the insulating film 119*f*, whereby the insulating layer 119 in contact with the side surface of the conductive layer 111 is formed (see FIG. 8C). Here, at least part of the insulating film 119*f* is removed, and at least part of the top surface of the conductive layer 111 is exposed. For the anisotropic etching, a dry etching method or the like may be employed, for example.

[Formation of Groove 170]

Next, the groove 170 is formed over the insulating layer 121. The groove 170 can be formed by a method similar to that described above.

[Formation of Light-Emitting Element 120R, Light-Emitting Element 120G, and Light-Emitting Element 120B]

Then, the light-emitting element 120R, the light-emitting element 120G, and the light-emitting element 120B are formed over the insulating layer 121. The light-emitting element 120R, the light-emitting element 120G, and the light-emitting element 120B can be formed by a method similar to that described above.

According to the above manufacturing method example, a display device with extremely high display quality can be manufactured easily by adjusting the thickness of the EL layer 115 as described above.

The light-emitting element 120 can be formed over the insulating layer 121 with a planarized top surface. Furthermore, the lower electrode (the conductive layer 111) on the light-emitting element 120 can be electrically connected to a pixel circuit or the like of the substrate 101 through the plug 131, so that an extremely minute pixel can be formed and accordingly a display device with extremely high resolution can be achieved. In addition, since the light-emitting element 120 can be placed to overlap with the pixel circuit or the driver circuit, a display device with a high aperture ratio (effective light-emitting area ratio) can be achieved.

Note that in the display device of one embodiment of the present invention or a manufacturing method of the display device, there is no particular limitation on the screen ratio (aspect ratio) of a display portion in the display device. For example, the display device is compatible with a variety of screen ratios such as 1:1 (square), 3:4, 16:9, and 16:10.

Modification Example

A modification example whose structure is partly different from the above display device is described below.

Note that in the description below, the above description is referred to for portions similar to those described in Structure example 1, and the portions are not described in some cases.

Modification Example 1

Figure 9A:
FIG. 9A and FIG. 9B are diagrams illustrating a structure example of a display device.
Figure 9A:
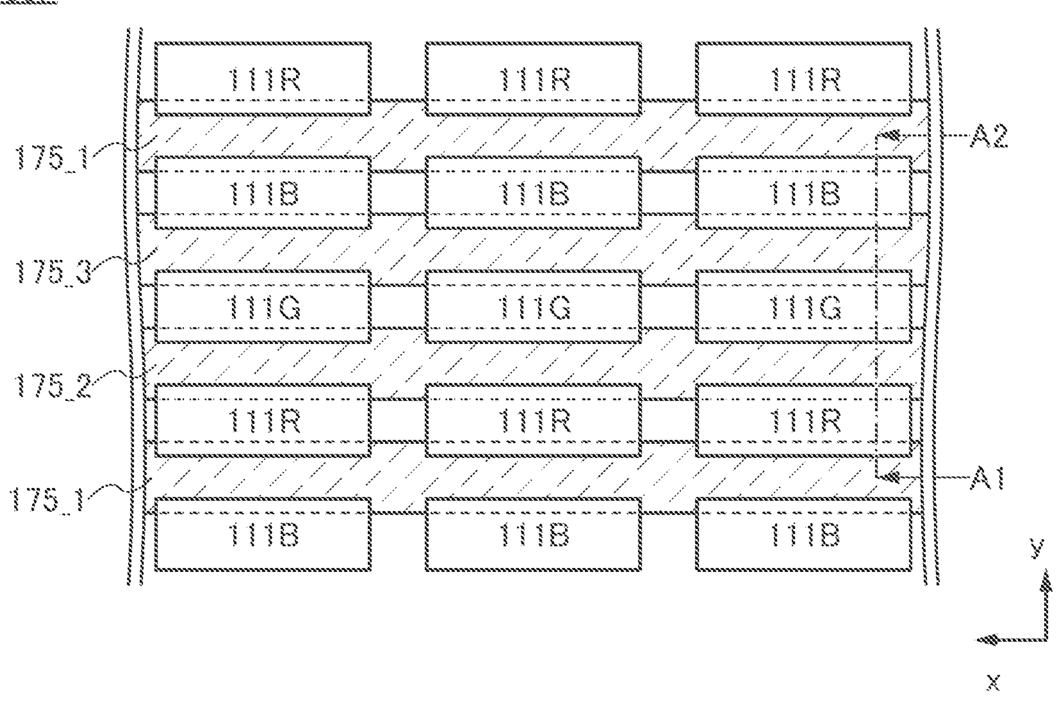
Figure 9B:
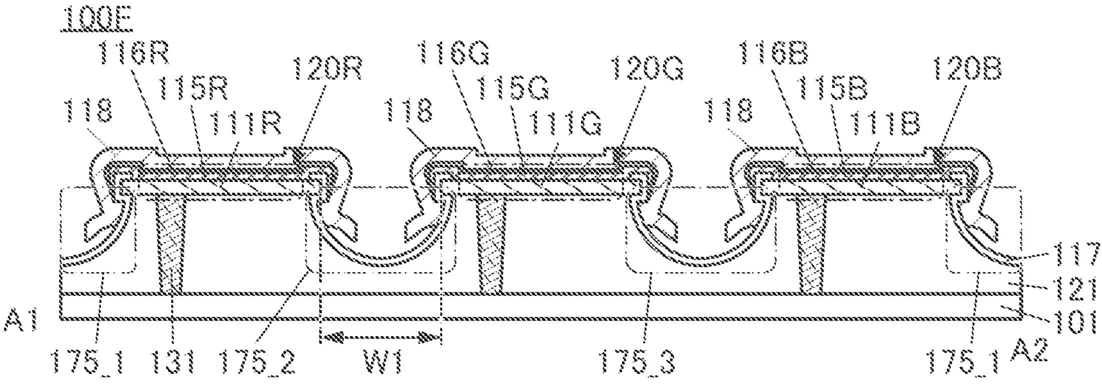

FIG. 9A and FIG. 9B are each a diagram illustrating a display device of one embodiment of the present invention. FIG. 9A is a schematic top view of a display device 100F, and FIG. 9B is a schematic cross-sectional view of the display device 100F. Here, FIG. 9B is a cross-sectional view of a portion indicated by the dashed-dotted line A1-A2 in FIG. 9A. Note that for clarity of the drawing, some components are omitted in the top view of FIG. 9A.

The display device 100F is different from the display device 100A mainly in that the number of grooves provided between adjacent light-emitting elements emitting different colors is one and an insulating layer 117 is included.

In FIG. 9A, one groove is provided in the insulating layer 121 in a region between two conductive layers 111 adjacent in the A1-A2 direction (y direction). As illustrated in FIG. 9A and FIG. 9B, a groove 175_2 is provided between the light-emitting element 120R and the light-emitting element 120G, a groove 175_3 is provided between the light-emitting element 120G and the light-emitting element 120B, and a groove 175_1 is provided between the light-emitting element 120B and the light-emitting element 120R.

In the following description common to the groove 175_1, the groove 175_2, and the groove 175_3, some reference numerals are omitted and the term "groove 175" is used in some cases.

Part of the groove 175 is preferably located below the conductive layer 111. For example, as illustrated in FIG. 9B, the groove 175 preferably has a downward-convex semicircular shape in a cross-sectional view of the display device 100F. Such a shape of the groove 175 enables the EL layer 115 and the conductive layer 116 to be divided between adjacent light-emitting elements emitting different colors without using a shadow mask such as a metal mask. Accordingly, leakage current flowing between the adjacent light-emitting elements emitting different colors can be prevented. Thus, light emission caused by the leakage current can be inhibited, so that display with high contrast can be obtained. Furthermore, even in the case where the resolution is increased, the range of choices for materials can be widened since the EL layer can be formed using a material with high conductivity, which facilitates an improvement in efficiency, a reduction in power consumption, and an improvement in reliability.

The groove 175 includes a first region, a second region, and a third region located between the first region and the second region. That is, the first region and the second region do not overlap with each other. Between adjacent two light-emitting elements emitting different colors, the first region is located on the side of one of light-emitting elements, and the second region is located on the side of the other light-emitting element. For example, the groove 175_2 provided between the light-emitting element 120R and the light-emitting element 120G includes a first region located on the light-emitting element 120R side and a second region located on the light-emitting element 120G side. In this structure, the insulating layer 118 over the light-emitting element 120R includes a region overlapping with first region of the groove 175_2, and the insulating layer 118 over the light-emitting element 120G includes a region overlapping with the second region of the groove 175_2.

The width of the groove 175 (width W1 in FIG. 9B) in a region not overlapping with the conductive layer 111 in the A1-A2 direction may be adjusted as appropriate in accordance with the processing accuracy in the case of employing a photolithography method, the thickness of the EL layer 115, the thickness of the conductive layer 116, and the like. For example, the width of the groove 175 (width W1) in a region not overlapping with the conductive layer 111 in the A1-A2 direction is greater than or equal to 300 nm and less than or equal to 1200 nm, preferably greater than or equal to 400 nm and less than or equal to 1000 nm, further preferably greater than or equal to 500 nm and less than or equal to 900 nm. Thus a display device with extremely high resolution can be achieved, in which pixels including one or more light-emitting elements are arranged with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi. Note that in the display device 100F in FIG. 9B, the width W1 can be referred to as the shortest distance between the end portions of the conductive layers 111 facing each other.

In the display device 100F, the insulating layer 117 is provided between the conductive layers 111 so as to cover the end portions of the conductive layers 111. The insulating layer 117 is referred to as a bank, a partition, a barrier, a partition wall, or the like in some cases. The insulating layer 117 has a function of preventing electrical short circuit between the conductive layer 111 and the conductive layer 116 because of a decrease in the thickness of the EL layer 115 due to a step at the end portion of the conductive layer 111. For higher coverage with the EL layer 115, an end portion of the insulating layer 117 located over the conductive layer 111 may have a tapered shape. The insulating layer 117 is located between adjacent light-emitting elements 120 and covers the end portion of the conductive layer 111 in each of the light-emitting elements 120. In FIG. 9B, the insulating layer 117 is located between the light-emitting element 120R and the light-emitting element 120G and covers each end portion of the conductive layer 111R and the conductive layer 111G. Furthermore, the insulating layer 117 is located between the light-emitting element 120G and the light-emitting element 120B and covers each end portion of the conductive layer 111G and the conductive layer 111B. Furthermore, the insulating layer is located between the light-emitting element 120B and the light-emitting element 120R and covers each end portion of the conductive layer 111B and the conductive layer 111R.

The insulating layer 118 has a region, below the light-emitting element 120, in contact with the insulating layer 117 that is in contact with the insulating layer 121 in the A1-A2 direction. In other words, the light-emitting element 120 is sealed with the insulating layer 121, the insulating layer 117, and the insulating layer 118 in the display device 100F. The insulating layer 118 functions as a protective layer that prevents diffusion of impurities such as water into the light-emitting element. As the insulating layer 118, it is preferable to use an inorganic insulating film with low moisture permeability, such as a silicon oxide film, a silicon nitride film, or an aluminum oxide film. When aluminum oxide is used for the insulating layer 118, the insulating layer 118 is an insulating layer containing aluminum and oxygen.

Modification Example 2

Figure 10A:
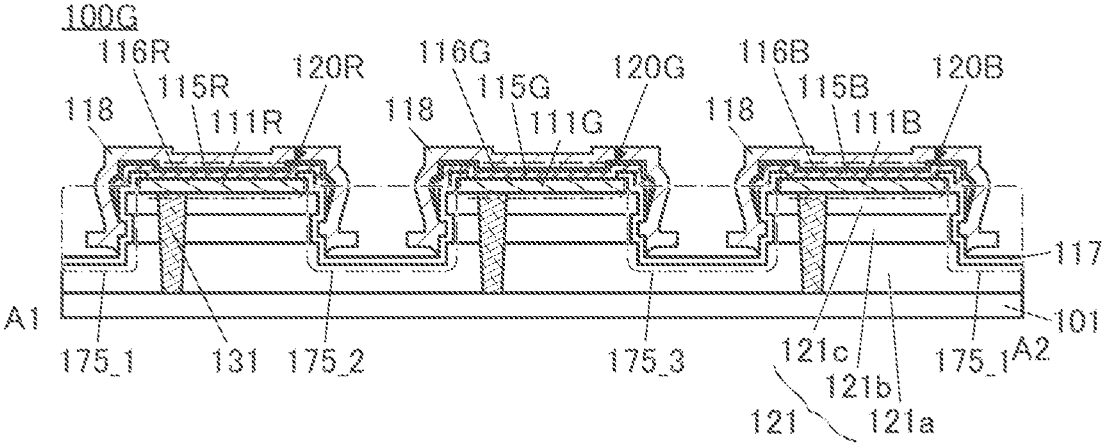
FIG. 10A to FIG. 10C are diagrams illustrating structure examples of display devices.
Figure 10B:
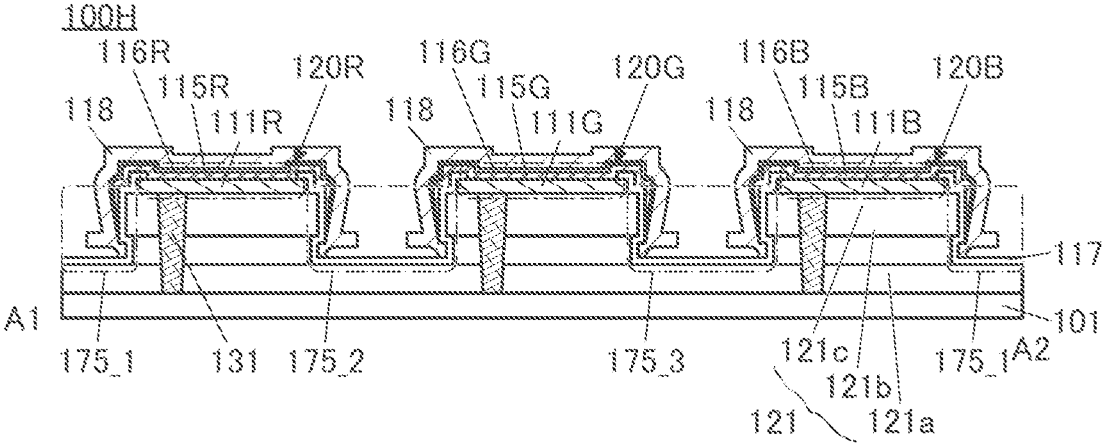

FIG. 10A and FIG. 10B are schematic cross-sectional views of a display device 100G and a display device 100H. The display device 100G and the display device 100H are different from the display device 100F in the shape of the groove 175 provided in the insulating layer 121.

In the cross-sectional view of the display device, the groove 175 has a region with a first width and a region with a second width. The first width is preferably smaller than the shortest distance between the end portions of the conductive layers 111 facing each other, and the second width is preferably larger than the first width. Such a shape of the groove 175 enables the EL layer 115 and the conductive layer 116 to be divided between adjacent light-emitting elements emitting different colors without using a shadow mask such as a metal mask. Accordingly, leakage current flowing between the adjacent light-emitting elements of different colors can be prevented. Thus, a display device with high contrast can be achieved as described above. Furthermore, an improvement in efficiency, a reduction in power consumption, and an improvement in reliability can be facilitated.

Figure 10C:
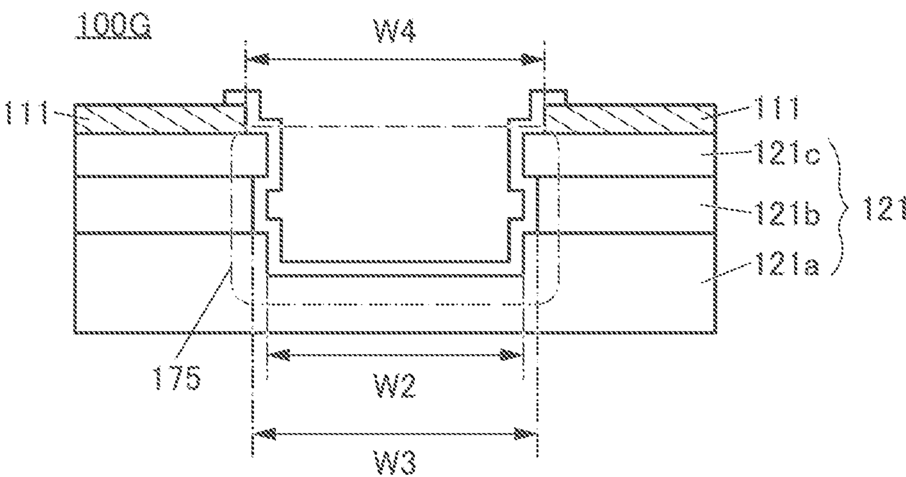

FIG. 10C is a schematic cross-sectional view of the groove 175 and the vicinity thereof of the display device 100G. Note that for clarity of the drawing, some components are omitted in FIG. 10C. The first width corresponds to a width W2 illustrated in FIG. 10C, the second width corresponds to a width W3 illustrated in FIG. 10C, and the shortest distance between the end portions of the conductive layers 111 facing each other corresponds to a distance W4. As described above, it is preferable that the width W2 be smaller than the distance W4 and that the width W3 be larger than the width W2.

For example, the groove 175 in the display device 100G may have a cross-like shape in the cross-sectional view of the display device 100G as illustrated in FIG. 10A. For example, the groove 175 in the display device 100H may have an inverse T-like shape in the cross-sectional view of the display device 100H as illustrated in FIG. 10B.

When the groove 175 has a cross-like shape illustrated in FIG. 10A or an inverse T-like shape illustrated in FIG. 10B, the groove 175 is not necessarily located below the conductive layer 111. In other words, the second width (width W3) may be smaller than the shortest distance (distance W4) between the end portions of the conductive layer 111 facing each other. Thus, there is no limitation on the magnitude relationship between the width W3 and the distance W4.

As illustrated in FIG. 10A and FIG. 10B, the insulating layer 121 preferably has a stacked structure of an insulating layer 121*a*, an insulating layer 121*b*, and an insulating layer 121*c*. In addition, the etching rate of a material used for the insulating layer 121*b* is preferably different from that of a material used for the insulating layer 121*a* and the insulating layer 121*c*. With such a structure, the groove 175 with a shape illustrated in FIG. 10A or FIG. 10B can be formed.

The shape of the groove 175 is not limited to the shapes described in Modification example 1 and Modification example 2. Part of the groove 175 may be located below the conductive layer 111. Alternatively, the groove 175 may have two or more regions with different widths. For example, the groove 175 may have a hollow curved shape, a shape with a flat bottom surface and a downward-convex semicircular side wall, or a T-like shape in the cross-sectional view of the display device. The insulating layer 121 may be formed to have a single-layer structure or a stacked structure of two or more layers, depending on the shape of the groove 175.

Manufacturing Method Example 3

An example of a manufacturing method of a display device of one embodiment of the present invention will be described below using the display device 100F exemplified in the above modification example.

Note that for the portions similar to those in Manufacturing method example 1 or Manufacturing method example 2, the above description is referred to and the repeated description is skipped in some cases.

[Preparation for Substrate 101]

As in the above modification example, a substrate including at least a pixel circuit is used as the substrate 101.

[Formation of Insulating Layer 121, Plug 131, and Conductive Layer 111]

Next, the insulating layer 121, the plug 131, and the conductive layer 111 are formed (see FIG. 8A). The insulating layer 121, the plug 131, and the conductive layer 111 can be formed by a method similar to that described above.

[Formation of Groove 175]

Figure 11A:
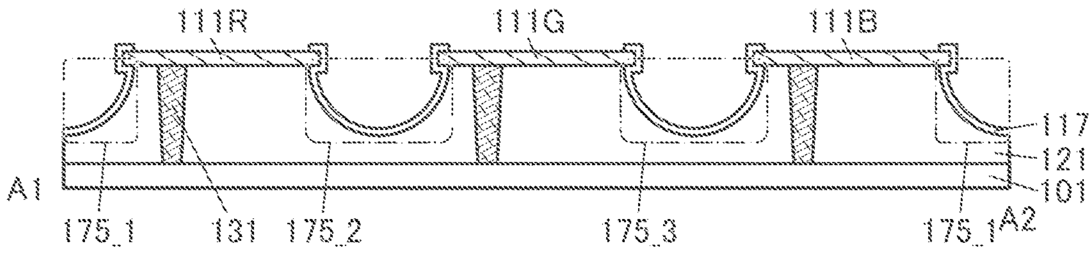
FIG. 11A to FIG. 11D are diagrams illustrating a method for manufacturing a display device.

Then, the grooves 175 are formed in the insulating layer 121 (see FIG. 11A). To form the groove 175, an isotropic etching method can be used. For example, wet etching treatment or anisotropic plasma etching treatment can be used. In particular, wet etching treatment is preferably used. In this manner, the groove 175 part of which is located below the conductive layer 111 can be formed.

Note that one groove 175 is provided between light-emitting elements emitting different colors. As illustrated in FIG. 11A, the groove 175_2 is provided between the conductive layer 111R and the conductive layer 111G, the groove 175_3 is provided between the conductive layer 111G and the conductive layer 111B, and the groove 175_1 is provided between the conductive layer 111B and the conductive layer 111R.

[Formation of Insulating Layer 117]

Next, an insulating film is deposited to cover the conductive layer 111 and the insulating layer 121, and an unnecessary portion of the insulating film is removed, whereby the insulating layer 117 covering the end portion of the conductive layer 111 is formed (see FIG. 11A). An etching method is preferably used for the removal of the unnecessary portion of the insulating film, for example. The end portion of the insulating layer 117 over the conductive layer 111 is preferably processed into a tapered shape. The taper angle of the end portion of the insulating layer 117 (an angle between the formation surface and the end surface) is greater than 0° and less than or equal to 60°, preferably greater than or equal to 5° and less than or equal to 45°, further preferably greater than or equal to 5° and less than or equal to 30°.

The insulating layer 117 can be formed using an organic insulating film or an inorganic insulating film. In particular, in the case of a display device with ultra-high resolution (e.g., 2000 ppi or more), an inorganic insulating film is preferably used.

[Formation of Light-Emitting Element 120R]

The resist mask 151 is formed over the insulating layer 117, the conductive layer 111G, and the conductive layer 111B. At this time, the resist mask 151 is formed in a portion overlapping with part of the groove 175_2, the conductive layer 111G, the groove 175_3, the conductive layer 111B, and part of the groove 175_1. The side surface of the resist mask 151 in the groove 175_2 is located closer to the conductive layer 111G side than to the middle of the shortest distance between the side surface of the conductive layer 111R and the side surface of the conductive layer 111G facing the side surface of the conductive layer 111R. The side surface of the resist mask 151 in the groove 175_3 is located closer to the conductive layer 111B side than to the middle of the shortest distance between the side surface of the conductive layer 111B and the side surface of the conductive layer 111R facing the side surface of the conductive layer 111B (see FIG. 11B). Note that the end portion of the resist mask 151 may have an inverse tapered shape.

Next, a first film containing a light-emitting compound and a conductive film to be the conductive layer 116R are sequentially deposited over the insulating layer 117, the conductive layer 111R, and the resist mask 151. The first film containing a light-emitting compound is preferably deposited on the inner side of the end portion of the groove 175 in the direction where the groove 175 extends. In other words, the groove 175 preferably extends to a region beyond the end portion of the first film containing a light-emitting compound. The conductive film is preferably deposited also on the outer side of the end portion of the groove 175 in the direction where the groove 175 extends.

Figure 11B:
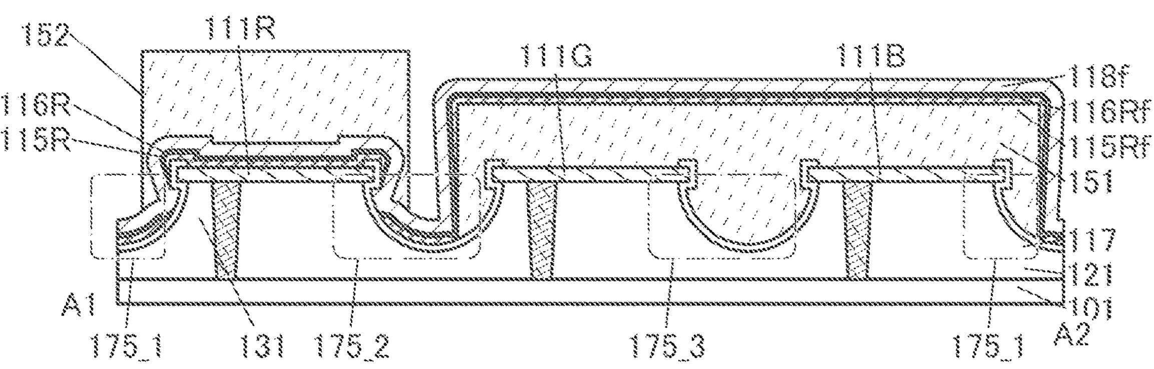

In this step, disconnection of the first film containing a light-emitting compound is caused by the groove in a region not overlapping with the resist mask 151. In FIG. 11B, the first film containing a light-emitting compound is disconnected by the groove 175_1 and the groove 175_2. As a result, the EL layer 115R is formed over the conductive layer 111R, and the EL layer 115Rf is formed over the insulating layer 117 and the resist mask 151. As the first film containing a light-emitting compound, a conductive film to be the conductive layer 116R is disconnected by the groove in the region not overlapping with the resist mask 151, in some cases. In this case, the conductive layer 116R is formed over the EL layer 115R, and the conductive layer 116Rf is formed over the EL layer 115Rf.

Next, the insulating layer **118*f* is deposited over the conductive layer 116R and the conductive layer 116Rf. The insulating layer 118*f* can be deposited by a sputtering method, a CVD method, an MBE method, a PLD method, an ALD method, or the like as appropriate. In this embodiment, aluminum oxide is deposited as the insulating layer 118*f* by an ALD method. It is necessary to deposit the insulating layer 118*f* to have good coverage on the bottom surface and the side surface of the groove 175 (corresponding to the groove 175_1 and the groove 175_2, here) in the insulating layer 121 with the insulating layer 117 provided therebetween. By an ALD method, an atomic layer can be deposited one by one on the bottom surface and the side surface of the groove 175, whereby the insulating layer 118*f* can be deposited on the groove 175** with good coverage.

Then, a resist mask 152 is formed over the insulating layer **118*f*. At this time, the resist mask 152 is formed in a portion overlapping with part of the groove 175_1, the conductive layer 111R, and part of the groove 175_2. The side surface of the resist mask 152 in the groove 175_1 is located closer to the conductive layer 111R side than to the middle of the shortest distance between the side surface of the conductive layer 111B and the side surface of the conductive layer 111R facing the side surface of the conductive layer 111B. The side surface of the resist mask in the groove 175_2 is located closer to the conductive layer 111R side than to the middle of the shortest distance between the side surface of the conductive layer 111R and the side surface of the conductive layer 111G facing the side surface of the conductive layer 111R (see FIG. 11B). Note that the end portion of the resist mask 152** may have an inverse tapered shape.

Figure 11C:
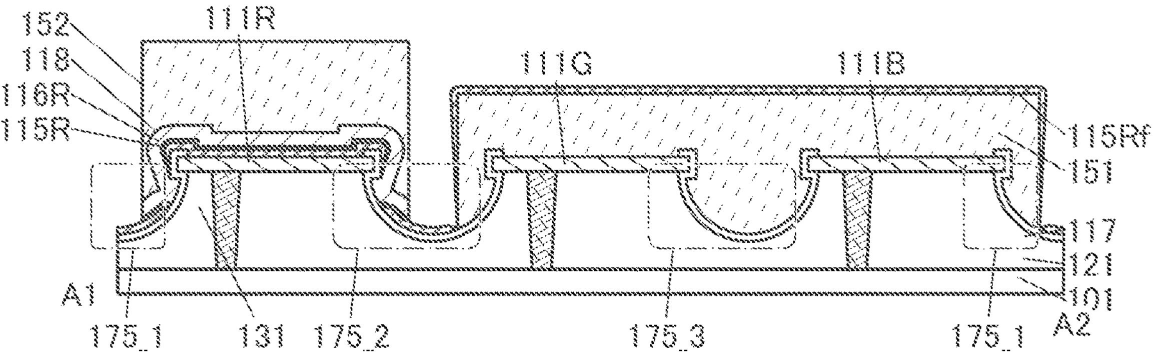

Then, the insulating layer **118*f* in a portion not covered with the resist mask 152 is removed, so that the insulating layer 118 can be formed (see FIG. 11C). A dry etching method or a wet etching method can be used for the removal of part of the insulating layer 118*f*. Note that the conductive layer 116Rf in a portion not covered with the resist mask 152 may be removed. In this case, the insulating layer 118*f* and the conductive layer 116Rf that are not covered with the resist mask 152** may be removed with the same condition or different conditions.

Next, the resist mask 152 and the resist mask 151 are removed. At this time, the EL layer 115Rf not covered with the resist mask 152 is also removed. Note that the conductive layer 116Rf not covered with the resist mask 152 is removed together with the EL layer 115Rf not covered with the resist mask 152 in the case where the corresponding conductive layer 116Rf has not been removed in the above etching step.

Figure 11D:
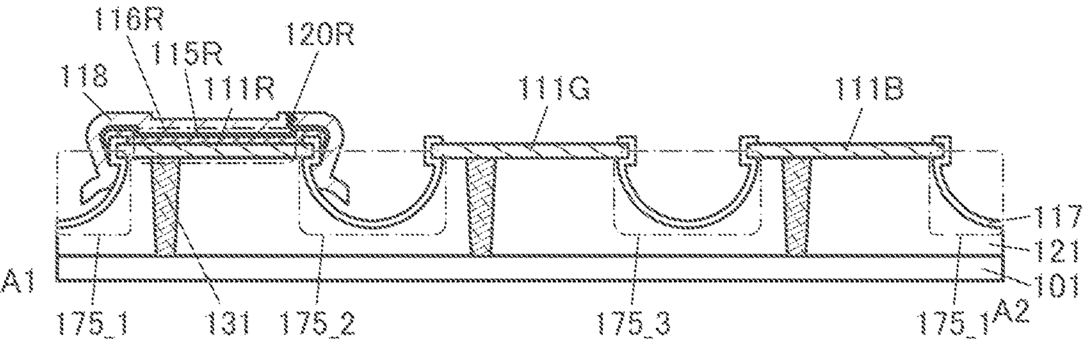

Through the above steps, the light-emitting element 120R sealed with the insulating layer 121, the insulating layer 117, and the insulating layer 118 can be formed (see FIG. 11D). Note that the conductive layer 116Rf and the EL layer 115Rf in a portion which overlaps with the resist mask 152 and does not overlap with the conductive layer 111R, are removed in some cases.

[Formation of Light-Emitting Element 120G]

The resist mask 151 is formed over the insulating layer 117, the conductive layer 111B, and the insulating layer 118. At this time, the resist mask 151 is formed in a portion overlapping with part of the groove 175_3, the conductive layer 111B, the groove 175_1, the insulating layer 118, and part of the groove 175_2. The side surface of the resist mask 151 in the groove 175_3 is located closer to the conductive layer 111B side than to the middle of the shortest distance between the side surface of the conductive layer 111G and the side surface of the conductive layer 111B facing the side surface of the conductive layer 111G. The side surface of the resist mask 151 in the groove 175_2 is located closer to the conductive layer 111R side than to the middle of the shortest distance between the side surface of the conductive layer 111R and the side surface of the conductive layer 111G facing the side surface of the conductive layer 111R (see FIG. 12A). Note that the end portion of the resist mask 151 may have an inverse tapered shape.

Next, a second film containing a light-emitting compound and a conductive film to be the conductive layer 116G are sequentially deposited over the insulating layer 117, the conductive layer 111G, and the resist mask 151. The second film containing a light-emitting compound is preferably deposited on the inner side of the end portion of the groove 175 in the direction where the groove 175 extends. In other words, the groove 175 preferably extends to a region beyond the end portion of the second film containing a light-emitting compound in the direction where the groove 175 extends. The conductive film is preferably deposited also on the outer side of the end portion of the groove 175 in the direction where the groove 175 extends.

Figure 12A:
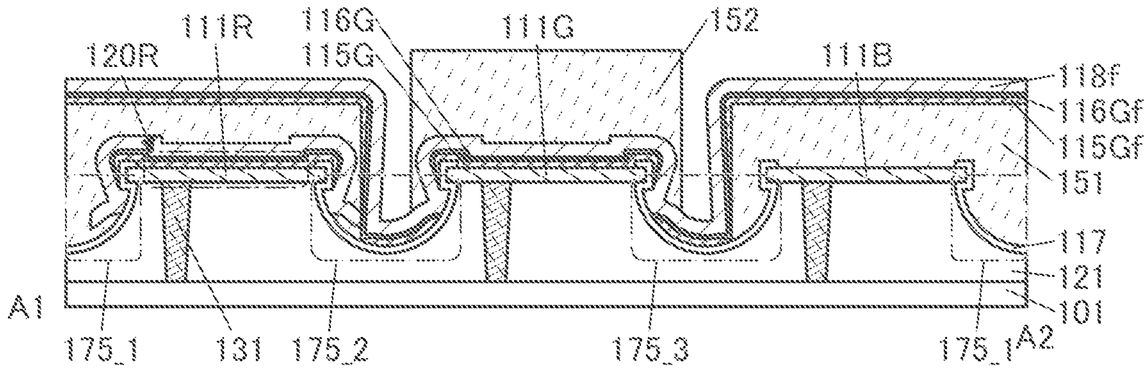
FIG. 12A to FIG. 12C are diagrams illustrating a method for manufacturing a display device.

In this step, disconnection of the second film containing a light-emitting compound is caused by the groove in a region not overlapping with the resist mask 151. In FIG. 12A, the second film containing a light-emitting compound is disconnected by the groove 175_2 and the groove 175_3. As a result, the EL layer 115G is formed over the conductive layer 111G, and the EL layer 115Gf is formed over the insulating layer 117 and the resist mask 151. Note that as the second film containing a light-emitting compound, the conductive film to be the conductive layer 116G is disconnected by the groove in the region not overlapping with the resist mask 151, in some cases. In this case, the conductive layer 116G is formed over the EL layer 115G, and the conductive layer 116Gf is formed over the EL layer 115Gf.

Next, the insulating layer **118*f* is deposited over the conductive layer 116G and the conductive layer 116Gf. The insulating layer 118*f* can be deposited by a sputtering method, a CVD method, an MBE method, a PLD method, an ALD method, or the like as appropriate. In this embodiment, aluminum oxide is deposited as the insulating layer 118*f* by an ALD method. Accordingly, as described above, the insulating layer 118*f* can be deposited to have good coverage on the groove 175 (corresponding to the groove 175_2 and the groove 175_3**, here).

Then, the resist mask 152 is formed over the insulating layer **118*f*. At this time, the resist mask 152 is formed in a portion overlapping with part of the groove 175_2, the conductive layer 111G, and part of the groove 175_3. The side surface of the resist mask 152 in the groove 175_2 is located closer to the conductive layer 111G side than to the middle of the shortest distance between the side surface of the conductive layer 111R and the side surface of the conductive layer 111G facing the side surface of the conductive layer 111R. The side surface of the resist mask in the groove 175_3 is located closer to the conductive layer 111G side than to the middle of the shortest distance between the side surface of the conductive layer 111G and the side surface of the conductive layer 111B facing the side surface of the conductive layer 111G (see FIG. 12A). Note that the end portion of the resist mask 152** may have an inverse tapered shape.

Figure 12B:
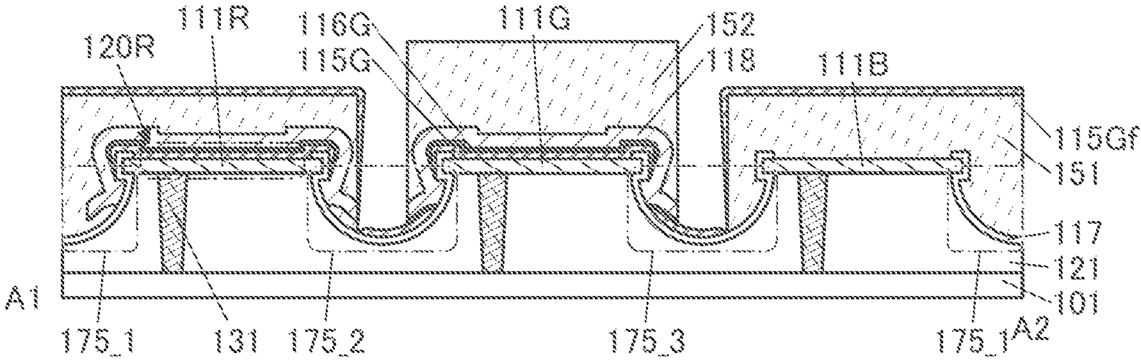

Then, the insulating layer **118*f* in a portion not covered with the resist mask 152 is removed, so that the insulating layer 118 can be formed (see FIG. 12B). A dry etching method or a wet etching method can be used for the removal of part of the insulating layer 118*f* Note that the conductive layer 116Gf in a portion not covered with the resist mask 152 may be removed. In this case, the insulating layer 118*f* and the conductive layer 116Gf that are not covered with the resist mask 152** may be removed with the same condition or different conditions.

Next, the resist mask 152 and the resist mask 151 are removed. At this time, the EL layer 115Gf not covered with the resist mask 152 is removed. Note that the conductive layer 116Gf not covered with the resist mask 152 is removed together with the EL layer 115Gf not covered with the resist mask 152 in the case where the corresponding conductive layer 116Gf has not been removed in the above etching step.

Figure 12C:
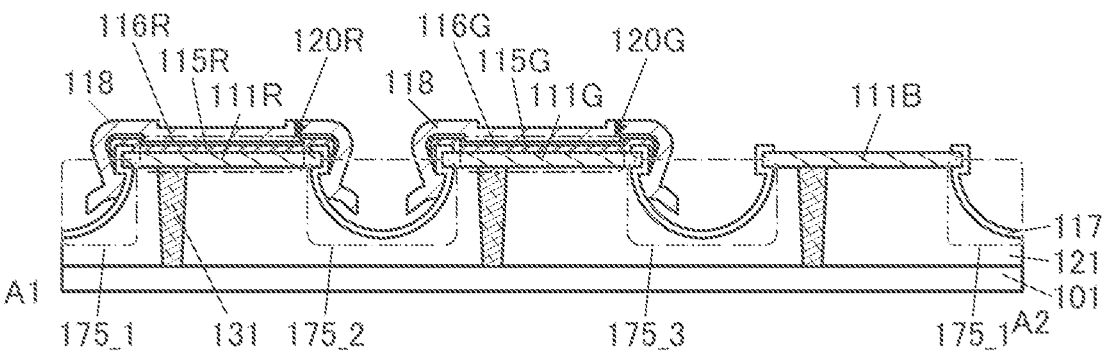

Through the above steps, the light-emitting element 120G sealed with the insulating layer 121, the insulating layer 117, and the insulating layer 118 can be formed (see FIG. 12C). Note that the conductive layer 116Gf and the EL layer 115Gf in a portion which overlaps with the resist mask 152 and does not overlap with the conductive layer 111G, are removed in some cases.

[Formation of Light-Emitting Element 120B]

The resist mask 151 is formed over the insulating layer 117 and the insulating layer 118. At this time, the resist mask 151 is formed in a portion overlapping with part of the groove 175_1, the insulating layer 118, the groove 175_2, and part of the groove 175_3. The side surface of the resist mask 151 in the groove 175_1 is located closer to the conductive layer 111R side than to the middle of the shortest distance between the side surface of the conductive layer 111B and the side surface of the conductive layer 111R facing the side surface of the conductive layer 111B. The side surface of the resist mask 151 in the groove 175_3 is located closer to the conductive layer 111G side than to the middle of the shortest distance between the side surface of the conductive layer 111G and the side surface of the conductive layer 111B facing the side surface of the conductive layer 111G (see FIG. 13A). Note that the end portion of the resist mask 151 may have an inverse tapered shape.

Next, a third film containing a light-emitting compound and a conductive film to be the conductive layer 116B are sequentially deposited over the insulating layer 117, the conductive layer 111B, and the resist mask 151. Note that the third film containing a light-emitting compound is preferably deposited on the inner side of the end portion of the groove 175 in the direction where the groove 175 extends. In other words, the groove 175 preferably extends to a region beyond the end portion of the third film containing a light-emitting compound in the direction where the groove 175 extends. The conductive film is preferably deposited also on the outer side of the end portion of the groove 175 in the direction where the groove 175 extends.

Figure 13A:
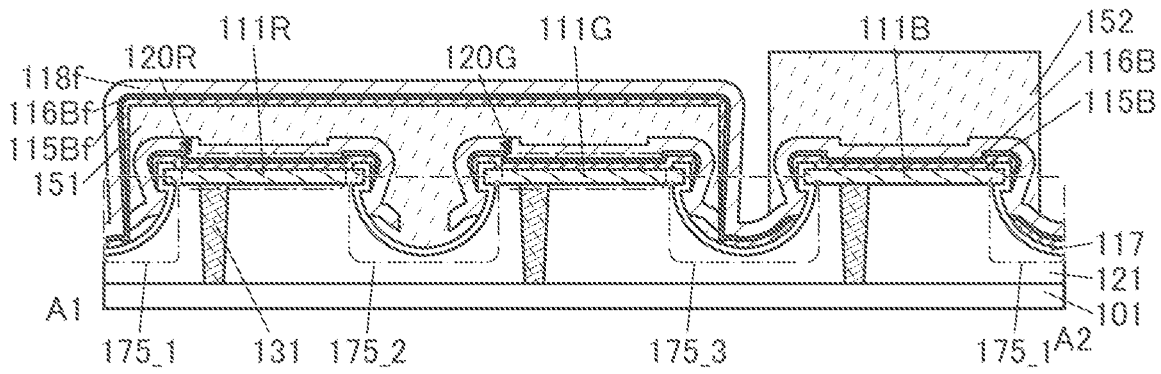
FIG. 13A to FIG. 13C are diagrams illustrating a method for manufacturing a display device.

In this step, disconnection of the third film containing a light-emitting compound is caused by the groove in a region not overlapping with the resist mask 151. In FIG. 13A, the second film containing a light-emitting compound is disconnected by the groove 175_3 and the groove 175_1. As a result, the EL layer 115B is formed over the conductive layer 111B, and the EL layer 115Bf is formed over the insulating layer 117 and the resist mask 151. As the third film containing a light-emitting compound, the conductive film to be the conductive layer 116B is disconnected by the groove in the region not overlapping with the resist mask 151, in some cases. At this time, the conductive layer 116B is formed over the EL layer 115B, and the conductive layer 116Bf is formed over the EL layer 115Bf.

Next, the insulating layer **118*f* is deposited over the conductive layer 116B and the conductive layer 116Bf. The insulating layer 118*f* can be deposited by a sputtering method, a CVD method, an MBE method, a PLD method, an ALD method, or the like as appropriate. In this embodiment, aluminum oxide is deposited as the insulating layer 118*f* by an ALD method. Accordingly, as described above, the insulating layer 118*f* can be deposited to have good coverage on the groove 175 (corresponding to the groove 175_3 and the groove 175_1**, here).

Then, the resist mask 152 is formed over the insulating layer **118*f*. At this time, the resist mask 152 is formed in a portion overlapping with part of the groove 175_3, the conductive layer 111B, and part of the groove 175_1. The side surface of the resist mask 152 in the groove 175_3 is located closer to the conductive layer 111B side than to the middle of the shortest distance between the side surface of the conductive layer 111G and the side surface of the conductive layer 111B facing the side surface of the conductive layer 111G. The side surface of the resist mask 152 in the groove 175_1 is located closer to the conductive layer 111B side than to the middle of the shortest distance between the side surface of the conductive layer 111B and the side surface of the conductive layer 111R facing the side surface of the conductive layer 111B (see FIG. 13A). Note that the end portion of the resist mask 152** may have an inverse tapered shape.

Figure 13B:
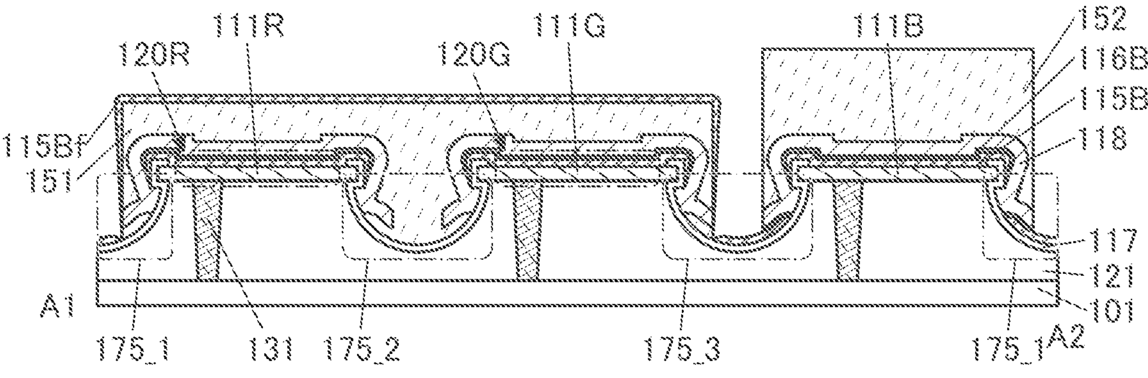

Then, the insulating layer 118*f* in a portion not covered with the resist mask 152 is removed, so that the insulating layer 118 can be formed (see FIG. 13B). A dry etching method or a wet etching method can be used for the removal of part of the insulating layer 118*f*. Note that the conductive layer 116Bf in a portion not covered with the resist mask 152 may be removed. In this case, the insulating layer 118*f* and the conductive layer 116Bf that are not covered with the resist mask 152 may be removed with the same condition or different conditions.

Next, the resist mask 152 and the resist mask 151 are removed. At this time, the EL layer 115Bf not covered with the resist mask 152 is also removed. Note that the conductive layer 116Bf not covered with the resist mask 152 is removed together with the EL layer 115Bf not covered with the resist mask 152 in the case where the corresponding conductive layer 116Bf has not been removed in the above etching step.

Figure 13C:
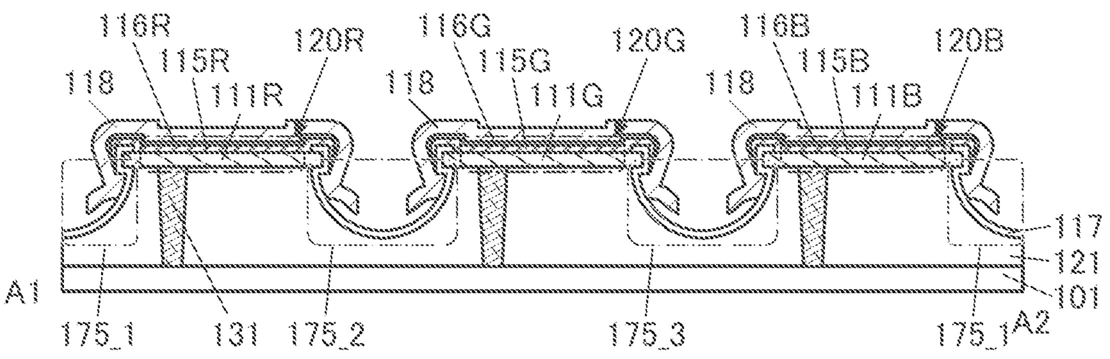

Through the above steps, the light-emitting element 120B sealed with the insulating layer 121, the insulating layer 117, and the insulating layer 118 can be formed (see FIG. 13C). Note that the conductive layer 116Bf and the EL layer 115Bf in a portion which overlaps with the resist mask 152 and does not overlap with the conductive layer 111B, are removed in some cases.

As described above, the light-emitting element 120R, the light-emitting element 120G, and the light-emitting element 120B can be formed. Note that the formation order of the light-emitting element 120R, the light-emitting element 120G, and the light-emitting element 120B is not limited to the above. For example, the light-emitting element 120R, the light-emitting element 120B, and the light-emitting element 120G may be formed in this order. Alternatively, the light-emitting element 120G may be formed first, or the light-emitting element 120B may be formed first.

According to the above manufacturing method example, the EL layer 115 is not exposed to a chemical solution or the like used in removing the resist mask when being sealed with the insulating layer 121, the insulating layer 117, and the insulating layer 118. Thus, without using a metal mask for depositing the EL layer 115 and the conductive layer 116, the light-emitting element 120 can be formed.

According to the above manufacturing method example, a display device with extremely high display quality can be manufactured easily by adjusting the thickness of the EL layer 115 as described above.

The light-emitting element 120 can be formed over the insulating layer 121 with a planarized top surface. Furthermore, the lower electrode (the conductive layer 111) of the light-emitting element 120 can be electrically connected to a pixel circuit or the like of the substrate 101 through the plug 131, so that an extremely minute pixel can be formed and accordingly a display device with extremely high resolution can be achieved. In addition, since the light-emitting element 120 can be placed to overlap with the pixel circuit or the driver circuit, a display device with a high aperture ratio (effective light-emitting area ratio) can be achieved.

The above is the description of the modification example.

Structure Example 2

An example of the display device including a transistor will be described below.

Structure Example 2-1

Figure 14:
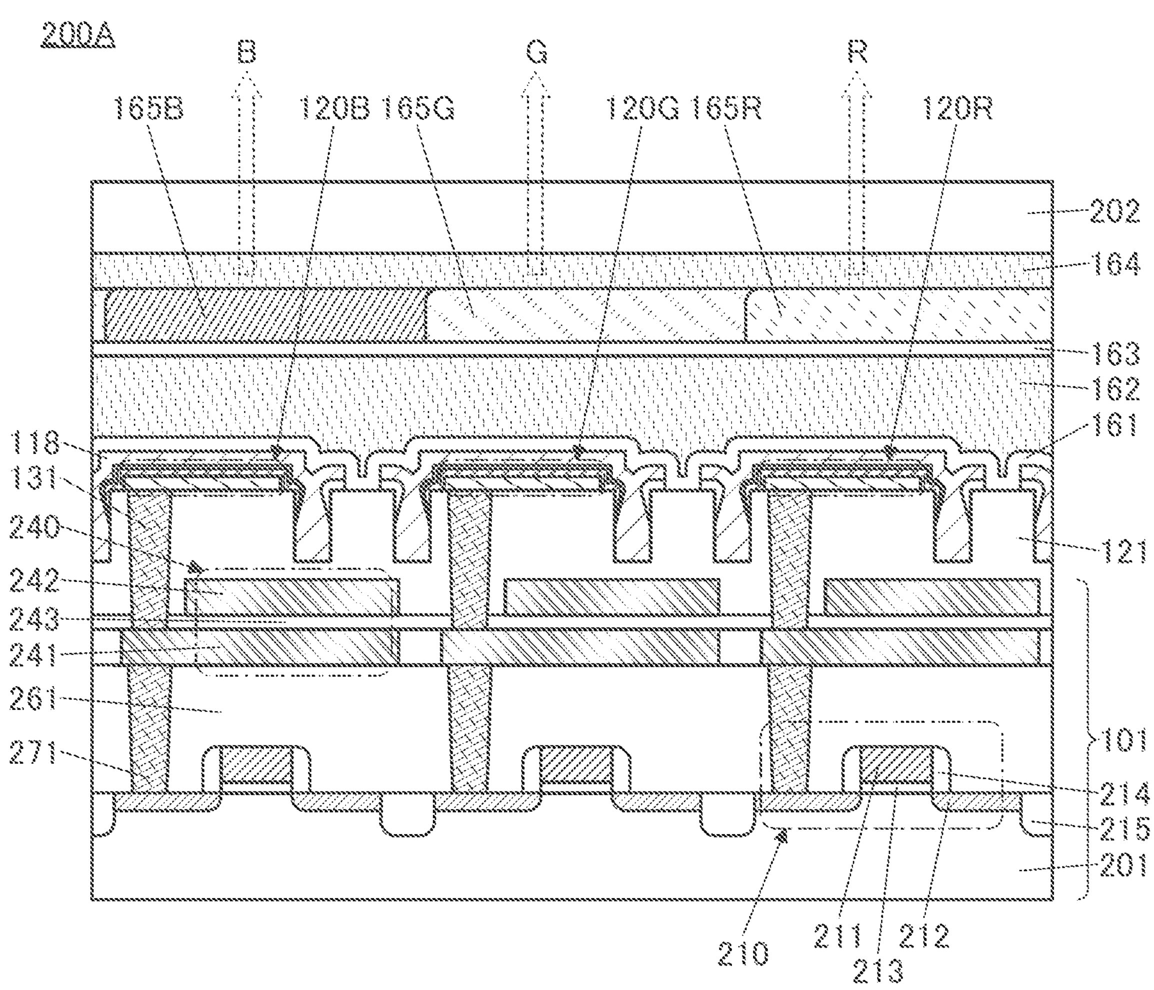
FIG. 14 is a diagram illustrating a structure example of a display device.

FIG. 14 is a schematic cross-sectional view of a display device 200A.

The display device 200A includes a substrate 201, the light-emitting element 120R, the light-emitting element 120G, the light-emitting element 120B, a capacitor 240, a transistor 210, and the like.

A stacked-layer structure from the substrate 201 to the capacitor 240 corresponds to the above-described substrate 101 in the Structure example 1 and Modification example 1.

The transistor 210 is a transistor whose channel region is formed in the substrate 201. As the substrate 201, for example, a semiconductor substrate such as a single crystal silicon substrate can be used. The transistor 210 includes part of the substrate 201, a conductive layer 211, a low-resistance region 212, an insulating layer 213, an insulating layer 214, and the like. The conductive layer 211 functions as a gate electrode. The insulating layer 213 is positioned between the substrate 201 and the conductive layer 211 and functions as a gate insulating layer. The low-resistance region 212 is a region where the substrate 201 is doped with an impurity, and functions as one of a source and a drain. The insulating layer 214 is provided to cover side surfaces of the conductive layer 211 and functions as an insulating layer.

In addition, an element isolation layer 215 is provided between two adjacent transistors 210 to be embedded in the substrate 201.

Furthermore, an insulating layer 261 is provided to cover the transistor 210, and the capacitor 240 is provided over the insulating layer 261.

The capacitor 240 includes a conductive layer 241, a conductive layer 242, and an insulating layer 243 positioned therebetween. The conductive layer 241 functions as one electrode of the capacitor 240, the conductive layer 242 functions as the other electrode of the capacitor 240, and the insulating layer 243 functions as a dielectric of the capacitor 240.

The conductive layer 241 is provided over the insulating layer 261 and is electrically connected to one of a source and a drain of the transistor 210 through a plug 271 embedded in the insulating layer 261. The insulating layer 243 is provided to cover the conductive layer 241. The conductive layer 242 is provided in a region overlapping with the conductive layer 241 with the insulating layer 243 therebetween.

The insulating layer 121 is provided to cover the capacitor 240, and the light-emitting element 120R, the light-emitting element 120G, and the light-emitting element 120B, and the like are provided over the insulating layer 121. In the example illustrated here, the structure described in Structure example 1-1 and FIG. 1B is used as the structures of the light-emitting element 120R, the light-emitting element 120G, the light-emitting element 120B, and the like; however, there is no limitation and a variety of structures described above can be employed.

In the display device 200A, an insulating layer 161, an insulating layer 162, and an insulating layer 163 are provided in this order to cover the conductive layer 118 of the light-emitting element 120. These three insulating layers each function as a protective layer that prevents diffusion of impurities such as water into the light-emitting element 120. As the insulating layer 161 and the insulating layer 163, it is preferable to use an inorganic insulating film with low moisture permeability, such as a silicon oxide film, a silicon nitride film, or an aluminum oxide film. As the insulating layer 162, an organic insulating film having a high light-transmitting property can be used. Using an organic insulating film as the insulating layer 162 can reduce the influence of uneven shape below the insulating layer 162, so that the formation surface of the insulating layer 163 can be a smooth surface. Accordingly, a defect such as a pinhole is unlikely to be generated in the insulating layer 163, leading to higher moisture permeability of the protective layer. Note that the structure of the protective layer covering the light-emitting element 120 is not limited thereto, and a single layer or a two-layer structure may be employed or a stacked-layer structure of four or more layers may be employed.

A coloring layer 165R overlapping with the light-emitting element 120R, a coloring layer 165G overlapping with the light-emitting element 120G, and a coloring layer 165B overlapping with the light-emitting element 120B are provided over the insulating layer 163. For example, the coloring layer 165R transmits red light, the coloring layer 165G transmits green light, and the coloring layer 165B transmits blue light. This can increase the color purity of light from the light-emitting elements, so that a display device with higher display quality can be achieved. Furthermore, the positional alignment of the light-emitting units and the coloring layers is easier in the case where the coloring layers are formed over the insulating layer 163 than in the case where the coloring layers are formed over a substrate 202 described later.

The display device 200A includes a substrate 202 on the viewing side. The substrate 202 and the substrate 201 are bonded to each other with an adhesive layer 164 having a light-transmitting property. As the substrate 202, a substrate having a light-transmitting property such as a glass substrate, a quartz substrate, a sapphire substrate, or a plastic substrate can be used.

With such a structure, a display device with extremely high resolution and high display quality can be achieved.

Structure Example 2-2

Figure 15:
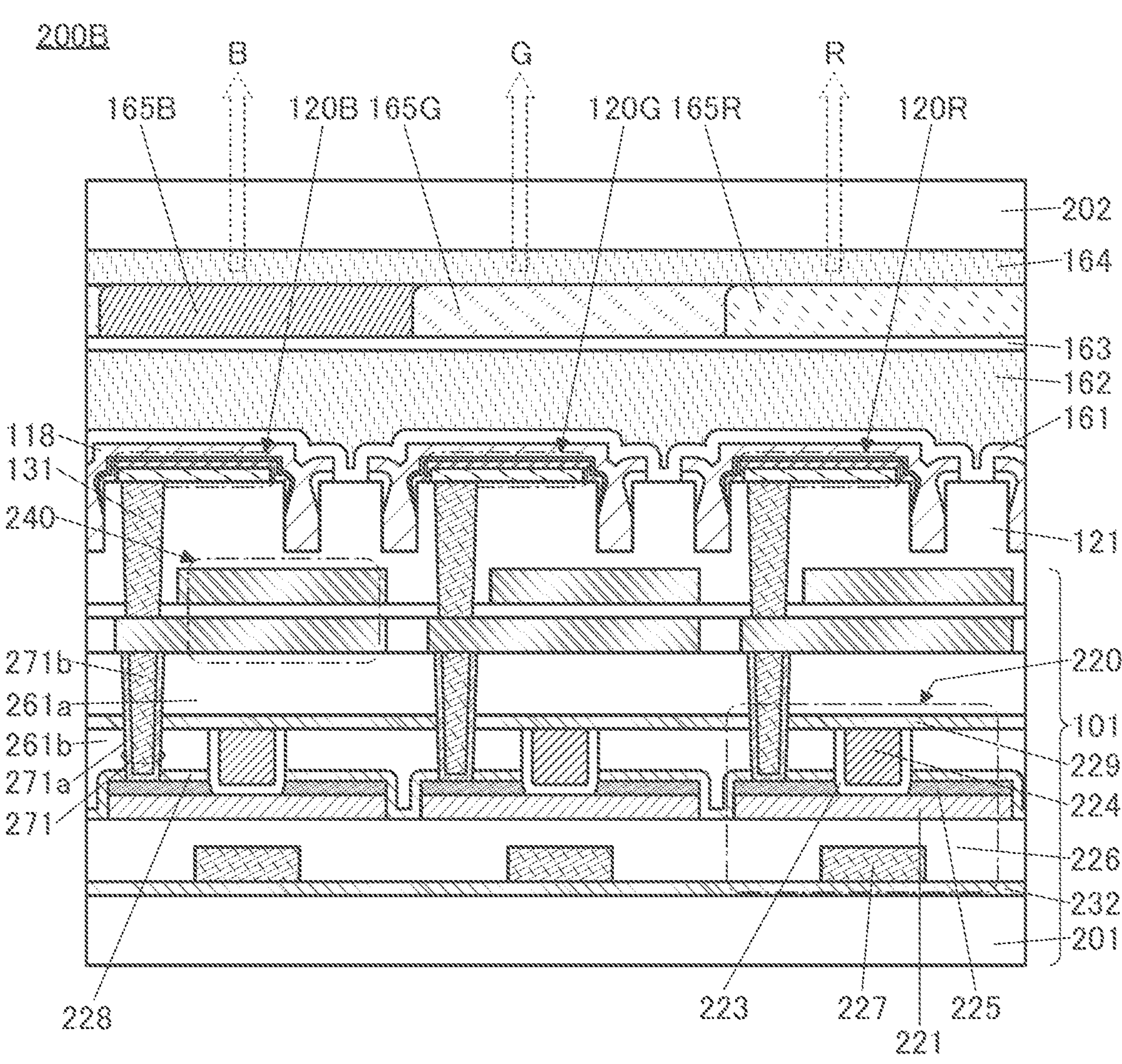
FIG. 15 is a diagram illustrating a structure example of a display device.

FIG. 15 is a schematic cross-sectional view of a display device 200B. The display device 200B is different from the display device 200A mainly in a transistor structure.

A transistor 220 is a transistor in which a metal oxide (also referred to as an oxide semiconductor) is used in a semiconductor layer where a channel is formed.

The transistor 220 includes a semiconductor layer 221, an insulating layer 223, a conductive layer 224, a pair of conductive layers 225, an insulating layer 226, a conductive layer 227, and the like.

As the substrate 201 over which the transistor 220 is provided, the above-described insulating substrate or semiconductor substrate can be used.

An insulating layer 232 is provided over the substrate 201. The insulating layer 232 functions as a barrier layer that prevents diffusion of impurities such as water or hydrogen from the substrate 201 into the transistor 220 and release of oxygen from the semiconductor layer 221 to the substrate 201 side. As the insulating layer 232, it is preferable to use, for example, a film in which hydrogen or oxygen is less likely to be diffused than in a silicon oxide film such as an aluminum oxide film, a hafnium oxide film, or a silicon nitride film.

The conductive layer 227 is provided over the insulating layer 232, and the insulating layer 226 is provided to cover the conductive layer 227. The conductive layer 227 functions as a first gate electrode of the transistor 220, and part of the insulating layer 226 functions as a first gate insulating layer. For the insulating layer 226 at least in a portion in contact with the semiconductor layer 221, an oxide insulating film such as a silicon oxide film is preferably used. A top surface of the insulating layer 226 is preferably planarized.

The semiconductor layer 221 is provided over the insulating layer 226. The semiconductor layer 221 preferably includes a film of a metal oxide exhibiting semiconductor characteristics (also referred to as an oxide semiconductor). The material that can be suitably used for the semiconductor layer 221 is described in detail later.

The pair of conductive layers 225 is provided over and in contact with the semiconductor layer 221, and functions as a source electrode and a drain electrode.

An insulating layer 228 is provided to cover top surfaces and side surfaces of the pair of conductive layers 225, side surfaces of the semiconductor layer 221, and the like, and an insulating layer 261*b* is provided over the insulating layer 228. The insulating layer 228 functions as a barrier layer that prevents diffusion of impurities such as water or hydrogen from the insulating layer 261*b* or the like to the semiconductor layer 221 and release of oxygen from the semiconductor layer 221. As the insulating layer 228, an insulating film similar to the insulating layer 232 can be used.

An opening reaching the semiconductor layer 221 is provided in the insulating layer 228 and the insulating layer 261*b*. The insulating layer 223 that is in contact with the side surfaces of the insulating layer 261*b*, the insulating layer 228, and the conductive layer 225, and a top surface of the semiconductor layer 221, and the conductive layer 224 are embedded inside the opening. The conductive layer 224 functions as a second gate electrode and the insulating layer functions as a second gate insulating layer.

A top surface of the conductive layer 224, a top surface of the insulating layer 223, and a top surface of the insulating layer 261*b* are planarized so that they are substantially level with each other, and an insulating layer 229 and an insulating layer 261*a* are provided to cover these layers.

The insulating layer 261*a* and the insulating layer 261*b* function as an interlayer insulating layer. The insulating layer 229 functions as a barrier layer that prevents diffusion of impurities such as water or hydrogen from the insulating layer 261*a* or the like to the transistor 220. As the insulating layer 229, the insulating layer 228 and an insulating film similar to the insulating layer 232 can be used.

The plug 271 electrically connected to one of the pair of conductive layers 225 is provided to be embedded in the insulating layer 261*a*, the insulating layer 229, and the insulating layer 261*b*. Here, the plug 271 preferably includes a conductive layer 271*a* covering side surfaces of openings of the insulating layer 261*a*, the insulating layer 261*b*, the insulating layer 229, and the insulating layer 228, and part of a top surface of the conductive layer 225, and a conductive layer 271*b* in contact with a top surface of the conductive layer 271*a*. In this case, a conductive material in which hydrogen and oxygen are unlikely to be diffused is preferably used for the conductive layer 271*a*.

Structure Example 2-3

Figure 16:
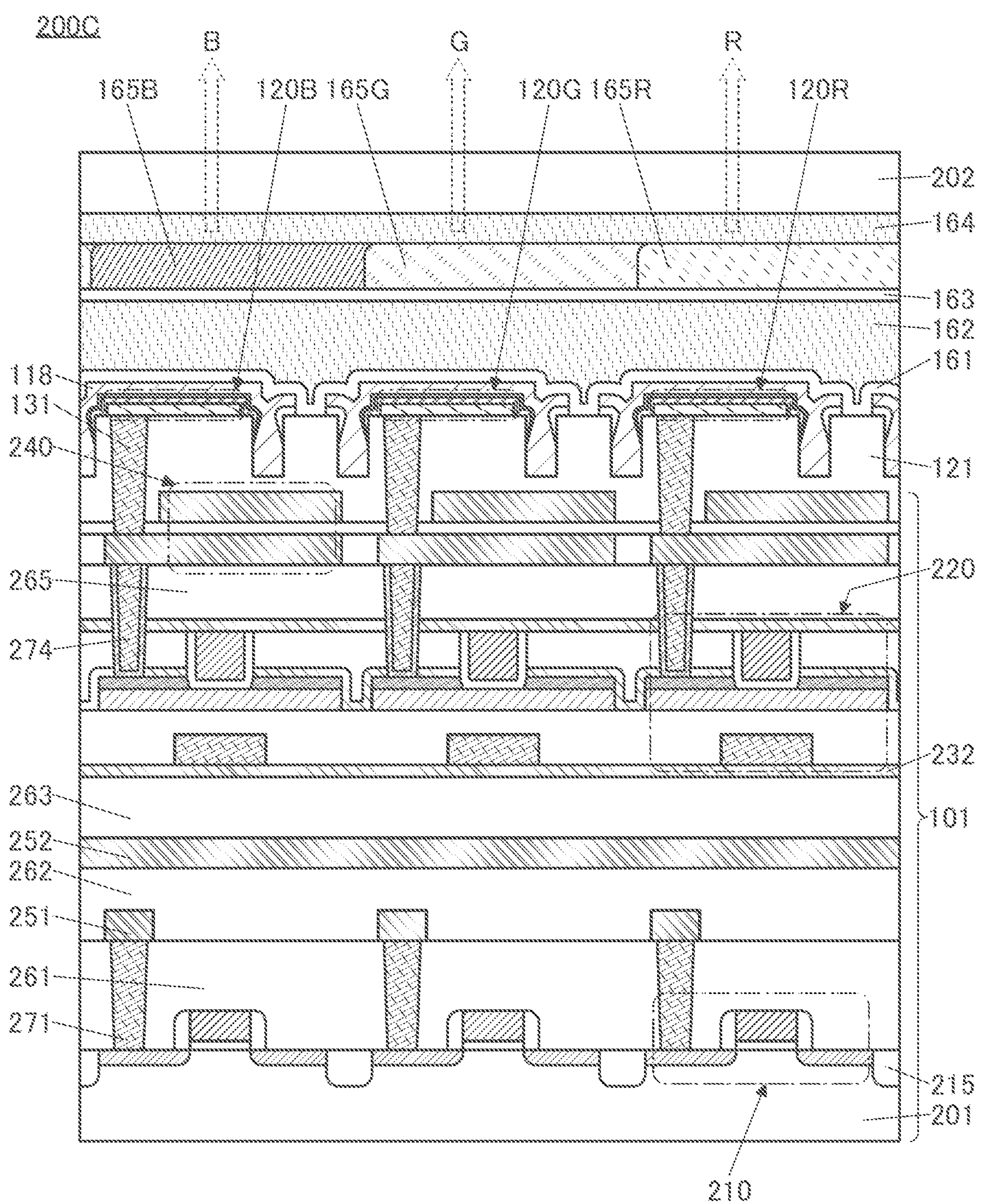
FIG. 16 is a diagram illustrating a structure example of a display device.

FIG. 16 is a schematic cross-sectional view of a display device 200C. The display device 200C has a structure in which the transistor 210 whose channel is formed in the substrate and the transistor 220 including a metal oxide in the semiconductor layer where the channel is formed are stacked.

The insulating layer 261 is provided to cover the transistor 210 and a conductive layer is provided over the insulating layer 261. In addition, an insulating layer 262 is provided to cover the conductive layer 251 and a conductive layer 252 is provided over the insulating layer 262. The conductive layer 251 and the conductive layer 252 each function as a wiring. An insulating layer 263 and the insulating layer 232 are provided to cover the conductive layer 252, and the transistor 220 is provided over the insulating layer 232. An insulating layer 265 is provided to cover the transistor 220, and the capacitor 240 is provided over the insulating layer 265. The capacitor 240 and the transistor 220 are electrically connected to each other through a plug 274.

The transistor 220 can be used as a transistor included in a pixel circuit. The transistor can also be used as a transistor included in a pixel circuit or a transistor included in a driver circuit (a gate line driver circuit or a source line driver circuit) for driving the pixel circuit. The transistor 210 and the transistor 220 can also be used as transistors included in a variety of circuits such as an arithmetic circuit and a memory circuit.

With such a structure, not only the pixel circuit but also the driver circuit or the like can be formed directly under the light-emitting unit; thus, the display device can be downsized as compared with the case where the driver circuit is provided around a display region.

Structure Example 2-4

Figure 17:
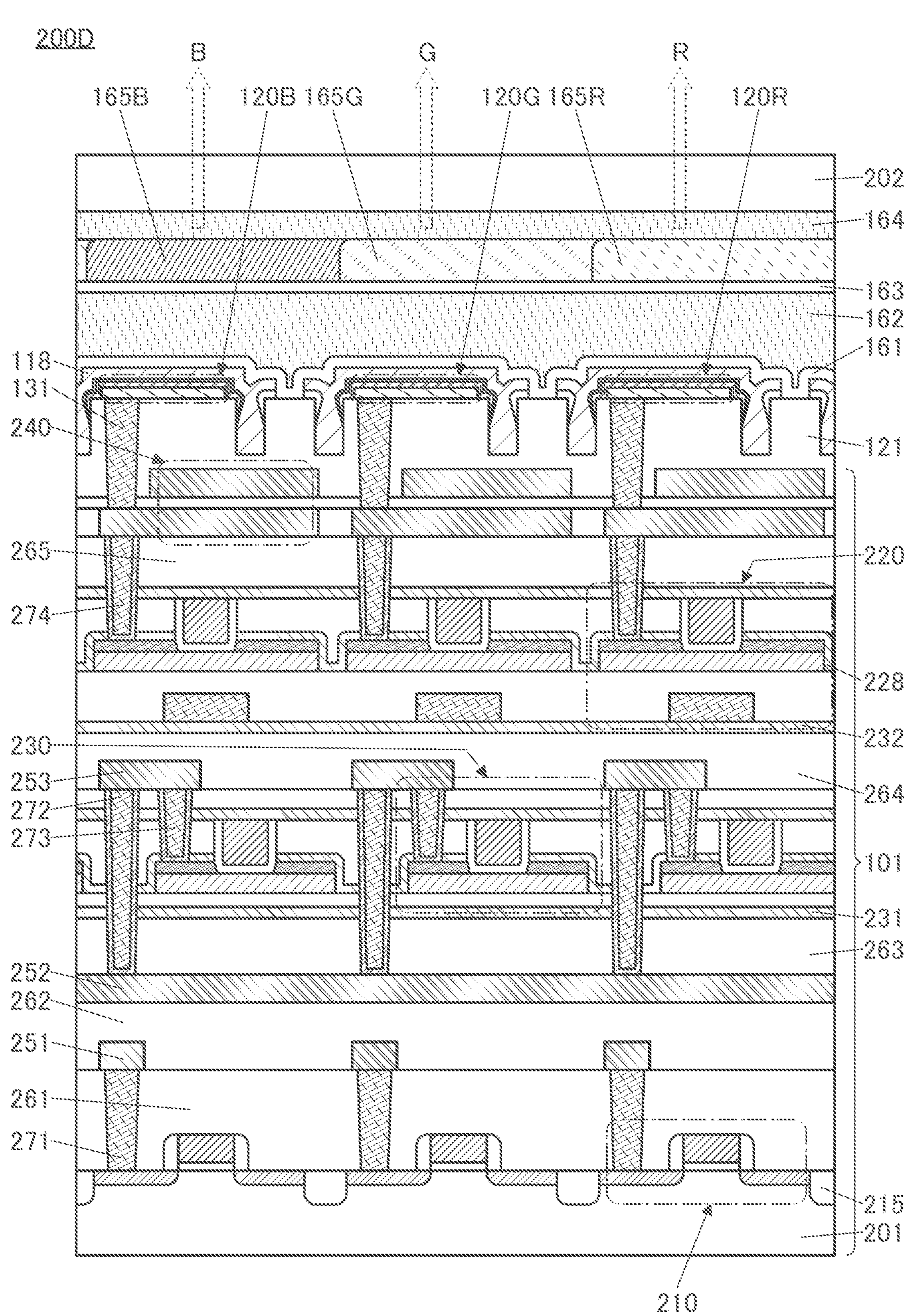
FIG. 17 is a diagram illustrating a structure example of a display device.

FIG. 17 is a schematic cross-sectional view of a display device 200D. The display device 200D is different from the display device 200C mainly in that two transistors using an oxide semiconductor are stacked.

The display device 200D includes a transistor 230 between the transistor 210 and the transistor 220. The transistor 230 has a structure similar to that of the transistor 220 except that the first gate electrode is not included. Note that the transistor 230 may have a structure including the first gate electrode.

The insulating layer 263 and an insulating layer 231 are provided to cover the conductive layer 252, and the transistor 230 is provided over the insulating layer 231. The transistor 230 and the conductive layer 252 are electrically connected to each other through a plug 273, a conductive layer 253, and a plug 272. An insulating layer 264 and the insulating layer 232 are provided to cover the conductive layer 253, and the transistor 220 is provided over the insulating layer 232.

The transistor 220 functions as, for example, a transistor for controlling current flowing through the light-emitting element 120. The transistor 230 functions as a selection transistor for controlling the selection state of a pixel. The transistor 210 functions as a transistor included in a driver circuit for driving the pixel, for example.

When three or more layers in which a transistor is formed are stacked in this manner, the area occupied by the pixel can be further reduced and a high-resolution display device can be achieved.

Components such as a transistor that can be used in the display device will be described below.

[Transistor]

The transistors each include a conductive layer functioning as a gate electrode, a semiconductor layer, a conductive layer functioning as a source electrode, a conductive layer functioning as a drain electrode, and an insulating layer functioning as a gate insulating layer.

Note that there is no particular limitation on the structure of the transistor included in the display device of one embodiment of the present invention. For example, a planar transistor, a staggered transistor, or an inverted staggered transistor may be used. A top-gate or a bottom-gate transistor structure may be employed. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used, in which case deterioration of the transistor characteristics can be suppressed.

In particular, a transistor that uses a metal oxide film for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor using a metal oxide having a wider band gap and a lower carrier density than silicon has a low off-state current; thus, charges accumulated in a capacitor that is connected in series with the transistor can be held for a long time.

The semiconductor layer can be, for example, a film represented by an In-M-Zn-based oxide that contains indium, zinc, and M (M is a metal such as aluminum, titanium, gallium, germanium, yttrium, zirconium, lanthanum, cerium, tin, neodymium, or hafnium).

In the case where the metal oxide contained in the semiconductor layer is an In-M-Zn oxide, the atomic ratio of the metal elements of a sputtering target used for forming a film of the In-M-Zn oxide preferably satisfies In M and Zn M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements of the sputtering target in a range of ±40%.

A metal oxide film with a low carrier concentration is used as the semiconductor layer. For example, for the semiconductor layer, a metal oxide whose carrier concentration is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, even further preferably lower than $1\times10^{10}$ $cm^{-3}$, and higher than or equal to $1\times10^{-9}$ $cm^{-3}$ can be used.

Such a metal oxide is referred to as a highly purified intrinsic or substantially highly purified intrinsic metal oxide. The oxide semiconductor has a low density of defect states and can be regarded as a metal oxide having stable characteristics.

Note that the composition is not limited to those, and an oxide semiconductor having an appropriate composition may be used depending on required semiconductor characteristics and electrical characteristics (field-effect mobility, threshold voltage, or the like) of the transistor. In addition, to obtain the required semiconductor characteristics of the transistor, it is preferable that the carrier concentration, impurity concentration, defect density, atomic ratio between a metal element and oxygen, interatomic distance, density, and the like of the semiconductor layer be set to be appropriate.

When silicon or carbon, which is one of Group 14 elements, is contained in the metal oxide that constitutes the semiconductor layer, oxygen vacancies are increased in the semiconductor layer, and the semiconductor layer becomes n-type. Thus, the concentration (concentration obtained by secondary ion mass spectrometry) of silicon or carbon in the semiconductor layer is set lower than or equal to $2\times10^{18}$ atoms/cm$^3$, preferably lower than or equal to $2\times10^{17}$ atoms/cm$^3$.

Alkali metal and alkaline earth metal might generate carriers when bonded to a metal oxide, in which case the off-state current of the transistor might be increased. Thus, the concentration of alkali metal or alkaline earth metal in the semiconductor layer that is obtained by secondary ion mass spectrometry is set to lower than or equal to $1\times10^{18}$ atoms/cm$^3$, preferably lower than or equal to $2\times10^{16}$ atoms/cm$^3$.

Furthermore, when nitrogen is contained in the metal oxide that constitutes the semiconductor layer, electrons serving as carriers are generated and the carrier concentration is increased, so that the semiconductor layer easily becomes n-type. As a result, a transistor including a metal oxide that contains nitrogen is likely to be normally on. Hence, the concentration of nitrogen, which is obtained by secondary ion mass spectrometry, in the semiconductor layer is preferably set to lower than or equal to $5\times10^{18}$ atoms/cm$^3$.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

In addition, a CAC-OS (cloud-aligned composite oxide semiconductor) may be used for a semiconductor layer of a transistor disclosed in one embodiment of the present invention.

Note that the non-single-crystal oxide semiconductor can be suitably used for a semiconductor layer of a transistor disclosed in one embodiment of the present invention. As the non-single-crystal oxide semiconductor, the nc-OS or the CAAC-OS can be suitably used.

In one embodiment of the present invention, a CAC-OS is preferably used for a semiconductor layer of a transistor. The use of the CAC-OS allows the transistor to have high electrical characteristics or high reliability.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a stacked-layer structure including two or more of the above regions in some cases.

<Composition of CAC-OS>

The composition of a CAC-OS that can be used in a transistor disclosed in one embodiment of the present invention is described below.

The CAC-OS is, for example, a composition of a material in which elements that constitute a metal oxide are unevenly distributed to have a size greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size greater than or equal to 0.5 nm and less than or equal to 10 nm, preferably greater than or equal to 1 nm and less than or equal to 2 nm, or a similar size in a metal oxide is referred to as a mosaic pattern or a patch-like pattern.

Note that the metal oxide preferably contains at least indium. In particular, indium and zinc are preferably contained. In addition to these, one or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)) and gallium oxide (hereinafter, $GaO_{X3}$ (X3 is a real number greater than 0)) or gallium zinc oxide (hereinafter, $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a common name and sometimes refers to one compound formed of In, Ga, Zn, and O. A typical example is a crystalline compound represented by $InGaO_3(ZnO)_{m1}$ (m1 is a positive integer greater than or equal to 1) or $In_{(1+x0)}Ga_{(1-x0)}O_3(ZnO)_{m0}$ ($-1\leq x0\leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In the material composition of a CAC-OS containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more films with different compositions is not included. For example, a two-layer structure of a film containing In as a main component and a film containing Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from the X-ray diffraction measurement that no alignment in the a-b plane direction and the c-axis direction is observed in the measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Thus, the electron diffraction pattern indicates that the crystal structure of the CAC-OS includes an nc (nanocrystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which the region including $GaO_{X3}$ as a main component and the region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, a region including $GaO_{X3}$ or the like as a main component and the region including $In_{X2}Zn_{Y2}O_{Z2}$ or $InO_{X1}$ as a main component are separated to form a mosaic pattern.

The conductivity of the region including $In_{X2}Zn_{Y2}O_{Z2}$ or $InO_{X1}$ as a main component is higher than that of the region including $GaO_{X3}$ or the like as a main component. In other words, when carriers flow through the region including $In_{X2}Zn_{Y2}O_{Z2}$ or $InO_{X1}$ as a main component, the conductivity of a metal oxide is exhibited. Accordingly, when the region including $In_{X2}Zn_{Y2}O_{Z2}$ or $InO_{X1}$ as a main component are distributed in a metal oxide like a cloud, high field-effect mobility (μ) can be achieved.

In contrast, the insulating property of the region including $GaO_{X3}$ or the like as a main component is higher than that of the region including $In_{X2}Zn_{Y2}O_{Z2}$ or $InO_{X1}$ as a main component. In other words, when the region including $GaO_{X3}$ or the like as a main component are distributed in a metal oxide, leakage current can be inhibited and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current (Lm) and high field-effect mobility (μ) can be achieved.

A semiconductor element using a CAC-OS has high reliability. Thus, the CAC-OS is suitably used in a variety of semiconductor devices typified by a display.

Since a transistor including the CAC-OS in a semiconductor layer has high field-effect mobility and high drive capability, the use of the transistor in a driver circuit, a typical example of which is a scan line driver circuit that generates a gate signal, can provide a display device with a narrow bezel width (also referred to a narrow bezel). Furthermore, with use of the transistor in a signal line driver circuit that is included in a display device (particularly in a demultiplexer connected to an output terminal of a shift register included in a signal line driver circuit), a display device to which a small number of wirings are connected can be provided.

Furthermore, unlike a transistor including low-temperature polysilicon, the transistor including a CAC-OS in the semiconductor layer does not need a laser crystallization step. Thus, the manufacturing cost of a display device can be reduced, even when the display device is formed using a large substrate. In addition, the transistor including a CAC-OS in the semiconductor layer is preferably used for a driver circuit and a display portion in a large display device having high resolution such as ultra-high definition ("4K resolution", "41(2K", and "4K") or super high definition ("8K resolution", "8K4K", and "8K"), in which case writing can be performed in a short time and display defects can be reduced.

Alternatively, silicon may be used for a semiconductor in which a channel of a transistor is formed. As the silicon, amorphous silicon may be used but silicon having crystallinity is particularly preferably used. For example, microcrystalline silicon, polycrystalline silicon, or single-crystal silicon are preferably used. In particular, polycrystalline silicon can be formed at a temperature lower than that for single crystal silicon and has higher field-effect mobility and higher reliability than amorphous silicon.

[Conductive Layer]

As materials for a conductive layer such as a wiring or an electrode that forms a display device in addition to a gate, a source, and a drain of a transistor, metals such as aluminum, titanium, chromium, nickel, copper, yttrium, zirconium, molybdenum, silver, tantalum, and tungsten, or an alloy containing any of these metals as its main component can be given. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

[Insulating Layer]

Examples of an insulating material that can be used for the insulating layers include a resin such as an acrylic resin or an epoxy resin, a resin having a siloxane bond, such as silicone, and an inorganic insulating material such as silicon oxide, silicon oxynitride, silicon nitride oxide, silicon nitride, or aluminum oxide.

Note that in this specification, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The light-emitting element is preferably provided between a pair of insulating films with low water permeability. In that case, impurities such as water can be inhibited from entering the light-emitting element, and thus a decrease in device reliability can be inhibited.

Examples of the insulating film with low water permeability include a film containing nitrogen and silicon, such as a silicon nitride film and a silicon nitride oxide film, and a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

Structure Example of Display Module

A structure example of a display module including the display device of one embodiment of the present invention will be described below.

Figure 18A:
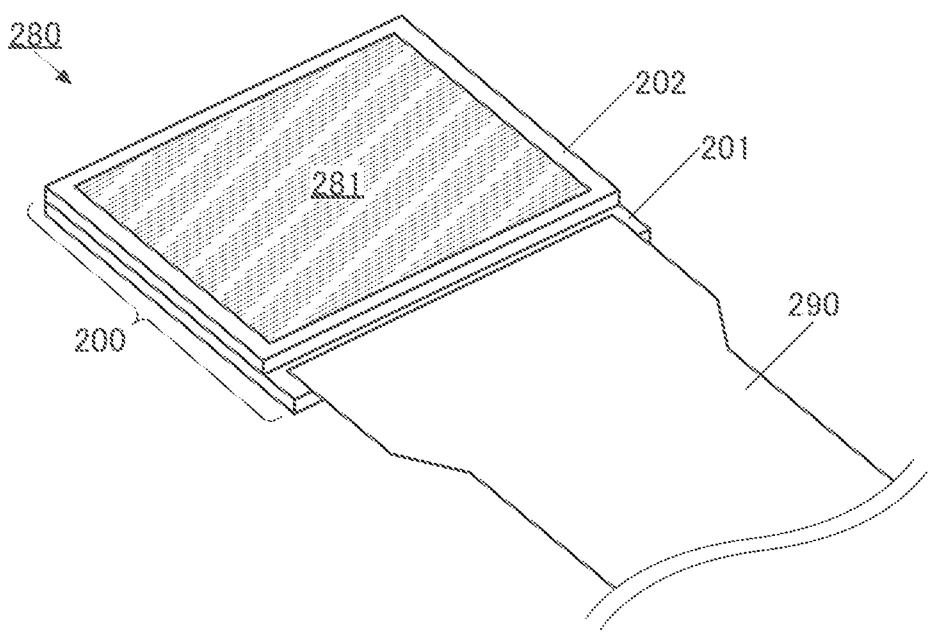
FIG. 18A and FIG. 18B are diagrams illustrating a structure example of a display module.

FIG. 18A is a schematic perspective view of a display module 280. The display module includes the display device 200 and an FPC 290. Any of the display devices (the display device 200A to the display device 200D) described in Structure example 2 can be used as the display device 200.

The display module 280 includes the substrate 201 and the substrate 202. A display portion 281 is also included on the substrate 202 side. The display portion 281 is a region of the display module 280 where an image is displayed and is a region where light emitted from pixels provided in a pixel portion 284 described later can be seen.

Figure 18B:
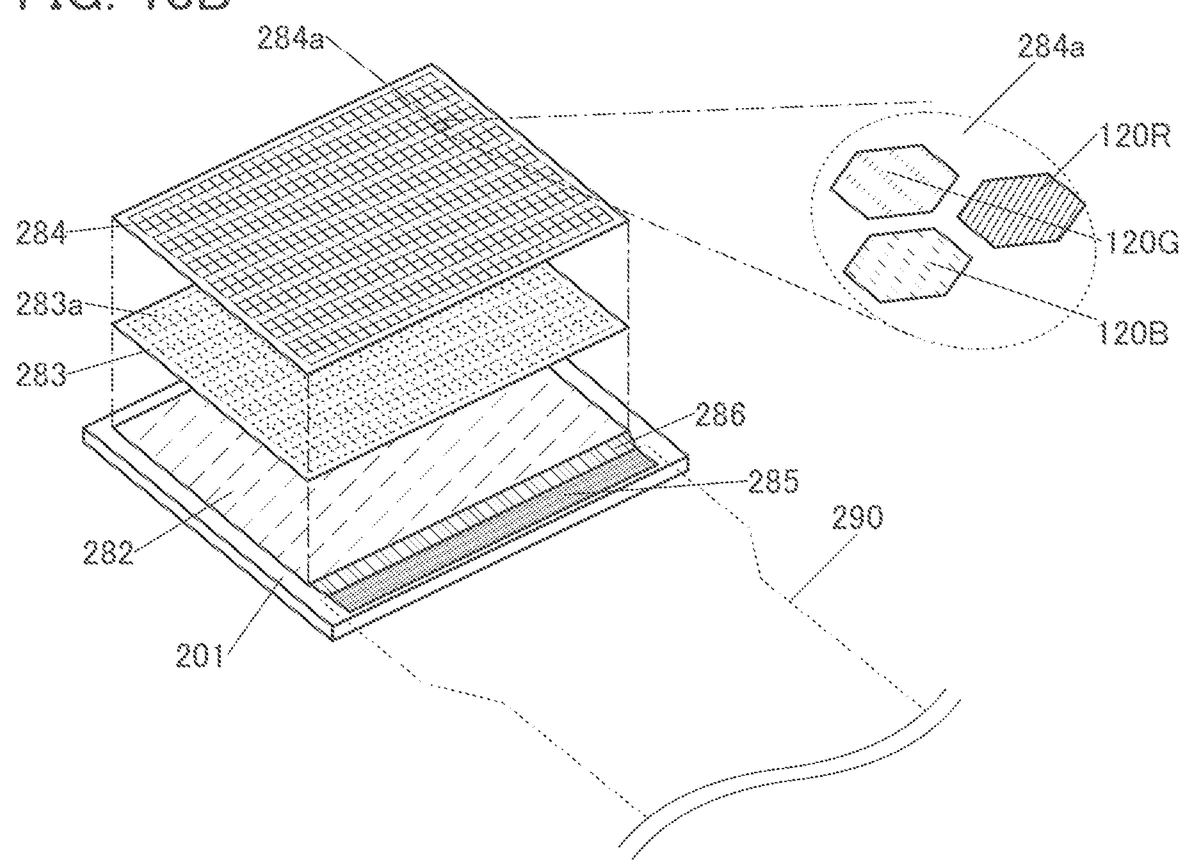

FIG. 18B illustrates a perspective view schematically illustrating a structure on the substrate 201 side. The substrate 201 has a structure in which a circuit portion 282, a pixel circuit portion 283 over the circuit portion 282, and the pixel portion 284 over the pixel circuit portion are stacked. In addition, a terminal portion 285 for connection to the FPC 290 is included in a portion not overlapping with the pixel portion 284 over the substrate 201. The terminal portion 285 and the circuit portion 282 are electrically connected to each other through a wiring portion formed of a plurality of wirings.

The pixel portion 284 includes a plurality of pixels **284*a* that are periodically arranged. An enlarged view of one pixel 284*a* is illustrated on the right side of FIG. 18B. The pixel 284*a* includes the light-emitting element 120R, the light-emitting element 120G, and the light-emitting element 120**B.

The pixel circuit portion 283 includes a plurality of pixel circuits **283*a* that are periodically arranged. The plurality of pixel circuits 283*a* may be arranged in a delta pattern illustrated in FIG. 18**B. With the delta pattern that enables high-density arrangement of pixel circuits, a high-resolution display device can be provided.

One pixel circuit **283*a* is a circuit that controls light emission of three light-emitting elements included in one pixel 284*a*. One pixel circuit 283*a* may be provided with three circuits for controlling light emission of respective light-emitting elements. For example, the pixel circuit 283*a*** for one light-emitting element can include at least one selection transistor, one current control transistor (driving transistor), and a capacitor. In this case, a gate signal is input to a gate of the selection transistor and a source signal is input to one of a source and a drain thereof. With such a structure, an active-matrix display device is achieved.

The circuit portion 282 includes a circuit for driving the pixel circuits **283*a* in the pixel circuit portion 283**. For example, a gate line driver circuit and a source line driver circuit are preferably included. In addition, an arithmetic circuit, a memory circuit, a power supply circuit, or the like may be included.

The FPC 290 functions as a wiring for supplying a video signal or a power supply potential to the circuit portion 282 from the outside. In addition, an IC may be mounted on the FPC 290.

The display module 280 can have a structure in which the pixel circuit portion 283, the circuit portion 282, and the like are stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, and further preferably greater than or equal to 60% and less than or equal to 95%. Furthermore, the pixels **284*a* can be arranged extremely densely and thus the display portion 281 can have extremely high resolution. For example, the pixels 284*a* are preferably arranged in the display portion 281** with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without limitation to the above, the display module 280 can also be suitably used for an electronic device having a relatively small display portion. For example, the display module 280 can also be suitably used for a display portion of a wearable electronic device such as a wrist watch.

At least part of this embodiment can be implemented in combination with the other embodiments described in this specification as appropriate.

Embodiment 2

In this embodiment, a display device of one embodiment of the present invention will be described with reference to FIG. 19.

Figure 19A:
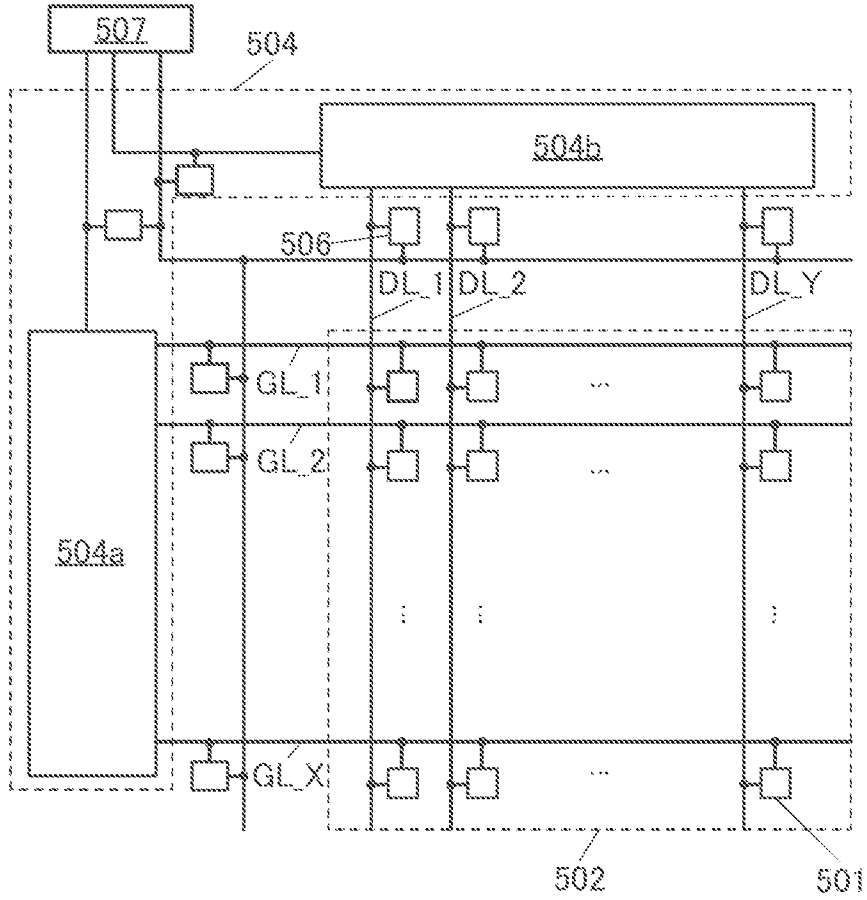
FIG. 19A and FIG. 19B are circuit diagrams illustrating an example of a display device.

A display device illustrated in FIG. 19A includes a pixel portion 502, a driver circuit portion 504, protection circuits 506, and a terminal portion 507. Note that in the display device of one embodiment of the present invention, a structure in which the protection circuits 506 are not provided may be employed.

The pixel portion 502 includes a plurality of pixel circuits 501 arranged in X rows and Y columns (X and Y each independently represent a positive integer of 2 or more). Each of the pixel circuits 501 includes a circuit for driving a display element.

The driver circuit portion 504 includes driver circuits such as a gate driver 504*a* that outputs a scan signal to a gate line GL_1 to a gate line GL_X and a source driver 504*b* that supplies a data signal to a data line DL_1 to a data line DL_Y. The gate driver 504*a* includes at least a shift register. The source driver 504*b* is formed using a plurality of analog switches, for example. Alternatively, the source driver 504*b* may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is supplied to a wiring to which the protection circuit 506 is connected, establishes continuity between the wiring and another wiring. The protection circuit 506 illustrated in FIG. 19A is connected to a variety of wirings such as the gate lines GL that are wirings between the gate driver 504*a* and the pixel circuits 501 and the data lines DL that are wirings between the source driver 504*b* and the pixel circuits 501, for example.

The gate driver 504*a* and the source driver 504*b* may be provided over the same substrate as the pixel portion 502, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

In particular, the gate driver 504*a* and the source driver 504*b* are preferably placed below the pixel portion 502.

Figure 19B:
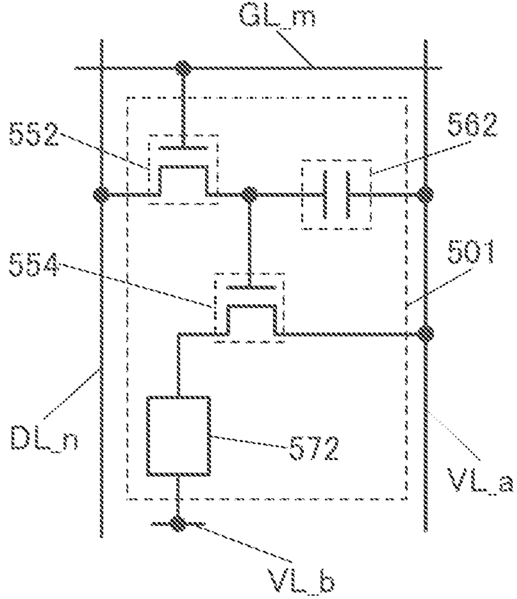

The plurality of pixel circuits 501 illustrated in FIG. 19A can have a configuration illustrated in FIG. 19B, for example.

The pixel circuit 501 shown in FIG. 19B includes a transistor 552, a transistor 554, a capacitor 562, and a light-emitting element 572. The data line DL_n (n is an integer greater than or equal to 1 and less than or equal to Y), the gate line GL_m (m is an integer greater than or equal to 1 and less than or equal to X), a potential supply line VL_a, a potential supply line VL_b, and the like are connected to the pixel circuit 501.

Note that a high power supply potential VDD is supplied to one of the potential supply line VL_a and the potential supply line VL_b, and a low power supply potential VSS is supplied to the other. Current flowing through the light-emitting element 572 is controlled in accordance with a potential supplied to a gate of the transistor 554, whereby the luminance of light emitted from the light-emitting element 572 is controlled.

At least part of this embodiment can be implemented in combination with the other embodiments described in this specification as appropriate.

Embodiment 3

A pixel circuit including a memory for correcting gray levels displayed by pixels that can be used in the display device of one embodiment of the present invention and a display device including the pixel circuit will be described below.

[Circuit Configuration]

FIG. 20A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element can be used. In addition, a liquid crystal element, a MEMS (Micro Electro Mechanical Systems) element, or the like can also be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Next, an example of a method for operating the pixel circuit 400 is described with reference to FIG. 20B. FIG.

20B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 20B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Accordingly, a potential difference $V_w-V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although the potential dV is shown as a positive value in FIG. 20B, the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

Application Example

A pixel circuit 400EL illustrated in FIG. 20C includes a circuit 401EL. The circuit 401EL includes a light-emitting element EL, a transistor M3, and a capacitor C2.

In the transistor M3, a gate is connected to the node N2 and one electrode of the capacitor C2, one of a source and a drain is connected to a wiring that supplies a potential $V_H$, and the other is connected to one electrode of the light-emitting element EL. The other electrode of the capacitor C2 is connected to a wiring that supplies a potential $V_{com}$. The other electrode of the light-emitting element EL is connected to a wiring that supplies a potential $V_L$.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is supplied to the gate of the transistor M3, which enables HDR display, for example. Moreover, a variation in the electrical characteristics of the transistor M3 or the light-emitting element EL can be corrected by supply of a correction signal to the wiring S1 or the wiring S2.

Note that the configuration is not limited to the circuit illustrated in FIG. 20C, and a configuration to which a transistor, a capacitor, or the like is further added may be employed.

At least part of this embodiment can be implemented in combination with the other embodiments described in this specification as appropriate.

Embodiment 4

In this embodiment, structure examples of an electronic device for which the display device of one embodiment of the present invention is used will be described.

The display device and the display module of one embodiment of the present invention can be applied to a display portion of an electronic device or the like having a display function. Examples of such an electronic device include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

In particular, the display device and the display module of one embodiment of the present invention can have a high resolution, and thus can be favorably used for an electronic device having a relatively small display portion. As these electronic devices, for example, a watch-type or bracelet-type information terminal device (wearable device), and wearable devices worn on a head, such as a device for VR such as a head mounted display and a glasses-type device for AR can be given.

Figures 21A, 21B:
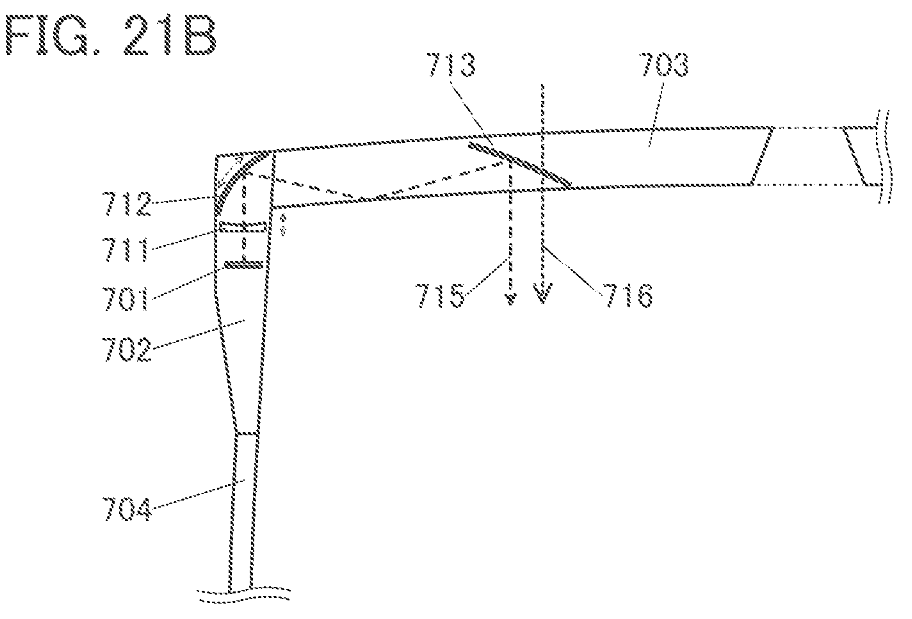
FIG. 21A and FIG. 21B are diagrams illustrating a structure example of an electronic device.

FIG. 21A is a perspective view of an electronic device 700 that is of a glasses type. The electronic device 700 includes a pair of display panels 701, a pair of housings 702, a pair of optical members 703, a pair of temples 704, and the like.

The electronic device 700 can project an image displayed on the display panel 701 onto a display region 706 of the optical member 703. Since the optical members 703 have a light-transmitting property, a user can see images displayed on the display regions 706, which are superimposed on transmission images seen through the optical members 703. Thus, the electronic device 700 is an electronic device capable of AR display.

One housing 702 is provided with a camera 705 capable of capturing images of the front side. Although not illustrated, one of the housings 702 is provided with a wireless receiver or a connector to which a cable can be connected, whereby a video signal or the like can be supplied to the housing 702. Furthermore, when the housing 702 is provided with an acceleration sensor such as a gyroscope sensor, the orientation of the user's head can be detected and an image corresponding to the orientation can be displayed on the display region 706. Moreover, the housing 702 is preferably provided with a battery, in which case charging can be performed with or without a wire.

Next, a method for projecting an image on the display region 706 of the electronic device is described with reference to FIG. 21B. The display panel 701, a lens 711, and a reflective plate 712 are provided in the housing 702. A reflective surface 713 functioning as a half mirror is provided in a portion corresponding to the display region 706 of the optical member 703.

Light 715 emitted from the display panel 701 passes through the lens 711 and is reflected by the reflective plate 712 to the optical member 703 side. In the optical member 703, the light is fully reflected repeatedly by end surfaces of the optical member 703 and reaches the reflective surface 713, whereby an image is projected on the reflective surface 713. Accordingly, the user can see both the light 715 reflected by the reflective surface 713 and transmitted light 716 transmitted through the optical member 703 (including the reflective surface 713).

FIG. 21 shows an example in which the reflective plate 712 and the reflective surface 713 each have a curved surface. This can increase optical design flexibility and reduce the thickness of the optical member 703, compared to the case where they have flat surfaces. Note that the reflective plate 712 and the reflective surface 713 may be flat.

The reflective plate 712 can use a component having a mirror surface, and preferably has high reflectance. As the reflective surface 713, a half mirror utilizing reflection of a metal film may be used, but the use of prism utilizing total reflection or the like can increase the transmittance of the transmitted light 716.

Here, the housing 702 preferably includes a mechanism for adjusting the distance and angle between the lens 711 and the display panel 701. This enables focus adjustment, zooming in/out of image, or the like. One or both of the lens 711 and the display panel 701 are preferably configured to be movable in the optical-axis direction, for example.

The housing 702 preferably includes a mechanism capable of adjusting the angle of the reflective plate 712. The position of the display region 706 where images are displayed can be changed by changing the angle of the reflective plate 712. Thus, the display region 706 can be placed at the most appropriate position in accordance with the position of the user's eye.

The display device or the display module of one embodiment of the present invention can be used for the display panel 701. Thus, the electronic device 700 can perform display with extremely high resolution.

Figure 22A:
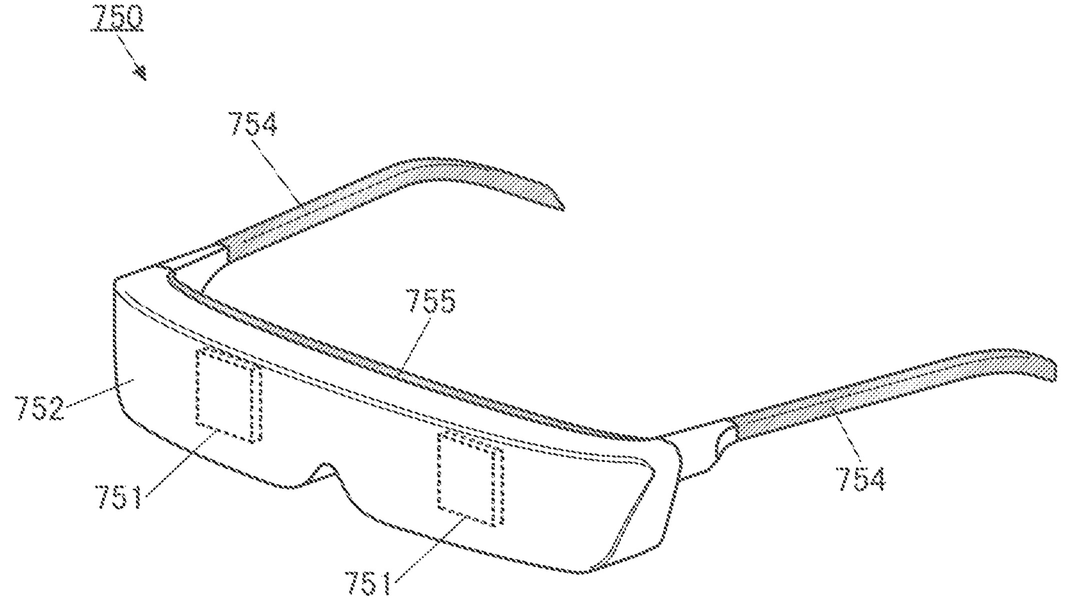
FIG. 22A and FIG. 22B are diagrams illustrating a structure example of an electronic device.
Figure 22B:
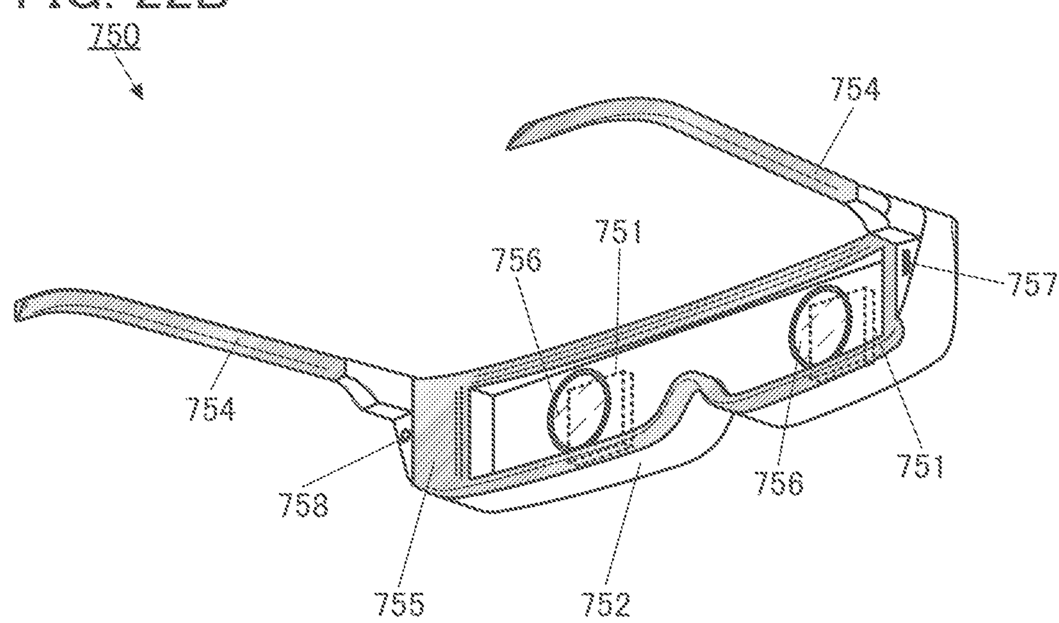

FIG. 22A and FIG. 22B are perspective views of a goggle-type electronic device 750. FIG. 22A is a perspective view illustrating the front surface, the top surface, and the left side surface of the electronic device 750, and FIG. 22B is a perspective view illustrating the back surface, the bottom surface, and the right side surface of the electronic device 750.

The electronic device 750 includes a pair of display panels 751, a housing 752, a pair of temples 754, a cushion 755, a pair of lenses 756, and the like. The pair of display panels 751 is positioned to be seen through the lenses 756 inside the housing 752.

The electronic device 750 is an electronic device for VR. A user wearing the electronic device 750 can see an image displayed on the display panel 751 through the lens 756. Furthermore, when the pair of display panels 751 displays different images, three-dimensional display using parallax can be performed.

An input terminal 757 and an output terminal 758 are provided on the back side of the housing 752. To the input terminal 757, a cable for supplying a video signal from a video output device or the like, power for charging a battery provided in the housing 752, or the like can be connected. The output terminal 758 can function as, for example, an audio output terminal to which earphones, headphones, or the like can be connected. Note that in the case where audio data can be output by wireless communication or sound is output from an external video output device, the audio output terminal is not necessarily provided.

In addition, the housing 752 preferably includes a mechanism by which the left and right positions of the lens 756 and the display panel 751 can be adjusted to the optimal positions in accordance with the position of the user's eye. In addition, a mechanism for adjusting focus by changing the distance between the lens 756 and the display panel 751 is preferably included.

The display device or the display module of one embodiment of the present invention can be used for the display panel 751. Thus, the electronic device 750 can perform display with extremely high resolution. This enables a user to feel high sense of immersion.

The cushion 755 is a portion in contact with the user's face (forehead, cheek, or the like). The cushion 755 is in close contact with the user's face, so that light leakage can be prevented, which increases the sense of immersion. A soft material is preferably used for the cushion 755 so that the cushion 755 is in close contact with the face of the user wearing the electronic device 750. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 755, whereby light leakage can be suitably prevented. Furthermore, using such a material is preferable because it has a soft texture and the user does not feel cold when wearing the device in a cold season, for example. The member in contact with user's skin, such as the cushion 755 or the temple 754, is preferably detachable because cleaning or replacement can be easily performed.

At least part of this embodiment can be implemented in combination with the other embodiments described in this specification as appropriate.

REFERENCE NUMERALS

100A: display device, 100B: display device, 100C: display device, 100D: display device, 100E: display device, 100F: display device, 100G: display device, 100H: display device, 101: substrate, 111: conductive layer, 111B: conductive layer, 111G: conductive layer, 111R: conductive layer, 115: EL layer, 115B: EL layer, 115Bf: EL layer, 115G: EL layer, 115Gf: EL layer, 115R: EL layer, 115Rf: EL layer, 116: conductive layer, 116B: conductive layer, 116Bf: conductive layer, 116G: conductive layer, 116Gf: conductive layer, 116R: conductive layer, 116Rf: conductive layer, 117: insulating layer, 118: insulating layer, 118*f*: insulating layer, 119: insulating layer, 119*f*: insulating film, 120: light-emitting element, 120B: light-emitting element, 120G: light-emitting element, 120R: light-emitting element, 121: insulating layer, 121*a*: insulating layer, 121*b*: insulating layer, 121*c*: insulating layer, 131: plug, 151: resist mask, 152: resist mask, 161: insulating layer, 162: insulating layer, 163: insulating layer, 164: adhesive layer, 165B: coloring layer, 165G: coloring layer, 165R: coloring layer, 170: groove, 170_*a*: groove, 170_*b*: groove, 170_1*a*: groove, 170_1*b*: groove, 170_2*a*: groove, 170_2*b*: groove, 170_3*a*: groove, 170_3*b*: groove, 171_1: groove, 171_2: groove, 171_3: groove, 175: groove, 175_1: groove, 175_2: groove, 175_3: groove, 200: display device, 200A: display device, 200B: display device, 200C: display device, 200D: display device, 201: substrate, 202: substrate, 210: transistor, 211: conductive layer, 212: low-resistance region, 213: insulating layer, 214: insulating layer, 215: element isolation layer, 220: transistor, 221: semiconductor layer, 223: insulating layer, 224: conductive layer, 225: conductive layer, 226: insulating layer, 227: conductive layer, 228: insulating layer, 229: insulating layer, 230: transistor, 231: insulating layer, 232: insulating layer, 240: capacitor, 241: conductive layer, 242: conductive layer, 243: insulating layer, 251: conductive layer, 252: conductive layer, 253: conductive layer, 261: insulating layer, 261*a*: insulating layer, 261*b*: insulating layer, 262: insulating layer, 263: insulating layer, 264: insulating layer, 265: insulating layer, 271: plug, 271*a*: conductive layer, 271*b*: conductive layer, 272: plug, 273: plug, 274: plug, 280: display module, 281: display portion, 282: circuit portion, 283: pixel circuit portion, 283*a*: pixel circuit, 284: pixel portion, 284*a*: pixel, 285: terminal portion, 286: wiring portion, 290: FPC, 400: pixel circuit, 400EL: pixel circuit, 401: circuit, 401EL: circuit, 501: pixel circuit, 502: pixel portion, 504: driver circuit portion, 504*a*: gate driver, 504*b*: source driver, 506: protection circuit, 507: terminal portion, 552: transistor, 554: transistor, 562: capacitor, 572: light-emitting element, 700: electronic device, 701: display panel, 702: housing, 703: optical member, 704: temple, 705: camera, 706: display region, 711: lens, 712: reflective plate, 713: reflective surface, 715: light, 716: transmitted light, 750: electronic device, 751: display panel, 752: housing, 754: temple, 755: cushion, 756: lens, 757: input terminal, 758: output terminal

The invention claimed is:

1. A display device comprising:
a first insulating layer;
a first light-emitting element and a second light-emitting element over the first insulating layer;
a second insulating layer located to be over and cover the first light-emitting element; and
a third insulating layer located to be over and cover the second light-emitting element,
wherein the first light-emitting element and the second light-emitting element emit light of different colors,
wherein a first groove and a second groove are provided in a region that is in the first insulating layer and between the first light-emitting element and the second light-emitting element,
wherein part of the second insulating layer is embedded in the first groove,
wherein part of the third insulating layer is embedded in the second groove, and
wherein each of the second insulating layer and the third insulating layer has a region in contact with the first insulating layer.

2. The display device according to claim 1, wherein each of the second insulating layer and the third insulating layer comprises aluminum and oxygen.

3. A display device comprising:
a first insulating layer;
a first light-emitting element and a second light-emitting element over the first insulating layer;
a second insulating layer located to be over and cover the first light-emitting element; and
a third insulating layer located to be over and cover the second light-emitting element,
wherein the first light-emitting element and the second light-emitting element emit light of different colors,
wherein a first groove and a second groove are provided in a region that is in the first insulating layer and between the first light-emitting element and the second light-emitting element,
wherein part of the second insulating layer is embedded in the first groove,
wherein part of the third insulating layer is embedded in the second groove,
wherein the first light-emitting element comprises:
a first conductive layer;
a first EL layer over the first conductive layer; and
a second conductive layer over the first EL layer,
wherein the second light-emitting element comprises:
a third conductive layer;
a second EL layer over the third conductive layer; and
a fourth conductive layer over the second EL layer,
wherein the first EL layer is located to cover a side surface and a top surface of the first conductive layer,
wherein the first EL layer comprises a region in contact with the first insulating layer,
wherein the second EL layer is located to cover a side surface and a top surface of the third conductive layer,
wherein the second EL layer comprises a region in contact with the first insulating layer,
wherein a width of the first groove in a direction from the first light-emitting element toward the second light-emitting element is more than two times as large as a thickness of the first EL layer, and
wherein a width of the second groove in a direction from the first light-emitting element toward the second light-emitting element is more than two times as large as a thickness of the second EL layer.

4. The display device according to claim 3, wherein the first groove extends to a region outside an end portion of the first EL layer in a direction where the first groove extends.

5. The display device according to claim 3,
wherein a fourth insulating layer is provided between the first conductive layer and the first EL layer to be in contact with the side surface of the first conductive layer, and
wherein a fifth insulating layer is provided between the third conductive layer and the second EL layer to be in contact with the side surface of the third conductive layer.

6. A display device comprising:
a first insulating layer;
a first light-emitting element and a second light-emitting element over the first insulating layer;
a second insulating layer located to be over and cover the first light-emitting element; and
a third insulating layer located to be over and cover the second light-emitting element,
wherein the first light-emitting element and the second light-emitting element emit light of different colors, wherein a groove is provided in a region that is in the first insulating layer and between the first light-emitting element and the second light-emitting element, wherein the groove has a downward-convex semicircular shape in a cross-sectional view, wherein the groove comprises a first region and a second region not overlapping with the first region, wherein the first region is located closer to the first light-emitting element side than the second region is, wherein the second region is located closer to the second light-emitting element side than the first region is, wherein the second insulating layer comprises a region overlapping with the first region of the groove, and wherein the third insulating layer comprises a region overlapping with the second region of the groove.

7. The light-emitting element according to claim 6, wherein the first light-emitting element comprising:

a first conductive layer;

a first EL layer over the first conductive layer; and a second conductive layer over the first EL layer, wherein the second light-emitting element comprising:

a third conductive layer;

a second EL layer over the third conductive layer;

a second EL layer over the third conductive layer; and a fourth conductive layer over the second EL layer, and wherein a fourth insulating layer is provided to cover an end portion of the first conductive layer and an end portion of the third conductive layer.

8. The display device according to claim 6, wherein the groove extends to a region outside an end portion of the first EL layer in a direction where the groove extends.

9. The display device according to claim 6, wherein each of the third insulating layer and the fifth insulating layer comprises aluminum and oxygen.

10. A method for manufacturing a display device comprising a first light-emitting element and a second light-emitting element, wherein the first light-emitting element comprises a first conductive layer, a first EL layer, and a second conductive layer, wherein the second light-emitting element comprises a third conductive layer, a second EL layer, and a fourth conductive layer, wherein the first light-emitting element and the second light-emitting element emit light of different colors, the method comprising:

forming the first conductive layer and the third conductive layer over a first insulating layer;

forming a first grove and a second groove in a region that is in the first insulating layer and between the first conductive layer and the third conductive layer;

forming a first region mask over the first insulating layer and the third conductive layer in a portion overlapping with the second groove and the third conductive layer;

depositing a first film containing a light-emitting compound and a first conductive film sequentially over the first insulating layer, the first conductive layer, and the first resist mask, whereby the first EL layer and the second conductive layer are formed over the first conductive layer, and a first layer and a fifth conductive layer are formed over the first insulating layer and the first resist mask;

depositing a second insulating layer over the second conductive layer and the fifth conductive layer;

forming a second resist mask over the second insulating layer in a portion overlapping with the first conductive layer and the first groove;

removing the second insulating layer that is not covered with the second resist mask, whereby a third insulating layer is formed from the second insulating layer;

removing the first resist mask, the second resist mask, the fifth conductive layer that is not covered with the second resist mask, and the first layer that is not covered with the second resist mask;

forming a third resist mask over the third insulating layer and the first insulating layer in a portion overlapping with the first groove and the first conductive layer;

depositing a second film containing a light-emitting compound and a second conductive film sequentially over the first insulating layer, the third conductive layer, and the third resist mask, whereby the second EL layer and the fourth conductive layer are formed over the third conductive layer, and a second layer and a sixth conductive layer are formed over the first insulating layer and the third resist mask;

depositing a fourth insulating layer over the fourth conductive layer and the sixth conductive layer;

forming a fourth resist mask over the fourth insulating layer in a portion overlapping with the third conductive layer and the second groove;

removing the fourth insulating layer that is not covered with the fourth resist mask, whereby a fifth insulating layer is formed from the fourth insulating layer; and removing the third resist mask, the fourth resist mask, the sixth conductive layer that is not covered with the fourth resist mask, and the second layer that is not covered with the fourth resist mask.

11. The method for manufacturing a display device according to claim 10, wherein a width of the first groove is more than two times as large as a thickness of the first EL layer in a direction from the first light-emitting element toward the second light-emitting element, and wherein a width of the second groove is more than two times as large as a thickness of the second EL layer in a direction from the first light-emitting element toward the second light-emitting element.

12. The method for manufacturing a display device according to claim 10, wherein the first groove extends to a region outside an end portion of the first EL layer in a direction where the first groove extends.

13. The method for manufacturing a display device according to claim 10, wherein each of the second insulating layer and the fourth insulating layer is deposited by an ALD method.

14. A method for manufacturing a display device comprising a first light-emitting element and a second light-emitting element, wherein the first light-emitting element comprises a first conductive layer, a first EL layer, and a second conductive layer, wherein the second light-emitting element comprises a third conductive layer, a second EL layer, and a fourth conductive layer, wherein the first light-emitting element and the second light-emitting element emit light of different colors, the method comprising:

forming the first conductive layer and the third conductive layer over a first insulating layer;

performing isotropic etching to form a groove in a region that is in the first insulating layer and between the first conductive layer and the third conductive layer;

forming a sixth insulating layer covering an end portion of the first conductive layer and an end portion of the third conductive layer;

forming a first resist mask over the third conductive layer and the sixth insulating layer in a portion overlapping with a first region of the groove and the third conductive layer;

depositing a first film containing a light-emitting compound and a first conductive film sequentially over the sixth insulating layer, the first conductive layer, and the first resist mask, whereby the first EL layer and the second conductive layer are formed over the first conductive layer, and a first layer and a fifth conductive layer are formed over the sixth insulating layer and the first resist mask;

depositing a second insulating layer over the second conductive layer and the fifth conductive layer;

forming a second resist mask over the second insulating layer in a portion overlapping with the first conductive layer and a second region of the groove;

removing the second insulating layer that is not covered with the second resist mask, whereby a third insulating layer is formed from the second insulating layer;

removing the first resist mask, the second resist mask, the fifth conductive layer that is not covered with the second resist mask and the first layer that is not covered with the second resist mask;

forming a third resist mask over the third insulating layer and the sixth insulating layer in a portion overlapping with the third insulating layer;

depositing a second film containing a light-emitting compound and a second conductive film sequentially over the sixth insulating layer, the third conductive layer, and the third resist mask, whereby the second EL layer and the fourth conductive layer are formed over the third conductive layer, and a second layer and a sixth conductive layer are formed over the sixth insulating layer and the third resist mask;

depositing a fourth insulating layer over the fourth conductive layer and the sixth conductive layer;

forming a fourth resist mask over the fourth insulating layer in a portion overlapping with the third conductive layer and the second region of the groove;

removing the fourth insulating layer that is not covered with the fourth resist mask, whereby a fifth insulating layer is formed from the fourth insulating layer; and removing the third resist mask, the fourth resist mask, the sixth conductive layer that is not covered with the fourth resist mask, and the second layer that is not covered with the fourth resist mask.

15. The method for manufacturing a display device according to claim 14, wherein the groove extends to a region outside an end portion of the first EL layer in a direction where the groove extends.

16. The method for manufacturing a display device according to claim 14, wherein each of the second insulating layer and the fourth insulating layer is deposited by an ALD method.

* * * * *